US011710629B2

(12) United States Patent
Fujiwara et al.

(10) Patent No.: US 11,710,629 B2
(45) Date of Patent: Jul. 25, 2023

(54) SUBSTRATE PROCESSING APPARATUS AND SUBSTRATE PROCESSING METHOD

(71) Applicant: SCREEN Holdings Co., Ltd., Kyoto (JP)

(72) Inventors: Tomonori Fujiwara, Kyoto (JP); Nobuyuki Shibayama, Kyoto (JP); Yukifumi Yoshida, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 128 days.

(21) Appl. No.: 17/349,702

(22) Filed: Jun. 16, 2021

(65) Prior Publication Data
US 2021/0313172 A1 Oct. 7, 2021

Related U.S. Application Data

(62) Division of application No. 16/040,330, filed on Jul. 19, 2018, now Pat. No. 11,094,529, which is a (Continued)

(30) Foreign Application Priority Data

Sep. 27, 2013 (JP) .................................. 2013-201128
Sep. 27, 2013 (JP) .................................. 2013-201145

(51) Int. Cl.
*H01L 21/02* (2006.01)
*B08B 3/08* (2006.01)
(Continued)

(52) U.S. Cl.
CPC .......... *H01L 21/02087* (2013.01); *B08B 3/08* (2013.01); *H01L 21/67028* (2013.01); *H01L 21/67051* (2013.01); *H01L 21/68728* (2013.01)

(58) Field of Classification Search
None
See application file for complete search history.

(56) References Cited

U.S. PATENT DOCUMENTS 5,608,943 A  3/1997 Konishi et al.
6,793,769 B2  9/2004 Kajino et al. ............ 156/345.55
(Continued)

FOREIGN PATENT DOCUMENTS

CN  1727081 A  2/2006
CN  101165854 A  4/2008
(Continued)

OTHER PUBLICATIONS

Second Office Action dated Mar. 24, 2021 in corresponding Chinese Patent Application No. 201710952395.9 and Search Report with English translation obtained from the JPO.
(Continued)

*Primary Examiner* — Natasha N Campbell
(74) *Attorney, Agent, or Firm* — Ostrolenk Faber LLP

(57) ABSTRACT

A substrate processing apparatus includes a substrate holder, and a discharge head for peripheral area from which a fluid is discharge toward a surface peripheral area of the substrate held on the substrate holder. The discharge head for peripheral area includes multiple nozzles, and a support part that supports the nozzles integrally. The nozzles include a processing liquid nozzle from which a processing liquid is discharged toward the surface peripheral area, and a gas nozzle from which gas is discharged toward the surface peripheral area. The gas nozzle is placed upstream of a rotative direction of the substrate relative to the processing liquid nozzle.

12 Claims, 18 Drawing Sheets

Related U.S. Application Data division of application No. 14/487,499, filed on Sep. 16, 2014, now Pat. No. 10,058,900.

(51) Int. Cl.
  *H01L 21/67* (2006.01)
  *H01L 21/687* (2006.01)

(56) References Cited

U.S. PATENT DOCUMENTS

| | | | |
|---|---|---|---|
| 7,402,485 | B1 | 7/2008 | En |
| 7,608,152 | B2 | 10/2009 | Miya et al. ............ 134/33 |
| 7,722,736 | B2 | 5/2010 | Miya ............ 156/345.17 |
| 7,780,867 | B1 | 8/2010 | Mayer |
| 7,811,412 | B2 | 10/2010 | Miya et al. ............ 156/345.55 |
| 7,927,429 | B2 | 4/2011 | Nanba et al. |
| 7,935,217 | B2 | 5/2011 | Yashiki et al. ............ 156/345.17 |
| 8,113,221 | B2 | 2/2012 | Nanba et al. |
| 8,127,391 | B2 | 3/2012 | Nonomura et al. ............ 15/77 |
| 8,337,659 | B2 | 12/2012 | Orii et al. |
| 8,734,593 | B2 | 5/2014 | Kishimoto et al. ............ 134/33 |
| 8,794,250 | B2 | 8/2014 | Orii et al. |
| 9,307,653 | B2 | 4/2016 | Yoshihara et al. |
| 2003/0098040 | A1 | 5/2003 | Nam et al. |
| 2004/0084144 | A1 | 5/2004 | Yokouchi et al. ............ 156/345.11 |
| 2005/0236018 | A1 | 10/2005 | Nagami |
| 2005/0242064 | A1* | 11/2005 | Saito ............ H01L 21/6708 216/92 |
| 2006/0021636 | A1 | 2/2006 | Miya |
| 2006/0102289 | A1 | 5/2006 | Fukatsu |
| 2007/0044823 | A1* | 3/2007 | Yamamoto ............ H01L 21/67051 134/36 |
| 2007/0131256 | A1 | 6/2007 | Nanba et al. |
| 2007/0223342 | A1 | 9/2007 | Orii et al. |
| 2008/0035610 | A1 | 2/2008 | Miya et al. ............ 216/84 |
| 2008/0060683 | A1* | 3/2008 | Arvidson ............ H01L 21/67051 134/2 |
| 2009/0025763 | A1 | 1/2009 | Nonomura et al. |
| 2009/0038641 | A1* | 2/2009 | Matsumoto ............ H01L 21/6708 156/345.23 |
| 2010/0122772 | A1 | 5/2010 | Hayashi |
| 2010/0288312 | A1 | 11/2010 | Frank et al. |
| 2011/0062114 | A1 | 3/2011 | Mizuno et al. ............ 216/83 |
| 2011/0155193 | A1 | 6/2011 | Nanba et al. |
| 2011/0217473 | A1 | 9/2011 | Kishita et al. |
| 2013/0032179 | A1 | 2/2013 | Kaneko |
| 2013/0145643 | A1 | 6/2013 | Orii et al. |
| 2013/0174873 | A1 | 7/2013 | Yoshihara et al. |
| 2014/0051258 | A1 | 2/2014 | Izumoto et al. ............ 438/748 |
| 2014/0051259 | A1 | 2/2014 | Shibayama ............ 438/748 |

FOREIGN PATENT DOCUMENTS

| | | |
|---|---|---|
| CN | 101355020 A | 1/2009 |
| CN | 102084458 A | 6/2011 |
| EP | 1696475 | 8/2006 |
| JP | 2001-070861 | 3/2001 |
| JP | 2001-077069 A | 3/2001 |
| JP | 2003-086567 A | 3/2003 |
| JP | 2003-264168 | 9/2003 |
| JP | 2006-140385 A | 6/2006 |
| JP | 2006-210580 | 8/2006 |
| JP | 2008-300454 | 12/2008 |
| JP | 2009-070946 | 4/2009 |
| JP | 2010-205876 A | 9/2010 |
| JP | 2011-066194 | 3/2011 |
| JP | 2012-084931 A | 4/2012 |
| JP | 2013-140881 A | 7/2013 |
| TW | 200627537 | 10/1995 |
| TW | 200729315 | 8/2007 |
| TW | 201023287 | 6/2010 |
| WO | WO-2005/043611 A1 | 5/2005 |
| WO | WO 2005/050724 | 6/2005 |

OTHER PUBLICATIONS

Notification of Reason for Refusal dated Apr. 27, 2021 in corresponding Korean Patent Application No. 10-2021-0048426 with English translation obtained from the JPO.

Notification of Reason for Refusal dated Jul. 7, 2020 in corresponding Korean Patent Application No. 10-2020-0035619 and English translation obtained from the Japanese Patent Office.

First Office Action dated Jul. 24, 2020 in corresponding Chinese Patent Application No. 201710952395.9 and Search Report with English translation obtained from the JPO.

Notice of Final Rejection dated Dec. 26, 2019 in corresponding Korean Patent Application No. 10-2014-0108328 with English translation obtained from the JPO.

Notice of Final Rejection dated Feb. 21, 2020 in corresponding Korean Patent Application No. 10-2014-0108328 with English translation obtained from the JPO.

Chinese Office Action (Application No. 201410482526.8) dated Aug. 1, 2017 with English translation based on Japanese translation. Portions relevant to prior-art based rejections are translated.

Notification of Reason for Refusal dated Aug. 22, 2019 in counterpart Korean Patent Application No. 10-2014-0108328 with English translation obtained from One Portal Dossier.

Taiwanese Office Action dated Feb. 18, 2016 with English translation based on Japanese translation. Portions relevant to prior-art based rejections are translated.

Chinese Office Action dated Oct. 28, 2016 with English translation based on the Japanese translation. Portions relevant to prior-art based rejections are translated.

Japanese Office Action dated Mar. 21, 2017 in Japanese Application No. 2013-201145 with partial English translation. Portions relevant to prior-art based rejections are translated.

Japanese Office Action dated Mar. 21, 2017 in Japanese Application No. 2013-201128 with partial English translation. Portions relevant to prior-art based rejections are translated.

Office Action dated Oct. 19, 2015 in corresponding Taiwanese Patent Application No. 103127504 and Japanese and English translations thereof.

\* cited by examiner

FIG. 2
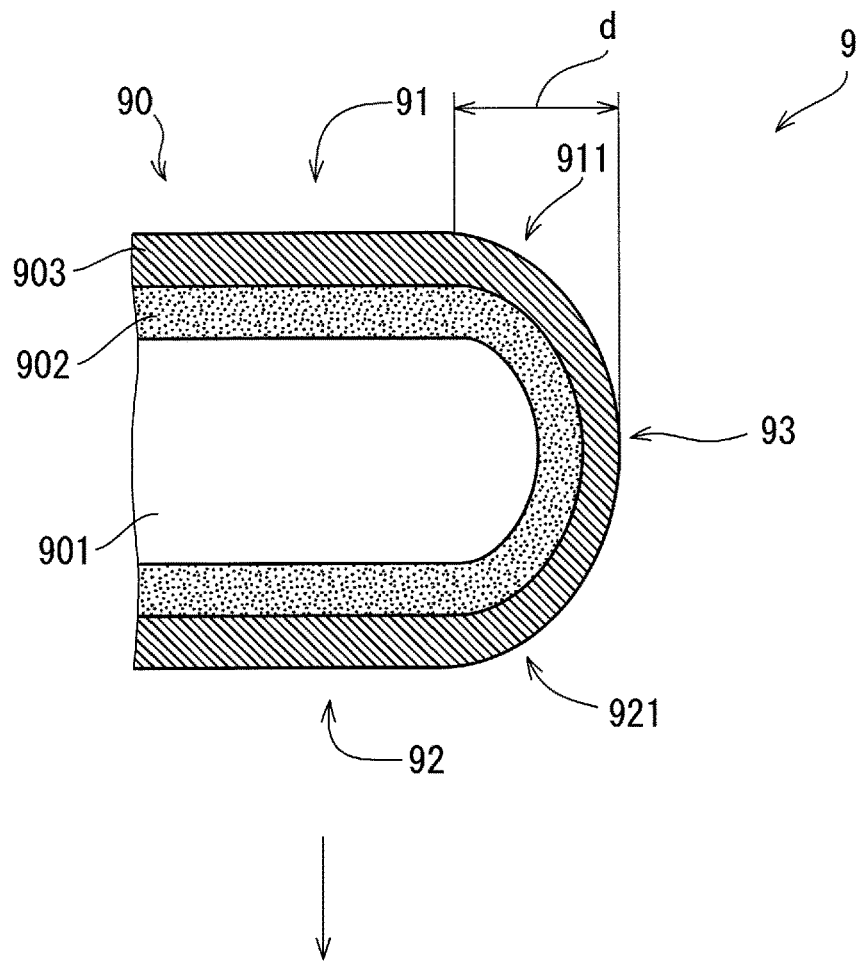
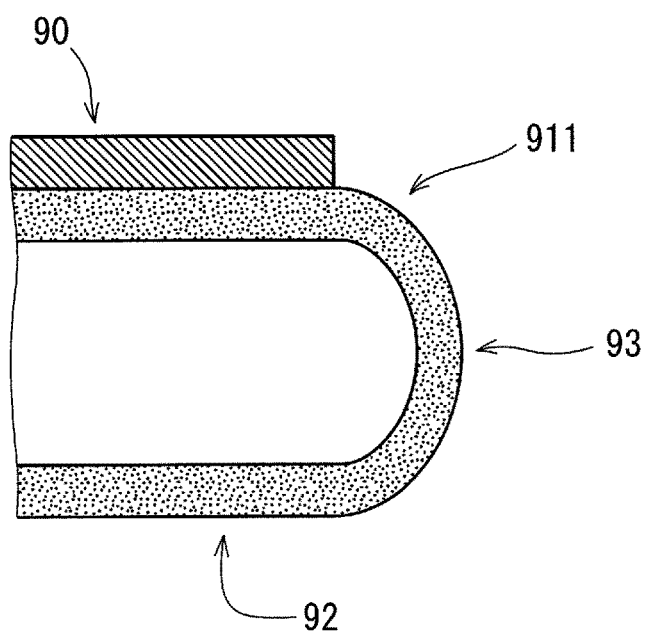

F I G. 4
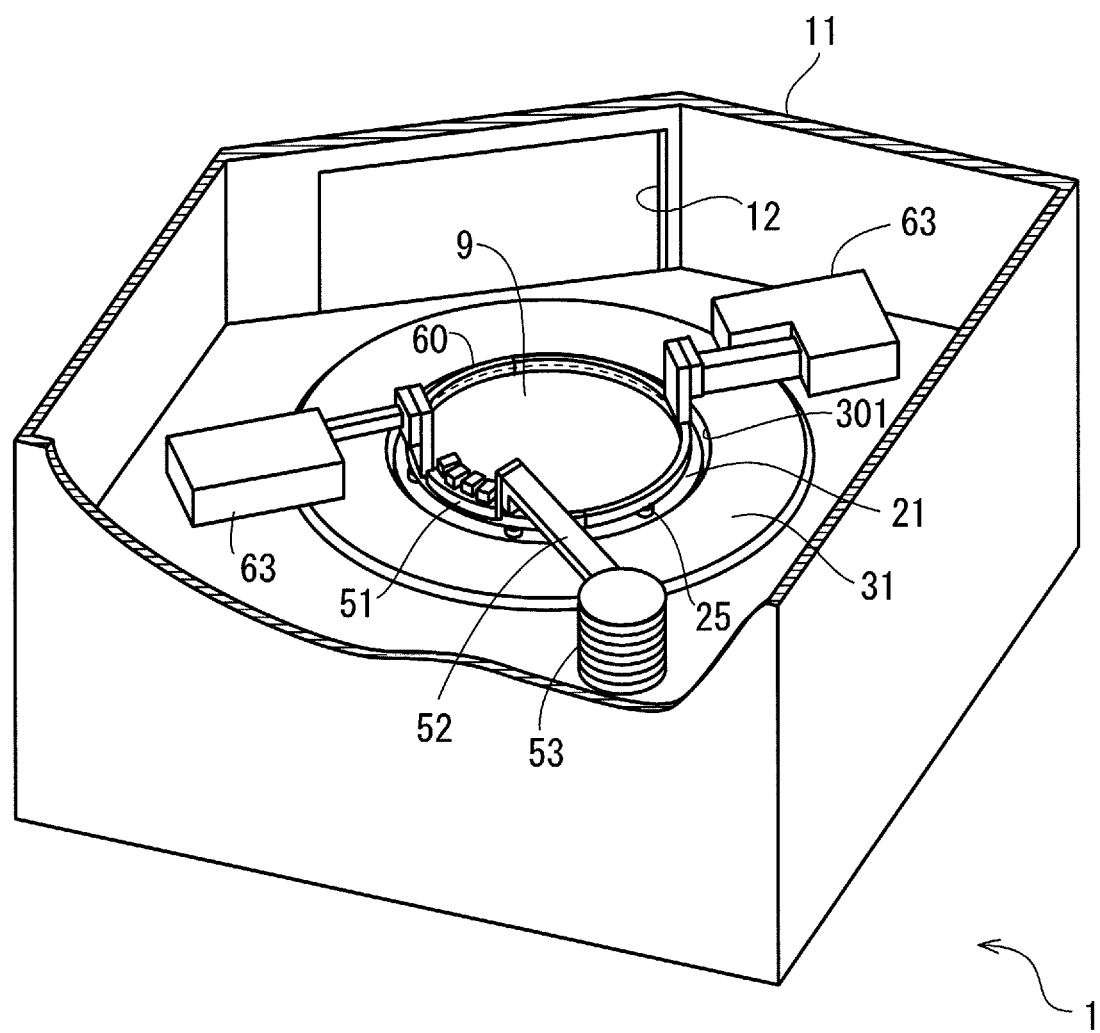

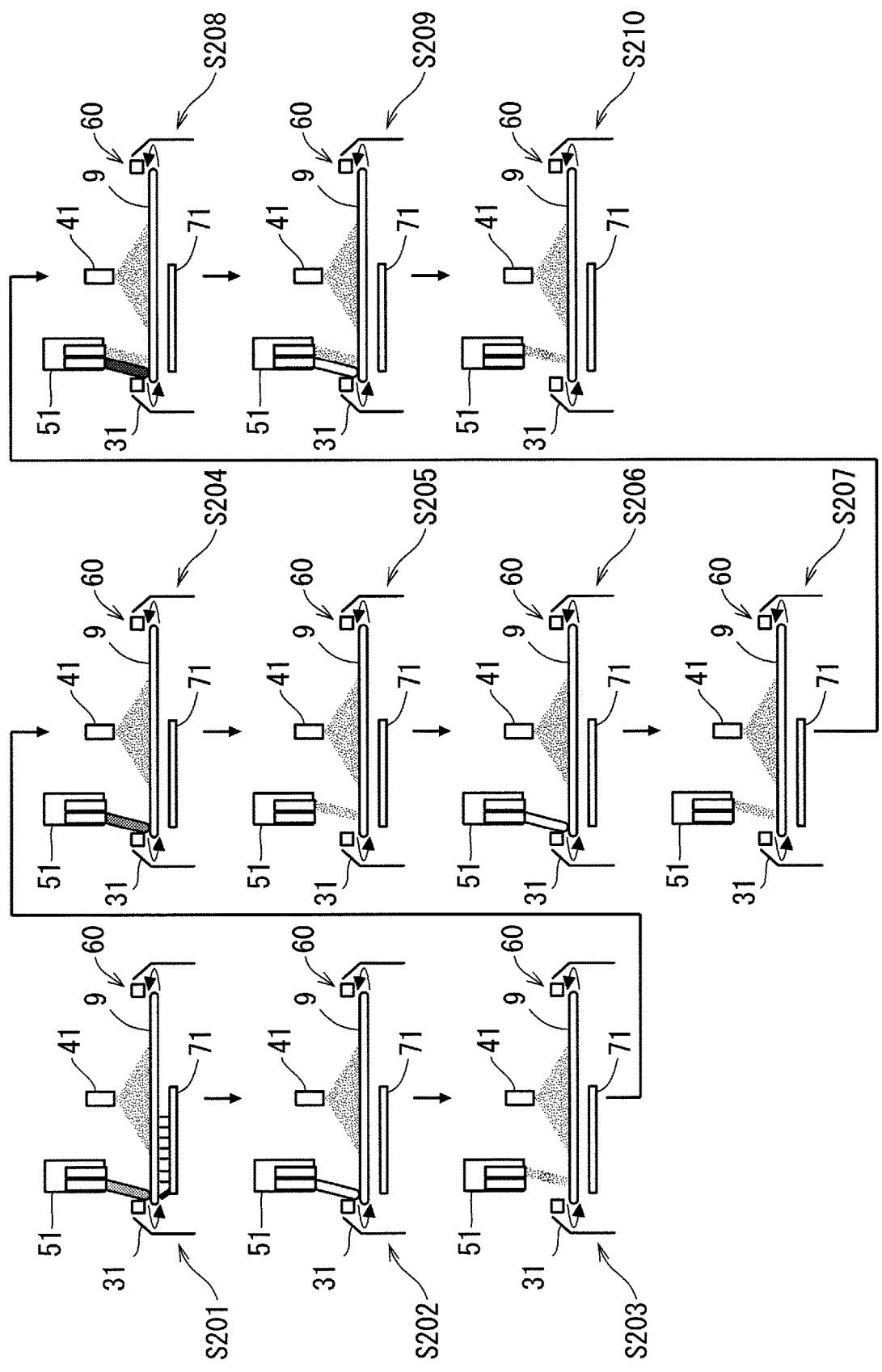

F I G. 1 9
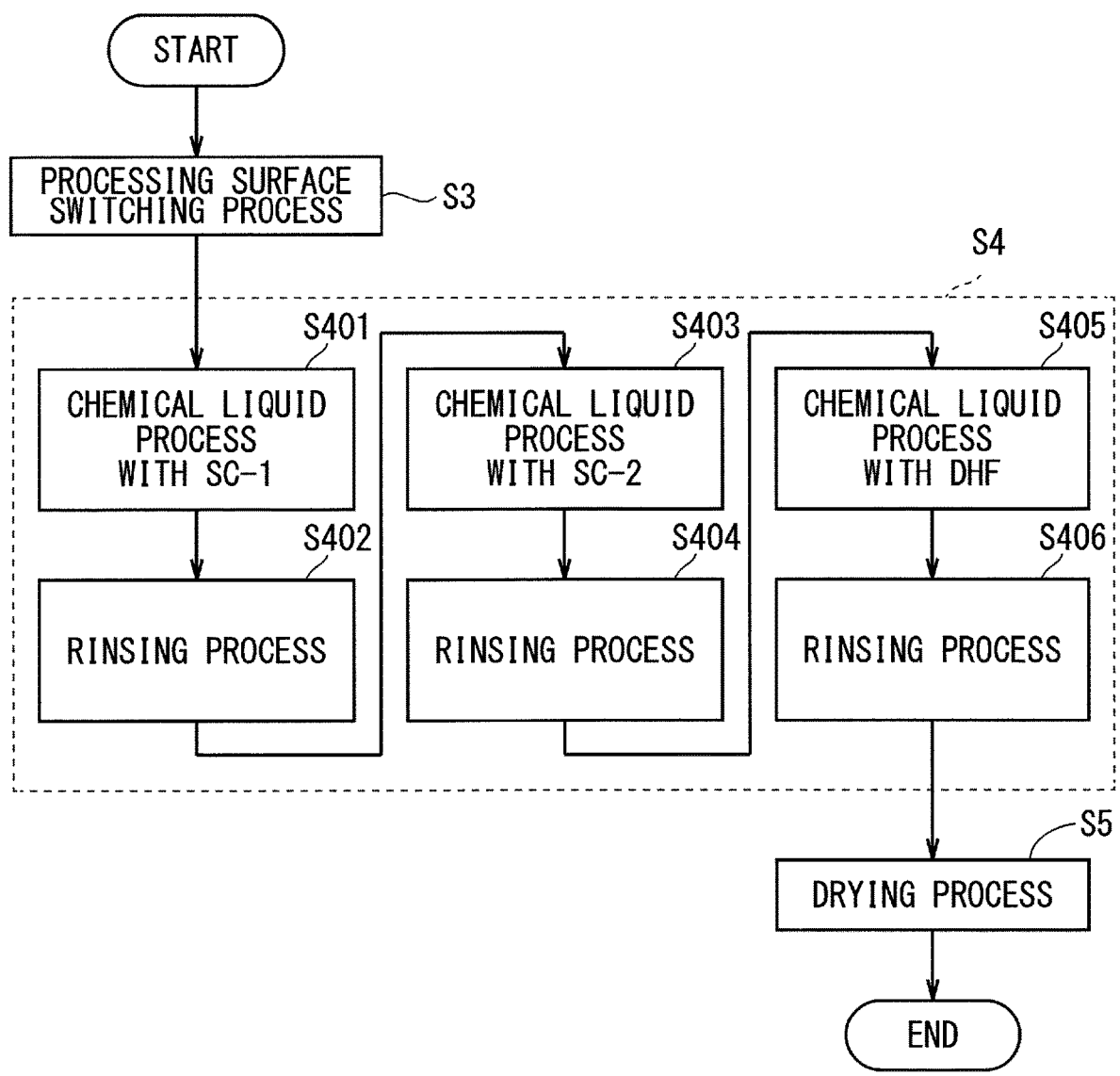

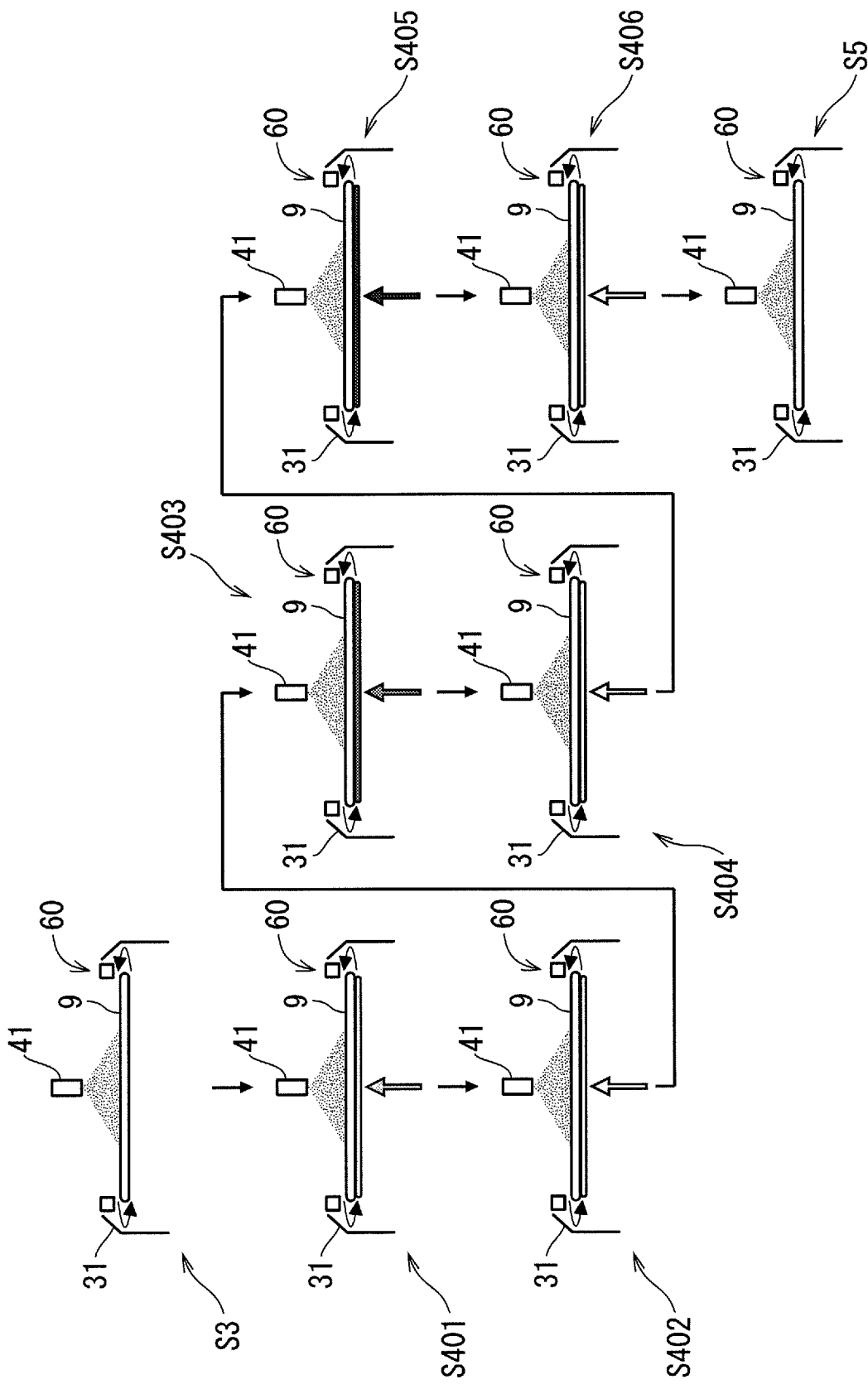

SUBSTRATE PROCESSING APPARATUS AND SUBSTRATE PROCESSING METHOD

CROSS-REFERENCE TO RELATED APPLICATIONS

The present patent application is a divisional of prior U.S. patent application Ser. No. 16/040,330, filed Jul. 19, 2018, by Tomonori FUJIWARA, Nobuyuki SHIBAYAMA and Yukifumi YOSHIDA, entitled "Substrate Processing Apparatus and Substrate Processing Method, which is a divisional of U.S. patent application Ser. No. 14/487,499, filed Sep. 16, 2014," now U.S. Pat. No. 10,058,900 B2, issued Aug. 28, 2018, which claims priority to Japanese Patent Application Nos. 2013-201128, filed Sep. 27, 2013 and 2013-201145, filed Sep. 27, 2013. The contents of each of the patent applications listed above are incorporated in full herein by reference.

BACKGROUND OF THE INVENTION

Field of the Invention

The present invention relates to a technique of processing a surface peripheral area of a semiconductor wafer, a glass substrate for a liquid crystal display, a glass substrate for a plasma display, a substrate for an optical disk, a substrate for a magnetic disk, a substrate for a magnetooptical disk, a glass substrate for a photomask, and a substrate for a solar cell, for example.

Description of the Background Art

Not many device patterns (circuit pattern) are formed to reach a place as near as an end face of a substrate. In many cases, a device pattern is formed on a surface region spaced inward a given width from an end face of a substrate.

However, in a film formation step performed to form a device pattern, a film may be formed to reach a place outside a region where the device pattern is to be formed (this region is hereinafter simply called a "device region"). The film formed outside the device region is not only being unnecessary but it might also become a cause for various troubles. As an example, the film formed outside the device region might come unstuck during a process step. This may bring about the danger for example of yield reduction or a trouble in a substrate processing apparatus.

This may be handled by the process of removing a thin film by etching formed outside a device region (what is called bevel etching process). An apparatus responsible for such process has been suggested (see Japanese Patent Application Laid-Open Nos. 2008-300454, 2011-066194, 2009-070946, 2006-210580, 2001-070861, and 2003-264168, for example).

If a surface peripheral area outside a device region is processed with a processing liquid, the processing liquid supplied to the surface peripheral area might go into the device region (more specifically, the processing liquid might bounce off the surface peripheral area into the device region). Entry of the processing liquid into the device region acts disadvantageously on a device pattern, bringing about the danger of yield reduction.

SUMMARY OF THE INVENTION

The present invention is intended for a substrate processing apparatus. The substrate processing apparatus according to an aspect of this invention includes: a substrate holder to hold a substrate in a horizontal posture, the substrate holder rotating the substrate about a vertical rotary axis passing through the center of a plane of the substrate; and a discharge head for peripheral area from which a fluid is discharge toward a surface peripheral area of the substrate held on the substrate holder. The discharge head for peripheral area includes: multiple nozzles; and a support part that supports the nozzles integrally. The nozzles include: a processing liquid nozzle from which a processing liquid is discharged toward the surface peripheral area; and a gas nozzle from which gas is discharged toward the surface peripheral area. The gas nozzle is placed upstream of a rotative direction of the substrate relative to the processing liquid nozzle.

The gas nozzle is placed upstream of the rotative direction of the substrate relative to the processing liquid nozzle. In this structure, an old processing liquid having been supplied from the processing liquid nozzle before one rotation of the substrate and not having been shaken off during this rotation is removed with gas discharged from the gas nozzle. Then, a new processing liquid can be supplied from the processing liquid nozzle to each position within the surface peripheral area. This makes the occurrence of a situation unlikely where a newly supplied processing liquid collides with an old processing liquid on the surface peripheral area to bounce. This suppresses entry of a processing liquid having been used for processing the surface peripheral area into a device region.

In the substrate processing apparatus according to a different aspect of this invention, a target discharge position of the gas nozzle is closer to the center of the substrate than a target discharge position of the processing liquid nozzle. The target discharge position is a position on the substrate about each of the nozzles where a fluid discharged from corresponding one of the nozzles is to reach.

In the surface peripheral area of the substrate, gas is supplied to a position closer to the center of the substrate than a position where the processing liquid is discharged. In this structure, the processing liquid supplied to the surface peripheral area can be removed with gas in a direction from the center of the substrate toward an end face of the substrate. This can suppress entry of the processing liquid on the surface peripheral area into the device region.

In the substrate processing apparatus according to a different aspect of this invention, the processing liquid nozzle of the discharge head for peripheral area includes multiple processing liquid nozzles. The processing liquid nozzles include: a chemical liquid nozzle from which a chemical liquid is discharged; and a rinse liquid nozzle from which a rinse liquid is discharged.

The chemical liquid nozzles from which a chemical liquid is discharged and the rinse liquid nozzle from which a rinse liquid is discharged are supported integrally. This structure simplifies the structure of the apparatus and can adjust the positions of the nozzles relative to each other easily, compared to the case where the nozzles are supported separately.

In the substrate processing apparatus according to a different aspect of this invention, a target discharge position of the rinse liquid nozzle is closer to the center of the substrate than a target discharge position of the chemical liquid nozzle. The target discharge position is a position on the substrate about each of the nozzles where a fluid discharged from corresponding one of the nozzles is to reach.

In the surface peripheral area of the substrate, a rinse liquid is discharged to a position closer to the center of the substrate than a position where a chemical liquid is discharged. In this structure, the chemical liquid supplied to the surface peripheral area can be washed away with the rinse liquid in a direction from the center of the substrate toward the end face. This can wash out the chemical liquid satisfactorily while suppressing entry of the chemical liquid into the device region sufficiently.

In the substrate processing apparatus according to a different aspect of this invention, the chemical liquid nozzle of the discharge head for peripheral area includes multiple chemical liquid nozzles. The chemical liquid nozzles include: a first chemical liquid nozzle from which an acidic chemical liquid is discharged; and a second chemical liquid nozzle from which an alkaline chemical liquid is discharged. The rinse liquid nozzle is placed between the first and second chemical liquid nozzles.

The rinse liquid nozzle from which a rinse liquid is discharged is placed between the first chemical liquid nozzle from which an acidic chemical liquid is discharged and the second chemical liquid nozzle from which an alkaline chemical liquid is discharged. This structure can suppress the occurrence of a situation where an atmosphere generated during discharge of a chemical liquid from one of the chemical liquid nozzles reacts with a chemical liquid remaining inside of the other chemical liquid nozzle, for example.

In the substrate processing apparatus according to a different aspect of this invention, a target discharge position of the first chemical liquid nozzle and a target discharge position of the second chemical liquid nozzle are spaced by the same distance from the end face of the substrate. The target discharge position is a position on the substrate about each of the nozzles where a fluid discharged from corresponding one of the nozzles is to reach.

The target discharge position of the first chemical liquid nozzle and the target discharge position of the second chemical liquid nozzle are spaced by the same distance from the end face of the substrate. Thus, in the surface peripheral area of the substrate, an alkaline chemical liquid can be discharged to a position where an acidic chemical liquid is discharged. This structure allows both of the chemical liquids to act on the same region accurately.

In the substrate processing apparatus according to a different aspect of this invention, the nozzles include a steam nozzle from which steam is discharged toward the surface peripheral area.

The discharge head for peripheral area includes the steam nozzle from which steam is discharged. In this structure, the surface peripheral area can be heated by discharging steam from the steam nozzle toward the surface peripheral area.

In the substrate processing apparatus according to a different aspect of this invention, the steam nozzle is placed upstream of the rotative direction of the substrate relative to the processing liquid nozzle.

The steam nozzle is placed upstream of the rotative direction of the substrate relative to the processing liquid nozzle. In this structure, each position within the surface peripheral area can be supplied with a processing liquid from the processing liquid nozzle after being heated with steam discharged from the steam nozzle. This can accelerate reaction between the processing liquid supplied to the surface peripheral area and the substrate.

In the substrate processing apparatus according to a different aspect of this invention, the processing liquid nozzle includes a chemical liquid nozzle from which a chemical liquid is discharged. A target discharge position of the steam nozzle and a target discharge position of the chemical liquid nozzle are spaced by the same distance from the end face of the substrate. The target discharge position is a position on the substrate about each of the nozzles where a fluid discharged from corresponding one of the nozzles is to reach.

The target discharge position of the steam nozzle and the target discharge position of the chemical liquid nozzle are spaced by the same distance from the end face of the substrate. Accordingly, a position in the surface peripheral area where a chemical liquid is to be discharged can be heated with steam. This structure can effectively accelerate reaction between a chemical liquid supplied to the surface peripheral area and the substrate.

In the substrate processing apparatus according to a different aspect of this invention, the nozzles each include: a nozzle body supported by the support part such that a lower surface of the nozzle body is placed in a horizontal posture; an open discharge port formed in the lower surface of the nozzle body; and a flow path formed inside the nozzle body. The flow path communicates with the discharge port at a lower end of the flow path. The flow path includes a tilted flow path section that extends obliquely downward such that the tilted flow path section gets farther in a lower position in a direction from the center of the substrate toward the end face of the substrate to communicate with the discharge port at a lower end of the tilted flow path section.

The flow path formed inside the nozzle body includes the tilted flow path section that extends obliquely downward such that the tilted flow path section gets farther in a lower position in a direction from the center of the substrate toward the end face of the substrate to communicate with the discharge port at a lower end of the tilted flow path section. This structure allows a fluid discharged from the nozzle toward the surface peripheral area of the substrate to flow in the surface peripheral area of the substrate toward an outer side of the substrate.

The substrate processing apparatus according to a different aspect of this invention includes a controller that controls the substrate holder and the discharge head for peripheral area. While making the substrate holder rotate the substrate, the controller causes discharge of a processing liquid from the processing liquid nozzle toward the surface peripheral area of the rotated substrate and causes discharge of gas from the gas nozzle toward the surface peripheral area.

A processing liquid is discharged from the processing liquid nozzle toward the surface peripheral area of the rotated substrate while gas is discharged toward the surface peripheral area from the gas nozzle placed upstream of the rotative direction of the substrate relative to the processing liquid nozzle. In this structure, an old processing liquid having been supplied from the processing liquid nozzle before one rotation of the substrate and not having been shaken off during this rotation is removed with gas discharged from the gas nozzle. Then, a new processing liquid can be supplied from the processing liquid nozzle to each position within the surface peripheral area. This makes the occurrence of a situation unlikely where a newly supplied processing liquid collides with an old processing liquid on the surface peripheral area to bounce. This suppresses entry of a processing liquid having been used for processing the surface peripheral area into the device region.

In the substrate processing apparatus according to a different aspect of this invention, the processing liquid discharged from the processing liquid nozzle is diluted hydrofluoric acid.

In the substrate processing apparatus according to a different aspect of this invention, the processing liquid discharged from the processing liquid nozzle is a rinse liquid.

The present invention is also intended for a substrate processing method. The substrate processing method according to an aspect of this invention includes the steps of: a) rotating a substrate about a vertical rotary axis passing through the center of a plane of the substrate while holding the substrate in a horizontal posture; b) discharging a processing liquid from a processing liquid nozzle toward a surface peripheral area of the rotated substrate; and c) discharging gas from a gas nozzle toward the surface peripheral area. The gas nozzle is placed upstream of a rotative direction of the substrate relative to the processing liquid nozzle. The step c) is performed parallel to the step b).

The substrate processing method according to a different aspect of this invention includes the steps of: a) discharging a first processing liquid toward a surface peripheral area of a substrate while rotating the substrate about a vertical rotary axis passing through the center of a plane of the substrate; b) after discharge of the first processing liquid is stopped, moving the first processing liquid remaining on the surface peripheral area toward an end face of the substrate and shaking off the first processing liquid from the end face toward the outside of the substrate; and c) discharging a second processing liquid toward the surface peripheral area while rotating the substrate. The step c) is performed after the step b).

As a result of the presence of the step of moving the first processing liquid remaining on the surface peripheral area toward the end face of the substrate and shaking off the first processing liquid from the end face toward the outside of the substrate (liquid shake-off step), the second processing liquid is discharged toward the surface peripheral area on which substantially no first processing liquid remains. This makes the occurrence of a situation unlikely where a discharged processing liquid collides with a processing liquid remaining on the surface peripheral area to bounce. This suppresses entry of a processing liquid into a device region.

In the substrate processing method according to a different aspect of this invention, the step b) includes the steps of: b1) rotating the substrate while discharge of a fluid toward the surface peripheral area is stopped; and b2) discharging gas toward the surface peripheral area of the substrate.

The liquid shake-off step includes the step of rotating the substrate while discharge of a fluid toward the surface peripheral area is stopped, and the step of discharging gas toward the surface peripheral area of the substrate. This structure can satisfactorily shake off the first processing liquid remaining on the surface peripheral area in a short time.

In the substrate processing method according to a different aspect of this invention, a rotation speed of the substrate is higher in the step b1) than a rotation speed of the substrate in the step a).

The substrate is rotated at a relatively high speed during the liquid shake-off step. In this structure, the first processing liquid remaining on the surface peripheral area can be shaken off within a particularly short time.

The substrate processing method according to a different aspect of this invention includes the step of d) discharging cover gas toward the center and its vicinity of a surface of the substrate during the steps a), b), and c).

The cover gas is discharged toward the center and its vicinity of the surface of the substrate. This protects the device region from an atmosphere of a processing liquid supplied to the surface peripheral area, for example.

In the substrate processing method according to a different aspect of this invention, the amount of the cover gas discharged in the step b) is larger than the amount of the cover gas discharged in the step a).

The cover gas of a relatively large amount is discharged toward the center and its vicinity of the surface of the substrate during the liquid shake-off step. In this structure, the device region is protected sufficiently for example from an atmosphere of the first processing liquid in the liquid shake-off step.

In the substrate processing method according to a different aspect of this invention, the first processing liquid is SC-2.

In the substrate processing method according to a different aspect of this invention, the first processing liquid is a rinse liquid.

Thus, it is an object of the present invention to provide a technique capable of suppressing entry of a processing liquid having been used for process on a surface peripheral area into a device region.

These and other objects, features, aspects and advantages of the present invention will become more apparent from the following detailed description of the present invention when taken in conjunction with the accompanying drawings.

BRIEF DESCRIPTION OF THE DRAWINGS

FIG. 2 is a sectional view showing a peripheral area and its vicinity of a substrate to be processed;

FIGS. 3 and 4 are diagrammatic perspective views of a substrate processing apparatus;

FIG. 18 explains the front surface peripheral process;

FIG. 19 shows a flow of process including back surface process;

FIG. 20 explains the process including the back surface process;

DESCRIPTION OF THE PREFERRED EMBODIMENTS

Figure 1:
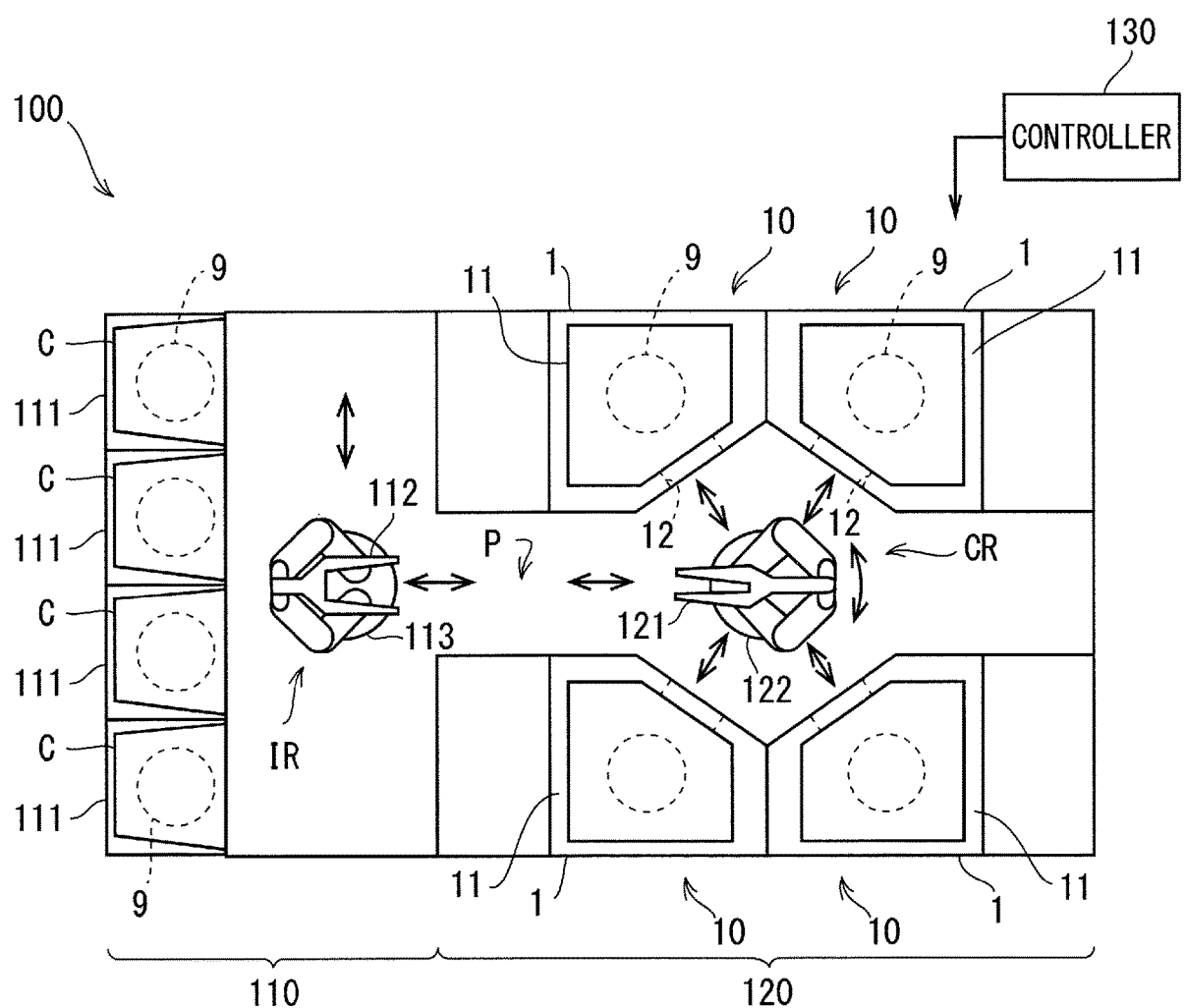
FIG. 1 a diagrammatic plan view schematically showing a substrate processing system.

The following describes a preferred embodiment by referring to the drawings. The preferred embodiment described below is an example of an embodiment of the present invention and is not intended to limit the technical scope of the present invention. In order to facilitate understanding, in each drawing referred to in the following description, the dimension of each part or the number of parts of each structure may be exaggerated or simplified.

<1. Substrate Processing System 100>

<1-1. Structure>

The structure of a substrate processing system 100 is described below by referring to FIG. 1. FIG. 1 a diagrammatic plan view schematically showing the substrate processing system 100.

The substrate processing system 100 is a system to successively process multiple substrates 9 one by one. In the below, a substrate 9 to be processed in the substrate processing system 100 is a circular semiconductor wafer, for example.

The substrate processing system 100 includes multiple cells (processing blocks) (more specifically, indexer cell 110 and processing cell 120) arranged in juxtaposition, and a controller 130 to control each operating mechanism and the like of the cells 110 and 120.

<Indexer Cell 110>

The indexer cell 110 is a cell to transfer an unprocessed substrate 9 received from outside the system to the processing cell 120 and to transport a processed substrate 9 received from the processing cell 120 to the outside of the system. The indexer cell 110 includes carrier stages 111 on which multiple carriers C are placed, and a substrate transport unit (transfer robot) IR to carry the substrate 9 into and out of each carrier C.

The carrier C housing unprocessed substrates 9 is transported from the outside of the system for example by an OHT (overhead hoist transfer) into the apparatus and then placed on the carrier stage 111. The unprocessed substrates 9 are taken out of the carrier C one by one and processed inside the system. The substrates 9 after being processed by the system are housed in the carrier C again. The carrier C housing the processed substrates 9 are transported to the outside of the system by the OHT, for example. In this way, the carrier stage 111 functions as a substrate collecting unit to collect unprocessed substrates 9 and processed substrates 9. The carrier C can be an FOUP (front opening unified pod) housing substrates 9 in hermetically-sealed space, an SMIF (standard mechanical interface) pod, or an OC (open cassette) to expose substrates 9 housed in the carrier C to external air.

The transfer robot IR includes a hand 112 to hold the substrate 9 in a horizontal posture (posture that places a main surface of the substrate 9 in a horizontal posture) by supporting the substrate 9 from below, and a hand drive mechanism 113 to drive the hand 112. The transfer robot IR takes an unprocessed substrate 9 out of the carrier C placed on the carrier stage 111, and transfers this substrate 9 in a substrate transfer position P to a transport robot CR (described later). The transfer robot IR receives a processed substrate 9 in the substrate transfer position P from the transport robot CR, and houses this substrate 9 into the carrier C placed on the carrier stage 111.

<Processing Cell 120>

The processing cell 120 is a cell to process the substrate 9. The processing cell 120 includes multiple substrate processing apparatuses 1, and a substrate transport unit (transport robot CR) to carrier the substrate 9 into and out of the substrate processing apparatuses 1. Here, multiple (such as three) substrate processing apparatuses 1 are stacked in the vertical direction to form one substrate processing apparatus group 10. Multiple (in the example of FIG. 1, four) substrate processing apparatus groups 10 are arranged in a cluster pattern (tufted pattern) so as to surround the transport robot CR.

Each of the substrate processing apparatuses 1 has a casing 11 inside that forms processing space. The casing 11 is given a gateway 12 through which a hand 121 of the transport robot CR is inserted into the casing 11. The substrate processing apparatuses 1 are arranged such that their gateways 12 face space where the transport robot CR is placed. The specific structure of the substrate processing apparatuses 1 is described later.

The transport robot CR includes a hand 121 to hold the substrate 9 in a horizontal posture by supporting the substrate 9 from below, and a hand drive mechanism 122 to drive the hand 121. As described above, the transport robot CR (more specifically, a base of the transport robot CR) is placed in the center of the space surrounded by the substrate processing apparatus groups 10. The transport robot CR takes a processed substrate 9 out of a designated substrate processing apparatus 1, and transfers this substrate 9 in the substrate transfer position P to the transfer robot IR. The transport robot CR receives an unprocessed substrate 9 in the substrate transfer position P from the transfer robot IR, and transports this substrate 9 to a designated substrate processing apparatus 1.

<Controller 130>

The controller 130 controls each of the transfer robot IR, the transport robot CR, and the substrate processing apparatuses 1 in groups. The hardware structure of the controller 130 can be the same as that of a generally used computer. Specifically, the controller 130 for example includes a CPU to make various calculations, a ROM as a read-only memory to store a basic program, a RAM as a freely readable and writable memory to store information of various types, and a magnetic disk to store control software or data. In the controller 130, the CPU functioning as a main controller makes calculations according to a procedure written in a program, thereby realizing each functional unit to control each part of the substrate processing system 100. Some or all of the functional units realized by the controller 130 can be realized in terms of hardware by a dedicated logic circuit, for example.

<1-2. Operation>

The overall operation of the substrate processing system 100 is described below by further referring to FIG. 1. In the substrate processing system 100, the controller 130 controls each part of the substrate processing system 100 according to a recipe describing a procedure for transporting the substrate 9, a condition for processing the substrate 9 and the like, thereby executing a series of operations described below.

When the carrier C housing an unprocessed substrate 9 is placed on the carrier stage 111, the transfer robot IR takes the unprocessed substrate 9 out of this carrier C. Then, the transfer robot IR moves the hand 112 holding the unprocessed substrate 9 to the substrate transfer position P and transfers the unprocessed substrate 9 in the substrate transfer position P to the transport robot CR. The transport robot CR having received the unprocessed substrate 9 transferred onto the hand 121 transports the unprocessed substrate 9 into a substrate processing apparatus 1 designated in the recipe. Transfer of the substrate 9 between the transfer robot IR and the transport robot CR can be done directly between the hands 112 and 121 or through a placement unit provided in the substrate transfer position P, for example.

The substrate processing apparatus 1 having received the substrate 9 performs prescribed process on the substrate 9. A flow of the process performed in the substrate processing apparatus 1 is described later.

After the process on the substrate 9 is finished in the substrate processing apparatus 1, the transport robot CR takes the processed substrate 9 out of the substrate processing apparatus 1. Then, the transport robot CR moves the hand 121 holding the processed substrate 9 to the substrate transfer position P and transfers the processed substrate 9 in the substrate transfer position P to the transfer robot IR. The transfer robot IR having received the processed substrate 9 transferred onto the hand 112 houses the processed substrate 9 into the carrier C.

In the substrate processing system 100, the transport robot CR and the transfer robot IR perform the aforementioned transporting operation repeatedly according to the recipe and each substrate processing apparatus 1 processes the substrate 9 according to the recipe. As a result, the substrates 9 are processed one after another.

<2. Substrate 9>

The substrate 9 to be processed by the substrate processing apparatus 1 is described next by referring to FIG. 2. FIG. 2 is a sectional view showing a peripheral area and its vicinity of the substrate 9.

The substrate 9 to be processed by the substrate processing apparatus 1 has a three-layer structure including a center layer 901 made for example of silicon (Si), an underlying film 902 outside the center layer 901, and an overlying film 903 outside the underlying film 902. The underlying film 902 is a thermally-oxidized film (Th—$SiO_2$) or a dielectric film (such as an Hf (hafnium) film or an Hf oxide film), for example. The overlying film 903 is a barrier metal film (such as a TiN film or a TaN film) or a metal film (such as an Al film, a W film, an NiSi film or a Cu film). The substrate 9 to be processed by the substrate processing apparatuses 1 may also have a two-layer structure including the center layer 901 and the underlying film 902, or a structure with four layers or more.

In the below, a main surface of the substrate 9 on which a device pattern is to be formed is called a "front surface 91," and a surface opposite the front surface 91 is called a "back surface 92." A region of the front surface 91 where the device pattern is to be formed is called a "device region 90." A peripheral area of the front surface 91 outside the device region 90 (more specifically, this peripheral area is an annular region of a minute width d (d=0.5 mm to 3.0 mm (millimeters), for example) extending from an end face 93 of the substrate 9) is called a "front surface peripheral area 911." An annular region of the minute width d extending from an end face 93 of the back surface 92 is called a "back surface peripheral area 921."

The substrate processing apparatus 1 is to process the substrate 9 of the aforementioned multilayer structure and can process the front surface peripheral area 911 and the back surface 92 of the substrate 9 (such as removal of a thin film formed on the front surface peripheral area 911 and the back surface 92, for example).

<3. Structure of Substrate Processing Apparatus 1>

Figure 3:
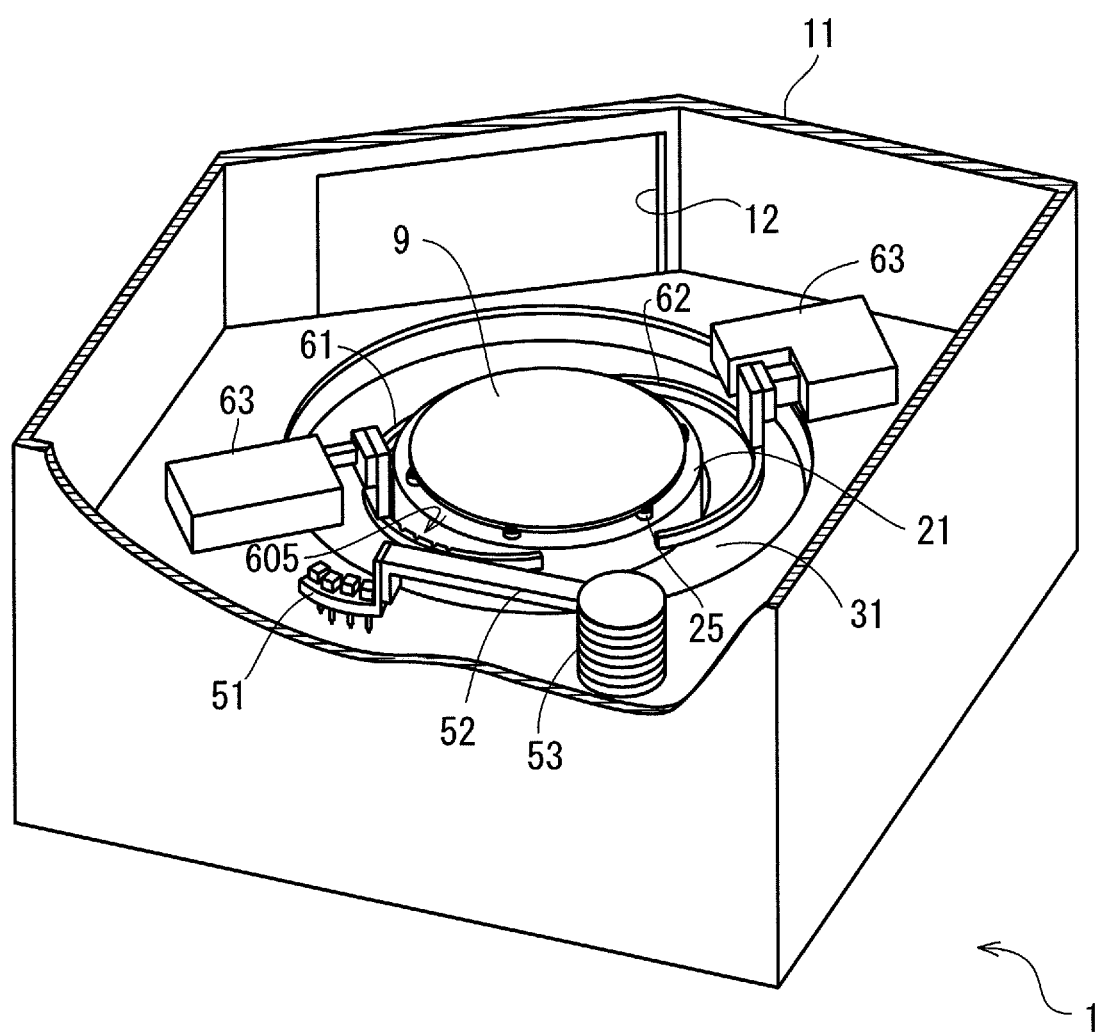
Figure 5:
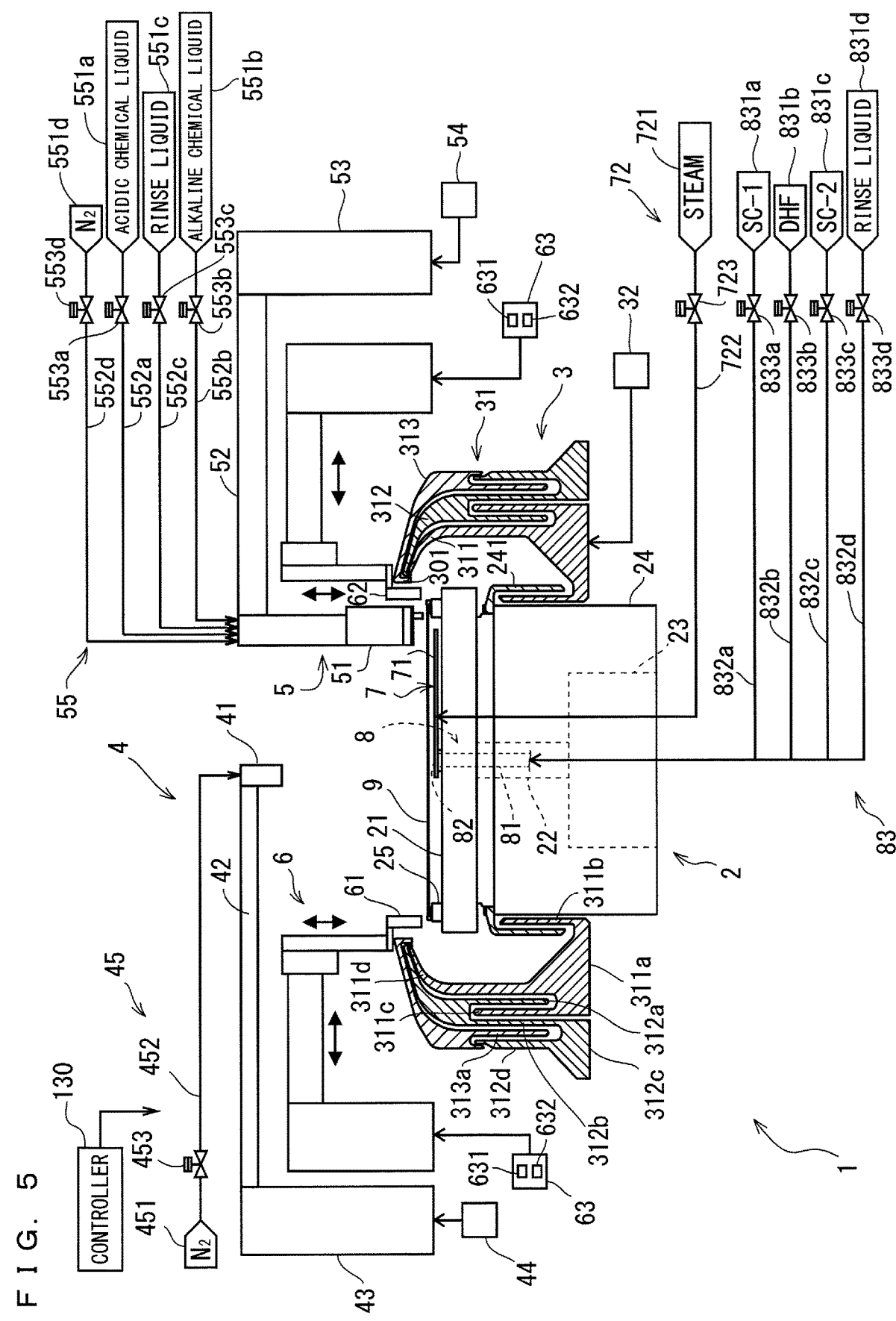
FIG. 5 is a schematic view describing the structure of the substrate processing apparatus.

The following describes the structure of the substrate processing apparatus 1 by referring to FIGS. 3 to 5. FIG. 3 is a diagrammatic perspective view of the substrate processing apparatus 1 showing a condition where semicircular members 61 and 62 forming a guard member 60, a cup 31, and a discharge head 51 for peripheral area are placed in their respective retreat positions. FIG. 4 is also a diagrammatic perspective view of the substrate processing apparatus 1 showing a condition where the guard member 60, the cup 31, and the discharge head 51 are placed in their respective processing positions. FIG. 5 is a schematic view describing the structure of the substrate processing apparatus 1.

In the following description, a "processing liquid" includes a "chemical liquid" used in chemical liquid process, and a "rinse liquid" used in rinsing process performed to wash out the chemical liquid.

The substrate processing apparatus 1 includes a spin chuck 2, an anti-splash unit 3, a front surface protecting unit 4, a peripheral processing unit 5, a liquid bounce suppressing unit 6, a heat processing unit 7, and a back surface processing unit 8. Each of these units 2 to 8 is electrically connected to the controller 130 and operates in response to an order from the controller 130.

<Spin Chuck 2>

The spin chuck 2 is a substrate holder to hold the substrate 9 in a substantially horizontal posture while pointing the front surface 91 of the substrate 9 upward. The spin chuck 2 rotates the substrate 9 about a vertical rotary axis passing through the center of the front surface 91 of the substrate 9.

The spin chuck 2 includes a spin base 21 that is a circular plate member slightly larger than the substrate 9. A rotary shaft part 22 is coupled to a lower surface central area of the spin base 21. The rotary shaft part 22 is placed in a posture that makes the shaft line of the rotary shaft part 22 extend in the vertical direction. The rotary shaft part 22 is connected to a rotary drive part (such as a motor) 23 to rotate the rotary shaft part 22 about the shaft line of the rotary shaft part 22. The rotary shaft part 22 and the rotary drive part 23 are housed in a tubular casing 24. Appropriately spaced multiple (such as six) holding members 25 are provided on a peripheral area and its vicinity of the upper surface of the spin base 21. The holding members 25 make abutting contact with the end face 93 of the substrate 9 to determine the position of the substrate 9 in the horizontal direction while holding the substrate 9 in a substantially horizontal posture in a position slightly higher than the upper surface of the spin base 21 (specifically, in a position spaced by a given distance from the upper surface of the spin base 21).

In this structure, the rotary drive part 23 rotates the rotary shaft part 22 while the holding members 25 hold the substrate 9 above the spin base 21. This rotates the spin base 21 about a shaft center extending in the vertical direction, thereby rotating the substrate 9 held on the spin base 21 about the vertical rotary axis passing through the center of the plane of the substrate 9.

The holding members 25 and the rotary drive part 23 are electrically connected to the controller 130 and operate under control by the controller 130. Specifically, the controller 130 controls timing of holding the substrate 9 onto the spin base 21, timing of releasing the substrate 9, and a mode of rotation of the spin base 21 (more specifically, timing of starting rotation, timing of finishing the rotation, and the frequency of rotation (specifically, a rotation speed), for example).

<Anti-Splash Unit 3>

The anti-splash unit 3 receives a processing liquid and the like splashed from a rotated substrate 9 held on the spin base 21.

The anti-splash unit 3 includes the cup 31. The cup 31 is a tubular member with an open top end. The cup 31 is provided so as to surround the spin chuck 2. In this preferred embodiment, the cup 31 is composed for example of three members including an inner member 311, an intermediate member 312, and an outer member 313.

The inner member 311 is a tubular member with an open top end. The inner member 311 has a bottom part 311a of a circular ring shape, a circularly cylindrical inner wall part 311b extending upward from an inner edge portion of the bottom part 311a, a circularly cylindrical outer wall part 311c extending upward from an outer edge portion of the bottom part 311a, and a circularly cylindrical guide wall 311d standing upright between the inner and outer wall parts 311b and 311c. The guide wall 311d extends upward from the bottom part 311a. The guide wall 311d curves inward and upward at an upper end portion and its vicinity. The inner wall part 311b is housed, at least at its tip and the vicinity thereof, in internal space defined by a flange member 241 of the casing 24 of the spin chuck 2.

The bottom part 311a is provided with a drain groove (not shown in the drawings) that makes communication with space between the inner wall part 311b and the guide wall 311d. This drain groove is connected to a drain line of a factory. This drain groove is connected to an evacuation and drain mechanism to exhaust air compulsorily out of the inside of the drain groove to place the space between the inner wall part 311b and the guide wall 311d in a negative pressure. The space between the inner wall part 311b and the guide wall 311d is space where a processing liquid having been used for processing the substrate 9 is gathered for drainage. The processing liquid gathered in this space is drained out of the drain groove.

The bottom part 311a is further provided with a first collection groove (not shown in the drawings) that makes communication with space between the guide wall 311d and the outer wall part 311c. The first collection groove is connected to a first collection tank. The first collection groove is connected to an evacuation and drain mechanism to exhaust air compulsorily out of the inside of the first collection groove to place the space between the guide wall 311d and the outer wall part 311c in a negative pressure. The space between the guide wall 311d and the outer wall part 311c is space where a processing liquid having been used for processing the substrate 9 is gathered for collection. The processing liquid gathered in this space passes through the first collection groove to be collected in the first collection tank.

The intermediate member 312 is a tubular member with an open top end and is arranged outside the guide wall 311d of the inner member 311. The intermediate member 312 curves inward and upward at an upper portion. The intermediate member 312 has a top edge portion bent so as to extend along a top edge portion of the guide wall 311d.

The intermediate member 312 has an inner circumferential wall part 312a extending downward along an inner circumferential surface and an outer circumferential wall part 312b extending downward along an outer circumferential surface that are formed at a lower portion of the intermediate member 312. In a condition where the inner and intermediate members 311 and 312 are close to each other (condition of FIG. 5), the inner circumferential wall part 312a is housed between the guide wall 311d and the outer wall part 311c of the inner member 311. The lower end of the outer circumferential wall part 312b is attached to an inner edge portion of a bottom part 312c of a circular ring shape. A circularly cylindrical outer wall part 312d stands upward from an outer edge portion of the bottom part 312c.

The bottom part 312c is provided with a second collection groove (not shown in the drawings) that makes communication with space between the outer circumferential wall part 312b and the outer wall part 312d. The second collection groove is connected to a second collection tank. The second collection groove is connected to an evacuation and drain mechanism to exhaust air compulsorily out of the inside of the second collection groove to place the space between the outer circumferential wall part 312b and the outer wall part 312d in a negative pressure. The space between the outer circumferential wall part 312b and the outer wall part 312d is space where a processing liquid having been used for processing the substrate 9 is gathered for collection. The processing liquid gathered in this space passes through the second collection groove to be collected in the second collection tank.

The outer member 313 is a tubular member with an open top end and is arranged outside the intermediate member 312. The outer member 313 curves inward and upward at an upper portion. The outer member 313 has a top edge portion 301 that is bent downward in a position slightly inside the respective top edge portions of the intermediate and inner members 312 and 311. In a condition where the inner, intermediate, and outer members 311, 312, and 313 are close to each other (condition of FIG. 5), the respective top edge portions of the intermediate and inner members 312 and 311 are covered by the bent portion of the outer member 313.

The outer member 313 has a lower portion provided with an inner circumferential wall part 313a extending downward along an inner circumferential surface. In a condition where the intermediate and outer members 312 and 313 are close to each other (condition of FIG. 5), the inner circumferential wall part 313a is housed between the outer circumferential wall part 312b and the outer wall part 312d of the intermediate member 312.

The cup 31 is provided with a cup drive mechanism 32 to move the cup 31 up and down. The cup drive mechanism 32 is composed for example of a stepping motor. In this preferred embodiment, the cup drive mechanism 32 moves the three members 311, 312, and 313 of the cup 31 up and down independently.

Each of the inner, intermediate, and outer members 311, 312 and 313 is moved between an upper position and a lower position in response to drive by the cup drive mechanism 32. The respective upper positions of the members 311, 312 and 313 are positions that place respective top edge portions of the members 311, 312 and 313 lateral to the substrate 9 held on the spin base 21. The respective lower positions of the members 311, 312 and 313 are positions that place respective top edge portions of the members 311, 312, and 313 below the upper surface of the spin base 21. The cup drive mechanism 32 is electrically connected to the controller 130 and operates under control by the controller 130. Specifically, the position of the cup 31 (more specifically, the respective positions of the inner, intermediate, and outer members 311, 312, and 313) is controlled by the controller 130.

In the below, "the cup 31 being placed in a retreat position" means a condition where the outer member 313 is placed in its lower position (specifically, a condition where all the inner, intermediate, and outer members 311, 312, and 313 are placed in their lower positions). Where the substrate 9 is not held on the spin base 21, the cup 31 is placed in the retreat position. Specifically, where the substrate 9 is not held on the spin base 21, the cup 31 is in a position that places the top edge portion of the cup 31 (specifically, the top edge portion 301 of the outer member 313) below the upper surface of the spin base 21.

In the below, "the cup 31 being placed in a processing position" means a condition where the outer member 313 is placed in its upper position. The top edge portion of the cup 31 (specifically, the top edge portion 301 of the outer member 313) in the processing position is placed lateral to the substrate 9 held on the spin base 21. "The cup 31 being placed in the processing position" includes three conditions as follows. In a first condition, all the inner, intermediate, and outer members 311, 312, and 313 are placed in their upper positions (condition of FIG. 5). In this condition, a processing liquid splashed from the substrate 9 held by the spin chuck 2 is gathered in the space between the inner wall part 311b and the guide wall 311d of the inner member 311 and is then drained out of the drain groove. In a second condition, the inner member 311 is placed in its lower position whereas the intermediate and outer members 312 and 313 are placed in their upper positions. In this condition, a processing liquid splashed from the substrate 9 held by the spin chuck 2 is gathered in the space between the guide wall 311d and the outer wall part 311c of the inner member 311 and is then collected in the first collection tank. In a third condition, the inner and intermediate members 311 and 312 are placed in their lower positions whereas the outer member 313 is placed in its upper position. In this condition, a processing liquid splashed from the substrate 9 held by the spin chuck 2 is gathered in the space between the outer circumferential wall part 312b and the outer wall part 312d of the intermediate member 312 and is then collected in the second collection tank.

<Front Surface Protecting Unit 4>

The front surface protecting unit 4 supplies gas (cover gas) to the center and its vicinity of the front surface 91 of the substrate 9 held on the spin base 21, thereby protecting the device region 90 from the atmosphere of a processing liquid supplied to the front surface peripheral area 911, for example.

The front surface protecting unit 4 includes a cover gas nozzle 41 from which gas is discharged toward the center and its vicinity of the front surface 91 of the substrate 9 held on the spin base 21. The cover gas nozzle 41 is attached to a tip portion of a horizontally extending arm 42. A base end portion of the arm 42 is coupled to a nozzle base 43. The nozzle base 43 is placed in a posture that makes the axis line of the nozzle base 43 extend in the vertical direction. The base end portion of the arm 42 is coupled to the upper end of the nozzle base 43.

The nozzle base 43 is provided with a drive unit 44 to drive the cover gas nozzle 41. The drive unit 44 is composed for example of a rotation drive part (such as a servomotor) to rotate the nozzle base 43 about the axis line of the nozzle base 43, and an up-and-down drive part (such as a stepping motor) to expand and contract the nozzle base 43 along the axis line of the nozzle base 43. In response to rotation of the nozzle base 43 by the drive unit 44, the cover gas nozzle 41 moves along an arcuate orbit in a horizontal plane. In response to expansion or contraction of the nozzle base 43 by the drive unit 44, the cover gas nozzle 41 moves in a direction where the cover gas nozzle 41 gets closer to or farther from the substrate 9.

In response to drive by the drive unit 44, the cover gas nozzle 41 moves between a processing position and a retreat position. The processing position of the cover gas nozzle 41 mentioned herein is a position above the substrate 9 held on the spin base 21 that makes the cover gas nozzle 41 face the center and its vicinity of the front surface 91 while placing the cover gas nozzle 41 close to the front surface 91 in a noncontact manner. The retreat position of the cover gas nozzle 41 is a position that does not interfere with a transport path for the substrate 9 which is outside the top edge portion 301 of the cup 31 as viewed from above, for example. The drive unit 44 is electrically connected to the controller 130 and operates under control by the controller 130. Specifically, the position of the cover gas nozzle 41 is controlled by the controller 130.

The cover gas nozzle 41 is connected to a cover gas supplier 45 that is a pipe system to supply gas (nitrogen ($N_2$) gas is supplied here, for example) to the cover gas nozzle 41. As an example, the specific structure of the cover gas supplier 45 includes a nitrogen gas source 451 as a source for nitrogen gas that is connected to the cover gas nozzle 41 through a pipe 452 in which an open-close valve 453 is interposed. In this structure, opening the open-close valve 453 discharges nitrogen gas from the cover gas nozzle 41 supplied from the nitrogen gas source 451. Gas to be supplied to the cover gas nozzle 41 can be different from nitrogen gas (such as inert gases of various types except nitrogen gas or dry air).

If gas is supplied from the cover gas supplier 45 to the cover gas nozzle 41 placed in the processing position, gas (cover gas) is discharged from the cover gas nozzle 41 toward the center and its vicinity of the front surface 91 of the substrate 9 held on the spin base 21. The open-close valve 453 of the cover gas supplier 45 is electrically connected to the controller 130 and is opened and closed under control by the controller 130. Specifically, a mode of discharge of gas from the cover gas nozzle 41 (more specifically, timing of starting discharge, timing of finishing the discharge, and discharge flow rate, for example) is controlled by the controller 130.

<Peripheral Processing Unit 5>

The peripheral processing unit 5 is to process the front surface peripheral area 911 of the substrate 9 held on the spin base 21.

<i. Overall Structure>

The peripheral processing unit 5 includes the discharge head 51 from which a fluid is discharged (here, processing liquid and gas) toward the front surface peripheral area 911 of the substrate 9 held on the spin base 21. The discharge head 51 is attached to a tip portion of a horizontally extending arm 52. A base end portion of the arm 52 is coupled to a nozzle base 53. The nozzle base 53 is placed in a posture that makes the axis line of the nozzle base 53 extend in the vertical direction. The base end portion of the arm 52 is coupled to the upper end of the nozzle base 53.

The nozzle base 53 is provided with a drive unit 54 to drive the discharge head 51. The drive unit 54 is composed for example of a rotation drive part (such as a servomotor) to rotate the nozzle base 53 about the axis line of the nozzle base 53, and an up-and-down drive part (such as a stepping motor) to expand and contract the nozzle base 53 along the axis line of the nozzle base 53. In response to rotation of the nozzle base 53 by the drive unit 54, the discharge head 51 moves along an arcuate orbit in a horizontal plane. In response to expansion or contraction of the nozzle base 53 by the drive unit 54, the discharge head 51 moves in a direction where the discharge head 51 gets closer to or farther from the substrate 9.

In response to drive by the drive unit 54, the discharge head 51 moves between a processing position and a retreat position. The processing position of the discharge head 51 mentioned herein is a position (position of FIG. 4) above the substrate 9 held on the spin base 21 that makes the discharge head 51 face the front surface peripheral area 911 while placing the discharge head 51 close to the front surface peripheral area 911 in a noncontact manner. While the discharge head 51 is placed in the processing position, at least part of the discharge head 51 is housed in a cut 605 formed in an inner circumferential wall 601 of the guard member 60 described later. The retreat position of the discharge head 51 is a position (position of FIG. 3) that does not interfere with the transport path for the substrate 9 which is outside the top edge portion 301 of the cup 31 as viewed from above, for example. The drive unit 54 is electrically connected to the controller 130 and operates under control by the controller 130. Specifically, the position of the discharge head 51 is controlled by the controller 130.

The discharge head 51 is connected to a fluid supplier 55 that is a pipe system to supply a fluid (more specifically, processing liquid and gas) to the discharge head 51. More specifically, the fluid supplier 55 is formed by combining for example of an acidic chemical liquid source 551*a*, an alkaline chemical liquid source 551*b*, a rinse liquid source 551*c*, a nitrogen gas source 551*d*, multiple pipes 552*a*, 552*b*, 552*c* and 552*d*, and multiple open-close valves 553*a*, 553*b*, 553*c* and 553*d*.

The acidic chemical liquid source 551*a* is a source to supply an acidic chemical liquid. As an example, the acidic chemical liquid source 551*a* mentioned herein can selectively supply diluted hydrofluoric acid (hereinafter called "DHF") and hydrochloric acid-hydrogen peroxide-water (chemical liquid hereinafter called "SC-2" containing hydrochloric acid (HCl), hydrogen peroxide ($H_2O_2$), and pure water (DIW: deionized water) mixed in a prescribed ratio). The acidic chemical liquid source 551*a* is connected to the discharge head 51 (more specifically, to a "first chemical liquid nozzle 50*a*" described later) through a pipe 552*a* in which an open-close valve 553*a* is interposed. Accordingly, opening the open-close valve 553*a* discharges an acidic chemical liquid (DHF or SC-2) from the first chemical liquid nozzle 50*a* supplied from the acidic chemical liquid source 551*a*. The acidic chemical liquid source 551*a* does not always supply DHF and SC-2 selectively. As an example, the acidic chemical liquid source 551*a* may supply at least one of DHF, SC-2, BDHF (buffered hydrofluoric acid), HF (hydrofluoric acid), hydrochloric acid, sulfuric acid, nitric acid, phosphoric acid, acetic acid, oxalic acid, and mixed solutions thereof, for example.

The alkaline chemical liquid source 551*b* is a source to supply an alkaline chemical liquid. As an example, the alkaline chemical liquid source 551*b* mentioned herein can supply ammonia-hydrogen peroxide-water (chemical liquid hereinafter called "SC-1" containing ammonium hydroxide ($NH_4OH$), hydrogen peroxide ($H_2O_2$), and pure water mixed in a prescribed ratio). The alkaline chemical liquid source 551*b* is connected to the discharge head 51 (more specifically, to a "second chemical liquid nozzle 50*b*" described later) through a pipe 552*b* in which an open-close valve 553*b* is interposed. Accordingly, opening the open-close valve 553*b* discharges an alkaline chemical liquid (SC-1) from the second chemical liquid nozzle 50*b* supplied from the alkaline chemical liquid source 551*b*. It is preferable that SC-1 to be supplied from the alkaline chemical liquid source 551*b* be controlled in temperature to fall in a range of from 60° C. to 80° C., for example. The alkaline chemical liquid source 551*b* may supply a chemical liquid (such as ammonia aqueous solution) other than SC-1.

The rinse liquid source 551*c* is a source to supply a rinse liquid. The rinse liquid source 551*c* mentioned herein supplies for example pure water (carbonated water) as a rinse liquid containing dissolved carbon dioxide ($CO_2$). The rinse liquid source 551*c* is connected to the discharge head 51 (more specifically, to a "rinse liquid nozzle 50*c*" described later) through a pipe 552*c* in which an open-close valve 553*c* is interposed. Accordingly, opening the open-close valve 553*c* discharges a rinse liquid from the rinse liquid nozzle 50*c* supplied from the rinse liquid source 551*c*. A rinse liquid to be used can be pure water, warm water, ozone water, magnetic water, regenerated water (hydrogen water), various organic solvents, ionized water, IPA (isopropyl alcohol) and functional water, for example.

The nitrogen gas source 551*d* is a source to supply gas (nitrogen ($N_2$) gas is supplied here, for example). The nitrogen gas source 551*d* is connected to the discharge head 51 (more specifically, to a "gas nozzle 50*d*" described later) through a pipe 552*d* in which an open-close valve 553*d* is interposed. Accordingly, opening the open-close valve 553*d* discharges nitrogen gas from the gas nozzle 50*d* supplied from the nitrogen gas source 551*d*. The nitrogen gas source 551*d* may supply gas other than nitrogen gas (such as inert gases of various types other than nitrogen gas or dry air).

When a processing liquid (acidic chemical liquid (DHF or SC-2), alkaline chemical liquid (SC-1), or rinse liquid) is supplied from the fluid supplier 55 to the discharge head 51 placed in the processing position, the processing liquid is discharged from the discharge head 51 toward the front surface peripheral area 911 of the substrate 9 held on the spin base 21. If gas is supplied from the fluid supplier 55 to the discharge head 51 placed in the processing position, the gas is discharged from the discharge head 51 toward the front surface peripheral area 911 of the substrate 9 held on the spin base 21. The open-close valves 553*a*, 553*b*, 553*c* and 553*d* of the fluid supplier 55 are each electrically connected to the controller 130 and are opened and closed under control by the controller 130. Specifically, a mode of discharge of a fluid from the discharge head 51 (more specifically, type of fluid to be discharged, timing of starting discharge, timing of finishing the discharge, and discharge flow rate, for example) is controlled by the controller 130.

<ii. Discharge Head 51 for Peripheral Area>

Figure 6:
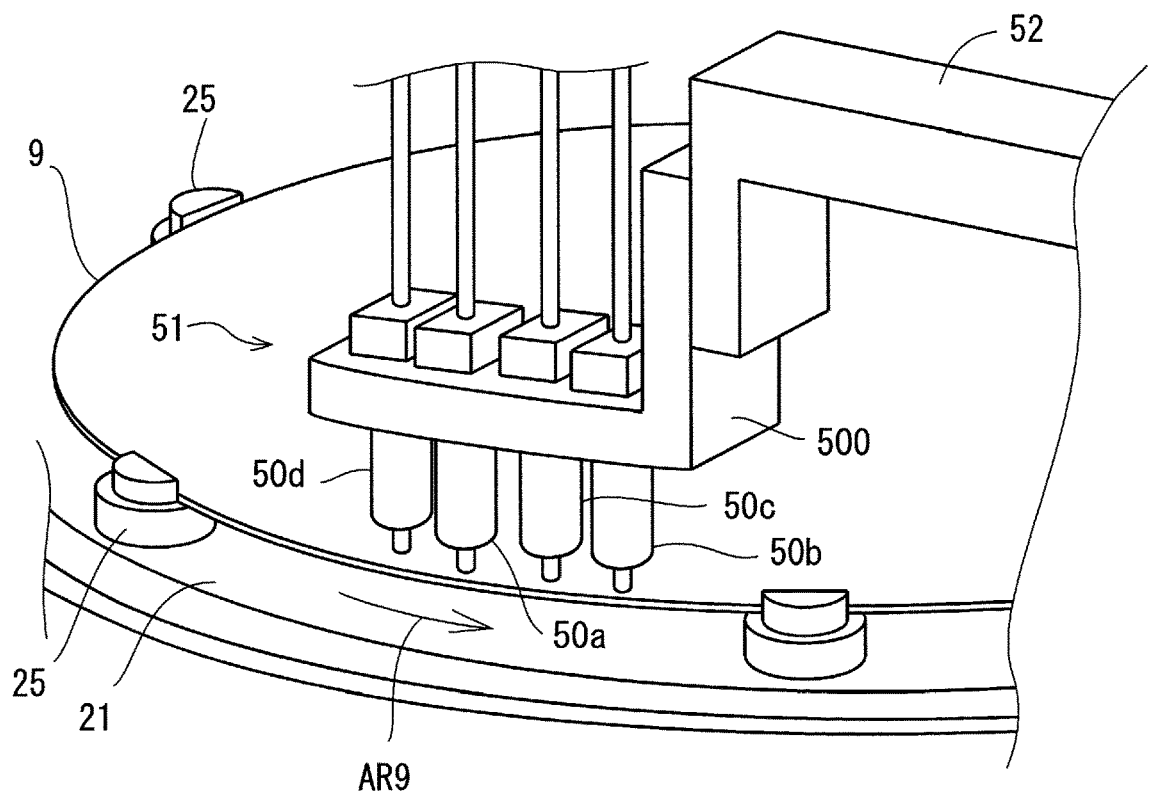
FIG. 6 is a perspective view of a discharge head for peripheral area.

The discharge head 51 is described in more detail by referring to FIG. 6. FIG. 6 is a perspective view of the discharge head 51. For the convenience of description, the guard member 60 and the cup 31 are omitted from FIG. 6.

The discharge head 51 includes the multiple (here, four) nozzles 50*a* to 50*d*, and a support part 500 that supports the nozzles 50*a* to 50*d* integrally.

The nozzles 50*a* to 50*d* in a group include one or more (here, three) nozzles (hereinafter also called "processing liquid nozzles") 50*a*, 50*b* and 50*c* from which processing liquids are discharged toward the front surface peripheral area 911, and the nozzle (hereinafter also called "gas nozzle") 50*d* from which gas (here, nitrogen gas) is discharged toward the front surface peripheral area 911. In particular, the processing liquid nozzles 50*a*, 50*b* and 50*c* of the discharge head 51 include two nozzles (hereinafter also called "chemical liquid nozzles") 50*a* and 50*b* from which chemical liquids are discharged, and the nozzle (hereinafter also called a "rinse liquid nozzle") 50*c* from which a rinse liquid is discharged. More particularly, the chemical liquid nozzles 50*a* and 50*b* of the discharge head 51 include the nozzle (hereinafter also called a "first chemical liquid nozzle") 50*a* from which an acidic chemical liquid is discharged, and the nozzle (hereinafter also called a "second chemical liquid nozzle") 50*b* from which an alkaline chemical liquid is discharged.

The support part 500 that supports the nozzles 50*a* to 50*d* in a group integrally is fixed to the aforementioned arm 52. The support part 500 is a member curving in a arcuate pattern extending along the front surface peripheral area 911 as viewed from above. The nozzles 50*a* to 50*d* in a group are arranged in a direction where the support part 500 curving in an arcuate pattern extends. Accordingly, while the discharge head 51 is placed in the processing position, the nozzles 50*a* to 50*d* in a group are aligned along the front surface peripheral area 911 of the substrate 9. The gas nozzle 50*d*, the first chemical liquid nozzle 50*a*, the rinse liquid nozzle 50*c*, and the second chemical liquid nozzle 50*b* are arranged in a rotative direction AR9 of the substrate 9 in the order named as viewed from an upstream side of the rotative direction AR9.

Specifically, in the discharge head 51, the gas nozzle 50*d* is placed upstream of the rotative direction AR9 of the substrate 9 relative to the processing liquid nozzles 50*a*, 50*b* and 50*c*. Thus, in the substrate 9 to be rotated, each position within the front surface peripheral area 911 of the substrate 9 first passes through a place below the gas nozzle 50*d* and then passes through places below the processing liquid nozzles 50*a*, 50*b* and 50*c*. In this structure, before being supplied with a new processing liquid from the processing liquid nozzle 50*a*, 50*b* or 50*c*, each position within the front surface peripheral area 911 of the rotated substrate 9 can be supplied with gas from the gas nozzle 50*d* (specifically, gas can be sprayed onto this position).

According to a surface condition of the substrate 9, for example, a processing liquid having been supplied from the processing liquid nozzle 50*a*, 50*b* or 50*c* before one rotation of the substrate 9 and not having been shaken off during this rotation may adhere to each position within the front surface peripheral area 911 having reached a place below the discharge head 51. In this case, such an old processing liquid can be removed with gas discharged from the gas nozzle 50*d* and then new processing liquids can be supplied from the processing liquid nozzles 50*a*, 50*b* and 50*c*. This structure makes the occurrence of a situation unlikely where a processing liquid newly supplied to each position within the front surface peripheral area 911 collides with an old processing liquid to bounce. This suppresses entry of a processing liquid into the device region 90. Further, this structure allows the substrate 9 to be always acted on by a fresh processing liquid, thereby enhancing processing efficiency. It is assumed that a new processing liquid is supplied further to a place where an old chemical liquid remains unremoved. In this case, the processing liquid might temporarily remain in large amount in this place. In contrast, the structure of removing an old chemical liquid with gas and then supplying a new processing liquid makes the occurrence of a situation unlikely where a processing liquid temporarily remains in large amount in each position within the front surface peripheral area 911. This can stabilize the dimension of a region to be acted on by a processing liquid. As an example, this can stabilize the dimension of a region to be acted on by a chemical liquid for etching, specifically a width between the end face 93 and a place inside the substrate 9 to be removed by etching (hereinafter simply called an "etching width"), so that the etching width can be controlled with a higher degree of accuracy.

From a different viewpoint, in the discharge head 51, the processing liquid nozzles 50*a*, 50*b* and 50*c* are placed downstream of the rotative direction AR9 of the substrate 9 relative to the gas nozzle 50*d*. Thus, in the substrate 9 to be rotated, each position within the front surface peripheral area 911 of the substrate 9 passes through places below the processing liquid nozzles 50*a*, 50*b* and 50*c* and then reaches a place below the gas nozzle 50*d* after the substrate 9 is rotated substantially one turn. This structure makes at least some of the processing liquids supplied from the processing liquid nozzles 50*a*, 50*b* and 50*c* to each position within the front surface peripheral area 911 stay on the front surface peripheral area 911 while the substrate 9 is rotated substantially one turn. Thus, each position within the front surface peripheral area 911 can be acted on satisfactorily by a processing liquid.

In the discharge head 51, the rinse liquid nozzle 50*c* from which a rinse liquid is discharged is placed between the first chemical liquid nozzle 50*a* from which an acidic chemical liquid is discharged and the second chemical liquid nozzle 50*b* from which an alkaline chemical liquid is discharged. This structure can suppress the occurrence of a situation where an atmosphere generated during discharge of a chemical liquid from one of the chemical liquid nozzles reacts with a chemical liquid remaining inside of the other chemical liquid nozzle, for example. As a more specific example, this structure can suppress the occurrence of a situation where an atmosphere generated during discharge of an acidic chemical liquid from the first chemical liquid nozzle 50*a* reacts with an alkaline chemical liquid remaining inside of the second chemical liquid nozzle 50*b*, or an atmosphere generated during discharge of an alkaline chemical liquid from the second chemical liquid nozzle 50*b* reacts with an acidic chemical liquid remaining inside of the first chemical liquid nozzle 50*a*.

<iii. Nozzle 50>

Figure 7:
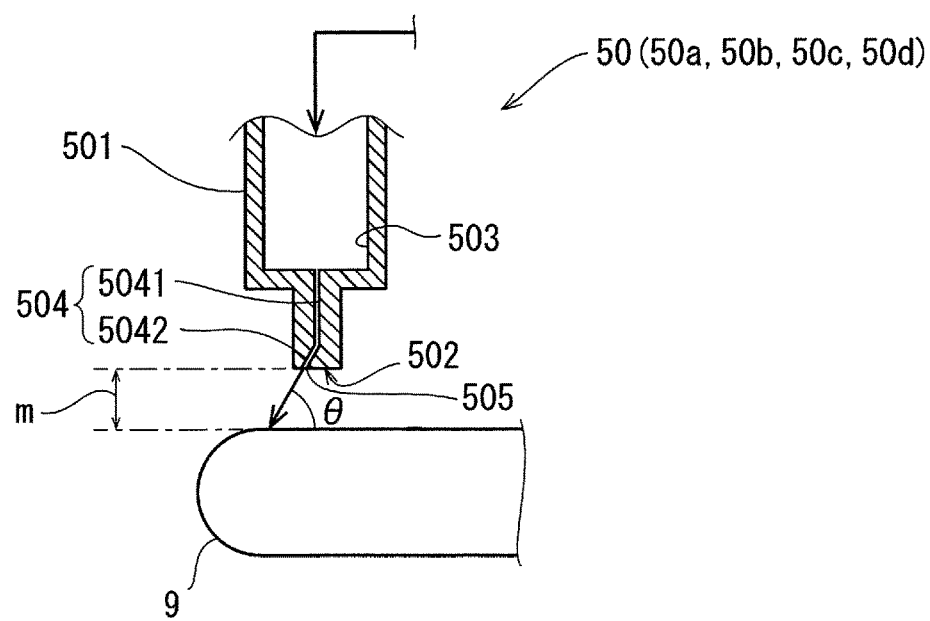
FIG. 7 is a side sectional view schematically showing the structure of the tip and its vicinity of a nozzle.

The following describes the structure of each of the nozzles 50*a* to 50*d* in a group of the discharge head 51 by referring to FIG. 7. The nozzles 50*a* to 50*d* in a group have substantially the same structure. In the below, where the nozzles 50*a* to 50*d* are not to be distinguished from each other, they may also be called a "nozzle 50" simply. FIG. 7 is a side sectional view schematically showing the structure of the tip and its vicinity of the nozzle 50.

The nozzle 50 includes a nozzle body 501 having an outer shape of an elongated bar with a narrowed lower end. The nozzle body 501 has an axis direction extending in the vertical direction. The nozzle body 501 is supported by the support part 500 such that a lower surface (hereinafter also called a "discharge surface") 502 of the nozzle body 501 is placed in a horizontal posture. Thus, while the discharge head 51 is in the processing position, the discharge surface 502 in a posture parallel to the front surface 91 of the substrate 9 held on the spin base 21 is placed to be close to the front surface peripheral area 911 in a noncontact manner. A distance m determined in this condition between the discharge surface 502 and the front surface peripheral area 911 is sufficiently small (distance m is about 1 mm, for example).

An introduction flow path 503 and a discharge flow path 504 communicating with the lower end of the introduction flow path 503 are formed inside the nozzle body 501. The upper end of the introduction flow path 503 is connected to one of the aforementioned pipes 552*a*, 552*b*, 552*c* and 552*d*. The lower end of the discharge flow path 504 communicates with an open discharge port 505 formed in the discharge surface 502. As an example, the discharge port 505 is a circular through hole having a diameter for example of 0.6 mm that is smaller than the minute width d extending from the end face 93 of the substrate 9 shown in FIG. 2. Thus, a fluid supplied from a pipe is first held in the introduction flow path 503. Then, the fluid flows into the discharge flow path 504 to be discharged from the discharge port 505.

The discharge flow path 504 is bent in the middle. More specifically, the discharge flow path 504 has a vertical flow path section 5041 and a tilted flow path section 5042 extending continuously from the vertical flow path section 5041. The vertical flow path section 5041 extends parallel to the axis direction of the nozzle body 501 to communicate with the tilted flow path section 5042 at a lower end of the vertical flow path section 5041. The tilted flow path section 5042 extends obliquely downward such that the it gets farther in a lower position from an inner side of the substrate 9 (on the part of the center of the substrate 9) toward an outer side of the substrate 9 (on the part of the end face 93) to communicate with the discharge port 505 at a lower end of the tilted flow path section 5042.

In the nozzle 50, a fluid passes through the obliquely extending tilted flow path section 5042 and is then discharged from the discharge port 505. Thus, a fluid discharged from the nozzle 50 toward the front surface peripheral area 911 of the substrate 9 can be caused to flow toward the outside of the substrate 9 in the front surface peripheral area 911. This can suppress flow of a processing liquid into the device region 90 having been discharged from the nozzle 50 toward the front surface peripheral area 911, for example. This can also stabilize the dimension of a region to be acted on by this processing liquid (as an example, stabilize the dimension of a region to be acted on by a chemical liquid for etching, specifically an etching width), so that this dimension can be controlled with a higher degree of accuracy. Further, while gas is discharged from the nozzle 50 toward the front surface peripheral area 911, a gas flow traveling toward an outer side of the substrate 9 can be formed in the front surface peripheral area 911, for example. This gas flow can blow away a processing liquid or mist of the processing liquid on the front surface peripheral area 911 to the outer side of the substrate 9.

In particular, in the nozzle 50, the nozzle body 501 itself is not in a tilted posture while supported by the support part 500 but the tilted flow path section 5042 forming part of the discharge flow path 504 inside the nozzle body 501 is tilted. It is assumed that a flow path extending straight along the axis direction of a nozzle body is formed inside the nozzle body and the nozzle body itself is in a tilted posture to tilt a discharge surface relative to a horizontal plane. This might easily generate an accumulation of liquid near the lowest end of the discharge surface and this accumulation might drop onto the substrate 9 (dripping). Such dripping of a processing liquid is caused in a position on an inner side (on the part of the center of the substrate 9) relative to a position where the processing liquid is to be supplied originally, so that this processing liquid is hard to remove even with gas discharged from the gas nozzle 50d. In contrast, in this preferred embodiment, not the nozzle body 501 but part of the discharge flow path 504 formed inside the nozzle body 501 is tilted. This structure can place the discharge surface 502 in a horizontal posture, making the aforementioned dripping of a processing liquid unlikely.

To control the width of a region to be acted on by a processing liquid (such as an etching width to be acted on by a chemical liquid for etching) with a higher degree of accuracy, it is preferable that an angle (angle of tilt) θ formed between a direction where the tilted flow path section 5042 extends and a horizontal plane be 45 degrees or more, more preferably, 60 degrees or more.

<iv. Target Discharge Position>

Figure 8:
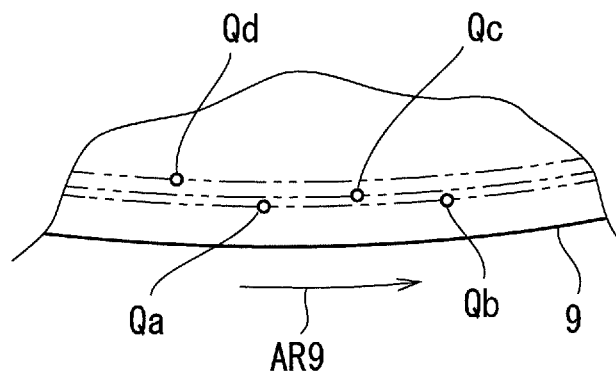
FIG. 8 schematically shows examples of target discharge positions of nozzles in a group of the discharge head for peripheral area.
Figure 9:
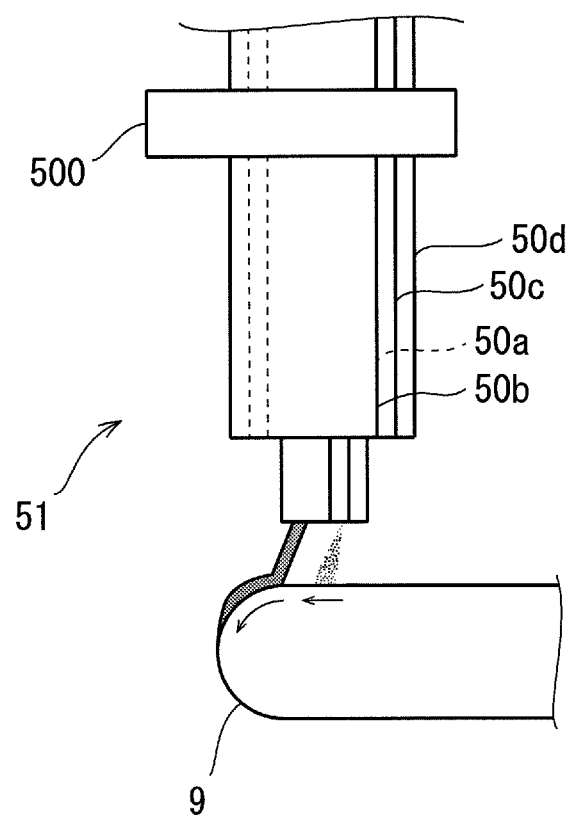
FIGS. 9 and 10 each show the discharge head for peripheral area as viewed from a downstream side of a rotative direction of a substrate.
Figure 10:
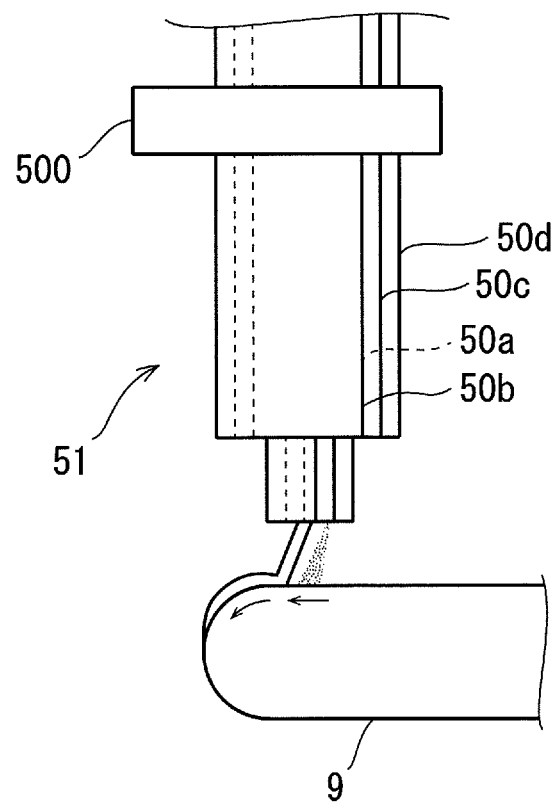

A position on the substrate 9 where a fluid discharged from each of the nozzles 50a to 50d in a group of the discharge head 51 is to reach is called a "target discharge position" of this nozzle. The following describes target discharge positions Qa to Qd of the nozzles 50a to 50d in a group respectively by referring to FIGS. 8 to 10. FIG. 8 schematically shows examples of target discharge positions of the nozzles 50a to 50d. FIGS. 9 and 10 show the discharge head 51 as viewed from a downstream side of the rotative direction AR9 of the substrate 9. FIG. 9 shows a condition where a chemical liquid and gas are discharged from the discharge head 51. FIG. 10 show a condition where a rinse liquid and gas are discharged from the discharge head 51.

The respective target discharge positions Qa to Qd of the nozzles 50a to 50d in a group of the discharge head 51 are shifted from each other in the radial direction of the substrate 9. Specifically, the target discharge position Qd of the gas nozzle 50d is on an inner side of the radial direction of the substrate 9 (on the part of the center) relative to the respective target discharge positions Qa, Qb and Qc of the processing liquid nozzles 50a, 50b and 50c. The target discharge position Qc of the rinse liquid nozzle 50c is on an inner side of the radial direction of the substrate 9 relative to the respective target discharge positions Qa and Qb of the chemical liquid nozzles 50a and 50b. The target discharge position Qa of the first chemical liquid nozzle 50a and the target discharge position Qb of the second chemical liquid nozzle 50b are the same in the radial direction. "Positions being the same in the radial direction" means positions spaced by the same distance from the end face 93 of the substrate 9 (specifically, positions spaced by the same distance from the center of the substrate 9). Here, the target discharge position Qa of the first chemical liquid nozzle 50a and the target discharge position Qb of the second chemical liquid nozzle 50b are spaced by the same distance from the end face 93 of the substrate 9.

By way of example, the target discharge position Qa of the first chemical liquid nozzle 50a and the target discharge position Qb of the second chemical liquid nozzle 50b are both separated inward from the end face 93 of the substrate 9 by 1.0 mm. The target discharge position Qd of the gas nozzle 50d is spaced inward in the substrate 9 from the respective target discharge positions Qa and Qb of the chemical liquid nozzles 50b and 50b by 0.5 mm. The target discharge position Qc of the rinse liquid nozzle 50c is separated from the end face 93 of the substrate 9 by a distance of from 1.0 to 0.5 mm.

All the nozzles 50a to 50d are supported by the support part 500 while being placed in their positions shifted from each other in the radial direction of the substrate 9 such that fluids discharged from the nozzles 50a to 50d can reach their respective target discharge positions Qa, Qb, Qc and Qd. Specifically, the gas nozzle 50d is supported by the support part 500 while being placed on an inner side of the radial direction of the substrate 9 relative to the processing liquid nozzles 50a, 50b and 50c. The rinse liquid nozzle 50c is supported by the support part 500 while being placed on an inner side of the radial direction of the substrate 9 relative to the chemical liquid nozzles 50a and 50b. The first and second chemical liquid nozzles 50a and 50b are supported by the support part 500 while being placed in the same position in the radial direction. The nozzles 50a to 50d are placed in their positions shifted from each other by an amount that is determined based on the aforementioned angle of the tilted flow path section 5042 in a manner that allows fluids to reach the corresponding target discharge positions Qa, Qb, Qc and Qd.

In the discharge head 51, the target discharge position Qd of the gas nozzle 50d is on an inner side of the radial direction of the substrate 9 relative to the respective target discharge positions Qa, Qb and Qc of the processing liquid nozzles 50a, 50b and 50c. Accordingly, in the front surface peripheral area 911 of the substrate 9, gas is supplied to a position inside a position where a processing liquid is discharged. In this structure, a processing liquid supplied to the front surface peripheral area 911 can be blown away from an inner side toward an outer side of the substrate 9 with gas. This can suppress entry of the processing liquid on the front surface peripheral area 911 into the device region 90. This can further stabilize the dimension of a region to be acted on by the processing liquid (such as the dimension of a region to be acted on by a chemical liquid for etching, specifically an etching width), so that this dimension can be controlled with a higher degree of accuracy.

In the discharge head 51, the target discharge position Qc of the rinse liquid nozzle 50c is on an inner side of the radial direction of the substrate 9 relative to the respective target discharge positions Qa and Qb of the chemical liquid nozzles 50a and 50b respectively. Accordingly, in the front surface peripheral area 911 of the substrate 9, a rinse liquid is supplied to a position closer to the inside than a position where a chemical liquid is discharged. In this structure, the chemical liquid supplied to the front surface peripheral area 911 can be washed away from an inner side toward an outer side of the substrate 9 with the rinse liquid. This can sufficiently suppress entry of the chemical liquid into the device region 90 and at the same time, can wash out the chemical liquid satisfactorily without generating a residue of the chemical liquid.

In the discharge head 51, the respective target discharge positions Qa and Qb of the first and second chemical liquid nozzles 50a and 50b are the same in the radial direction of the substrate 9. Accordingly, in the front surface peripheral area 911 of the substrate 9, an alkaline chemical liquid can be discharged to a position where an acidic chemical liquid is discharged. This structure allows both of the chemical liquids to act on the same region accurately.

<Liquid Bounce Suppressing Unit 6>

By referring back to FIGS. 3 to 5, in the substrate processing apparatus 1, while a processing liquid is discharged from the discharge head 51 toward the front surface peripheral area 911 of the substrate 9 held on the spin base 21, part of the processing liquid supplied onto the front surface peripheral area 911 may be splashed from the substrate 9 and part of the splashed processing liquid may adhere to the substrate 9 again after bouncing off a member placed outside, for example. The liquid bounce suppressing unit 6 is a member intended to suppress re-adhesion of a processing liquid to the substrate 9 after the processing liquid is splashed from the substrate 9.

<i. Guard Member 60>

Figure 11:
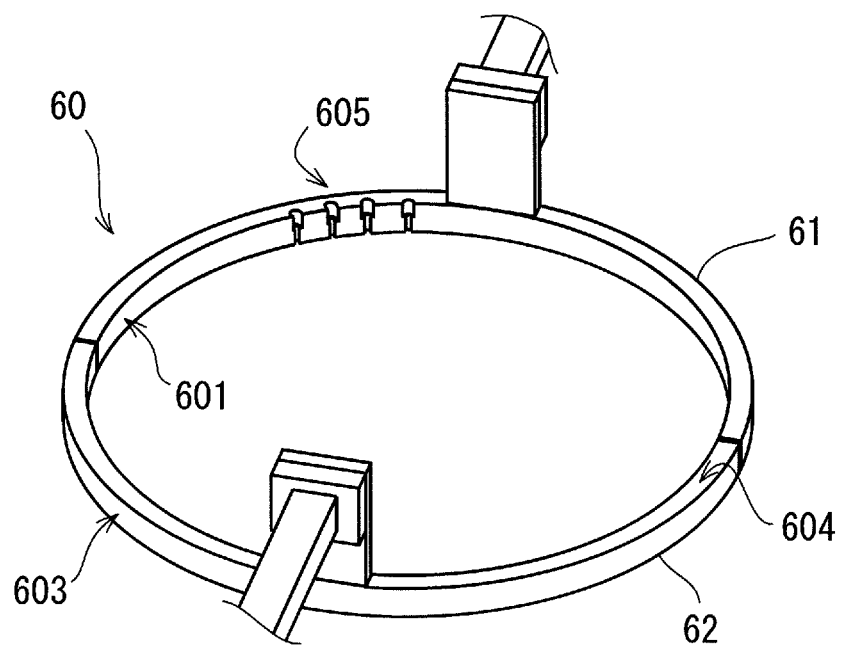
FIG. 11 is a perspective view of a guard member.
Figure 12:
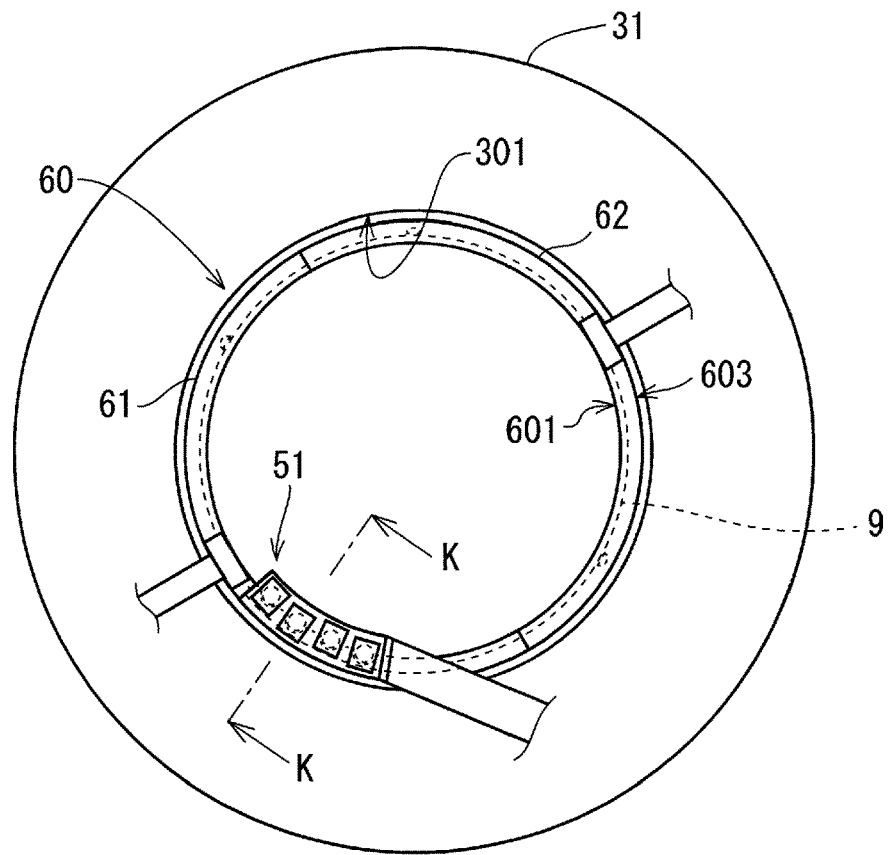
FIG. 12 is a plan view taken from above showing a condition where a cup, the guard member, and the discharge head for peripheral area are placed in their respective processing positions.
Figure 13:
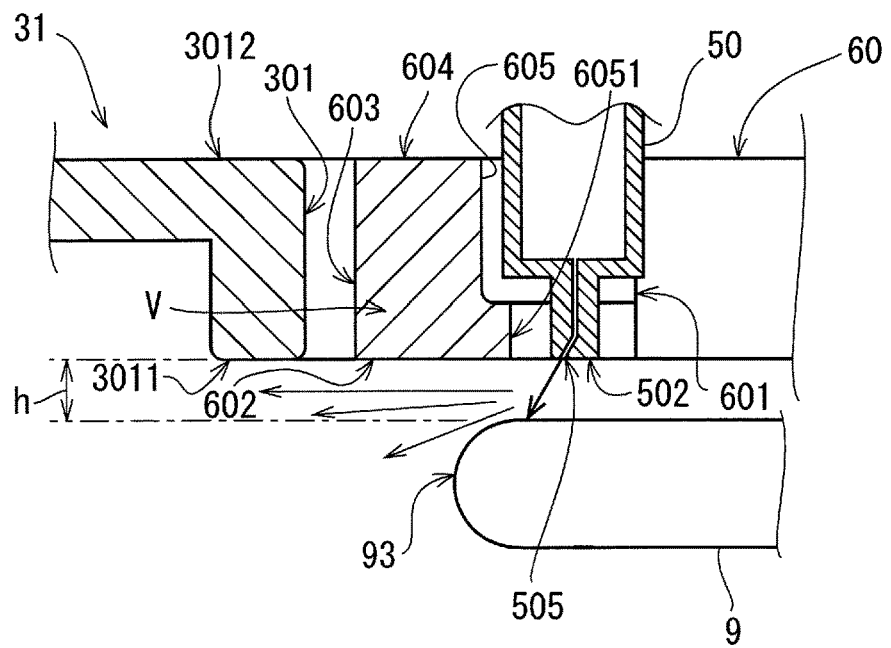
FIG. 13 is a side sectional view taken in a direction indicated by arrows K of FIG. 12.

The liquid bounce suppressing unit 6 includes the guard member 60. The guard member 60 is described in detail by referring to FIGS. 11 to 13 as well as FIGS. 3 to 5. FIG. 11 is a perspective view of the guard member 60. FIG. 12 is a plan view taken from above showing a condition where the cup 31, the guard member 60, and the discharge head 51 are placed in their respective processing positions. FIG. 13 is a side sectional view taken in a direction indicated by arrows K of FIG. 12.

The guard member 60 is a ring-shaped member extending along the entire circumference of the front surface peripheral area 911 of the substrate 9. While the substrate 9 held on the spin base 21 is being processed, the guard member 60 as viewed from above is placed concentrically with the substrate 9 and in a position (processing position) close to the front surface peripheral area 911 of the substrate 9 in a noncontact manner. It is preferable that a cross section of the guard member 60 taken in a direction perpendicular to the circumferential direction of the guard member 60 be rectangular and more preferably, square.

The guard member 60 has an inner diameter slightly smaller than the outer diameter of the substrate 9. Accordingly, if the guard member 60 in the processing position is viewed from above, the inner circumferential wall 601 of the guard member 60 is on an inner side (on the part of the center of the substrate 9) relative to the end face 93 of the substrate 9. At least an inner circumferential portion of a lower surface 602 of the guard member 60 is placed to face the front surface peripheral area 911 of the substrate 9 held on the spin base 21. Specifically, the inner circumferential wall 601 of the guard member 60 is on an inner side (on the part of the center of the substrate 9) relative to the end face 93 of the substrate 9 and the lower surface 602 of the guard member 60 partially faces the front surface peripheral area 911 of the substrate 9 while being in a position close to the front surface peripheral area 911. A distance h determined in this condition between the lower surface 602 of the guard member 60 and the front surface 91 of the substrate 9 held on the spin base 21 is in a range of from 1 to 1.5 mm, for example.

The guard member 60 has an outer diameter larger than the outer diameter of the substrate 9 and slightly smaller than the inner diameter of the top edge portion 301 of the cup 31. Accordingly, if the guard member 60 in the processing position is viewed from above, an outer circumferential wall 603 of the guard member 60 is outside the end face 93 of the substrate 9 and extends along the entire circumference of the top edge portion 301 of the cup 31 while placed in a position close to the top edge portion 301 in a noncontact manner. Specifically, the cup 31 placed in the processing position surrounds the substrate 9 on the spin base 21 and the guard member 60 together.

The aforementioned discharge head 51 in the processing position is placed on the same side as the inner circumferential wall 601 of the guard member 60 (specifically, on a side opposite the cup 31 with respect to the guard member 60). In this condition, the nozzle 50 of the discharge head 51 is placed on a side opposite the cup 31 with respect to the guard member 60. The inner circumferential wall 601 of the guard member 60 is given the cut 605 where at least part of the discharge head 51 is housed. While the discharge head 51 is in the processing position, at least part of the discharge head 51 (more specifically, at least part of the nozzle 50 of the discharge head 51, for example) is housed in the cut 605. Thus, the discharge head 51 is placed in the processing position above the front surface peripheral area 911 without interfering with the guard member 60. It is preferable that a wall surface part 6051 of the cut 605 extending continuously from the lower surface 602 be flush with the end face 93 of the substrate 9 or on an inner side (on the part of the center of the substrate 9) relative to the end face 93 as viewed from above.

While the guard member 60, the discharge head 51, and the cup 31 are placed in their respective processing positions, it is preferable that the lower surface 602 of the guard member 60 be in the same height as the discharge surface 502 of the nozzle 50 of the discharge head 51 or below the discharge surface 502. The wall surface part 6051 can be in the lowest possible position that does not interfere with a path for a fluid to be discharged from the nozzle 50. It is preferable that the lower surface 602 of the guard member 60 be in the same height as a lower surface 3011 of the top edge portion 301 of the cup 31 or below the lower surface 3011. In this preferred embodiment, the lower surface 602 of the guard member 60, the discharge surface 502 of the discharge head 51, and the lower surface 3011 of the top edge portion 301 of the cup 31 are placed in the same height. Specifically, the three surfaces 602, 502 and 3011 are placed in the same horizontal plane.

While the guard member 60 and the cup 31 are placed in their respective processing positions, it is preferable that an upper surface 604 of the guard member 60 be in the same height as an upper surface 3012 of the top edge portion 301 of the cup 31.

<ii. Reason why Re-Adhesion of Processing Liquid is Suppressed>

While a processing liquid is discharged from the discharge head 51 toward the front surface peripheral area 911, placement of the guard member 60 in the processing position can suppress re-adhesion of the processing liquid to the substrate 9 after the processing liquid is splashed from the substrate 9. The following describes the reason for this suppression.

The top edge portion 301 of the cup 31 has an inner diameter larger than the outer diameter of the spin base 21 such that the cup 31 can move to the retreat position below the upper surface of the spin base 21. The outer diameter of the spin base 21 is larger than the outer diameter of the substrate 9, so that ring-shaped clearance space is formed between the end face 93 of the substrate 9 held on the spin base 21 and the top edge portion 301 of the cup 31 as viewed from above. Thus, clearance space V is further formed between the discharge head 51 placed in the processing position facing the front surface peripheral area 911 of the substrate 9 and the top edge portion 301 of the cup 31. The clearance space V might be space to permit floating of mist of a processing liquid splashed from the substrate 9, for example. However, the clearance space V is filled at least partially with part of the guard member 60. This structure reduces space that might permit floating for example of mist of a processing liquid splashed from the substrate 9 by space filled with the guard member 60. This reduction of the space reduces the amount of floating of the processing liquid near the substrate 9. This reduces the probability of re-adhesion for example of mist of the processing liquid to the substrate 9. Specifically, this can suppress re-adhesion of part of the processing liquid to the substrate 9 after the processing liquid is splashed from the substrate 9.

In particular, at least part of the lower surface 602 of the guard member 60 is placed to face the front surface peripheral area 911. Thus, a processing liquid splashed from the substrate 9 is guided along the lower surface 602 of the guard member 60 into the cup 31. This can sufficiently suppress re-adhesion of the splashed processing liquid on the substrate 9.

In particular, the lower surface 602 of the guard member 60 is placed in the same height as the discharge surface 502 of the nozzle 50 of the discharge head 51 or below the discharge surface 502. The present inventors confirmed that this particularly effectively acts to suppress re-adhesion of a processing liquid to the substrate 9 (particularly, device region 90) after the processing liquid is splashed from the substrate 9.

The present inventors also confirmed that placing the lower surface 602 of the guard member 60 in the same height as the lower surface 3011 of the top edge portion 301 of the cup 31 or below the lower surface 3011 also particularly effectively acts to suppress re-adhesion of a processing liquid to the substrate 9 (particularly, device region 90) after the processing liquid is splashed from the substrate 9.

The guard member 60 is a ring-shaped member extending along the entire circumference of the front surface peripheral area 911 of the substrate 9. This can suppress re-adhesion of a processing liquid to the substrate 9 throughout the circumferential direction of the substrate 9 after the processing liquid is splashed from the substrate 9.

<iii. Semicircular Members 61 and 62>

The guard member 60 is formed by making abutting contact between multiple arcuate members (here, semicircular members 61 and 62 in a pair) as separate members at respective end faces thereof in their circumferential directions. Specifically, the semicircular members 61 and 62 in a pair are semicircular members of the same diameter.

The semicircular members 61 and 62 are placed such that their chord directions are pointed inward and their end faces in their circumferential directions face each other. The guard member 60 may be formed by making abutting contact between three or more arcuate members at respective end faces thereof in their circumferential directions.

Each of the semicircular members 61 and 62 in a pair is provided with a semicircular member drive unit 63 to drive each of the semicircular members 61 and 62. The semicircular member drive unit 63 includes an up-and-down drive part 631 (such as a stepping motor) to move each of the semicircular members 61 and 62 connected to the semicircular member drive unit 63 up and down along a vertical axis, and an advance-and-retreat drive part 632 to move each of the semicircular members 61 and 62 connected to the semicircular member drive unit 63 in a horizontal plane in a direction where this semicircular member 61 or 62 gets closer to or farther from the other of the semicircular members 61 and 62.

While the substrate 9 is not held on the spin base 21, both the semicircular members 61 and 62 are placed in positions (retreat positions) outside a transport path for the substrate 9 while being spaced from each other. More specifically, the retreat position of each of the semicircular members 61 and 62 is below the upper surface of the spin base 21 (specifically, a position that places the upper surface 604 of each of the semicircular members 61 and 62 below the upper surface of the spin base 21) and outside the top edge portion 301 of the cup 31 as viewed from above (position shown in FIG. 3).

When the substrate 9 is held on the spin base 21, the up-and-down drive part 631 moves each of the semicircular members 61 and 62 in the retreat position to a position slightly above the upper surface of the spin base 21. Then, the advance-and-retreat drive part 632 moves each of the semicircular members 61 and 62 in a horizontal plane in a direction where this semicircular member 61 or 62 gets closer to the other of the semicircular members 61 and 62, thereby making abutting contact between the semicircular members 61 and 62 at the respective end faces thereof in their circumferential directions. As a result, the ring-shaped guard member 60 is placed in the processing position.

<iv. Cleaning Process>

As described above, while the substrate 9 is not held on the spin base 21, the semicircular members 61 and 62 and the cup 31 are placed in their retreat positions. As described above, while the semicircular members 61 and 62 and the cup 31 are placed in their retreat positions, they are all placed below the upper surface of the spin base 21 and the semicircular members 61 and 62 are placed in positions above the cup 31 and close to the upper surface of the cup 31 in a noncontact manner.

In the substrate processing apparatus 1, while the substrate 9 is not held on the spin base 21, the spin base 21 is cleaned regularly (each time substrates 9 of a given number are processed, for example) or irregularly (in response to an order from an operator, for example).

During the cleaning process on the spin base 21, the spin base 21 is rotated while a cleaning liquid is supplied from a cleaning nozzle (not shown in the drawings) onto the center and its vicinity of the upper surface of the spin base 21 on which the substrate 9 is not held. Then, the cleaning liquid is caused to spread throughout the upper surface of the spin base 21 by centrifugal force generated as a result of rotation of the spin base 21, thereby cleaning the upper surface of the spin base 21 entirely. This cleaning liquid is eventually blown off from a peripheral area of the spin base 21 to the outside of the spin base 21. While the spin base 21 is cleaned, the semicircular members 61 and 62 and the cup 31 are all placed in their retreat positions below the upper surface of the spin base 21. Thus, the cleaning liquid blown off from the peripheral area of the spin base 21 to the outside of the spin base 21 reaches the cup 31 and the semicircular members 61 and 62 above the cup 31. This cleans the cup 31 and the semicircular members 61 and 62. Specifically, during the cleaning process on the spin base 21, the cup 31 and the semicircular members 61 and 62 are cleaned together as well as the spin base 21.

<Heat Processing Unit 7>

By referring back to FIGS. 3 to 5, the heat processing unit 7 supplies steam (water vapor) and particularly preferably, superheated steam (superheated water vapor) to the back surface 92 of the substrate 9 held on the spin base 21 to heat the substrate 9.

The heat processing unit 7 includes a steam nozzle 71 from which steam is discharged toward the back surface 92 of the substrate 9 held on the spin base 21. The steam nozzle 71 is arranged on the spin base 21. The steam nozzle 71 has multiple steam discharge ports (not shown in the drawings) formed in the upper surface thereof. At least one of these steam discharge ports is formed in a position where steam is supplied selectively to the back surface peripheral area 921 of the substrate 9 held on the spin base 21. Preferably, this steam discharge port is formed in a position facing the back surface peripheral area 921. Steam of a larger amount can be discharged from this steam discharge port than steam discharged from the other steam discharge port. In this structure, steam from the steam nozzle 71 can be discharged intensively particularly onto the back surface peripheral area 921 of the back surface 92 of the substrate 9.

The steam nozzle 71 is connected to a steam supplier 72 that is a pipe system to supply steam to the steam nozzle 71. As an example, the specific structure of the steam supplier 72 includes a steam source 721 as a source for steam that is connected to the steam nozzle 71 through a pipe 722 in which an open-close valve 723 is interposed. In this structure, opening the open-close valve 723 discharges steam from the steam nozzle 71 supplied from the steam source 721.

It is preferable that steam to be discharged from the steam nozzle 71 be superheated steam (superheated water vapor) heated (superheated) to a sufficiently high temperature (such as one in a range of from 100° C. to 130° C., for example). This can be achieved for example by forming the steam source 721 by using a source to supply steam (water vapor) generated by heating pure water and the like, a pipe connected to the source, and a heater interposed in a path of the pipe (all of these parts are not shown in the drawings). In this case, in consideration of temperature drop of steam from the source to occur for example while the steam passes through the pipe, it is preferable that the heater heat (superheat) the steam supplied from the source to a temperature of from about 140° C. to about 160° C., for example. Even if the substrate 9 draws heat of part of steam (superheated steam) supplied to the substrate 9 to cool the steam so the steam condenses into droplets on the substrate 9, these droplets are blown off from the end face 93 of the substrate 9 to the outside of the substrate 9 by centrifugal force generated as a result of rotation of the substrate 9. This prevents attachment of the droplets to the device region 90.

When steam is supplied from the steam supplier 72 to the steam nozzle 71, the steam is discharged from the steam nozzle 71 toward the back surface 92 of the substrate 9 held on the spin base 21, thereby heating the substrate 9. As described above, in this preferred embodiment, steam from the steam nozzle 71 can be discharged intensively onto the back surface peripheral area 921. Thus, the back surface peripheral area 921 can be heated particularly intensively. The open-close valve 723 of the steam supplier 72 is electrically connected to the controller 130 and is opened and closed under control by the controller 130. Specifically, a mode of discharge of steam from the steam nozzle 71 (more specifically, timing of starting discharge, timing of finishing the discharge, and discharge flow rate, for example) is controlled by the controller 130.

<Back Surface Processing Unit 8>

The back surface processing unit 8 is to process the back surface 92 of the substrate 9 held on the spin base 21. More specifically, the back surface processing unit 8 is to supply a processing liquid to the back surface 92 of the substrate 9 held on the spin base 21.

The back surface processing unit 8 includes a supply pipe 81 placed to pass through a hollow portion of the rotary shaft part 22 of the spin chuck 2. The tip of the supply pipe 81 has an opening located at the upper surface of the spin base 21. This opening forms a back surface side discharge port 82.

The supply pipe 81 is connected to a processing liquid supplier 83 that is a pipe system to supply a processing liquid to the supply pipe 81. The processing liquid supplier 83 is more specifically formed by combining an SC-1 source 831*a*, a DHF source 831*b*, an SC-2 source 831*c*, a rinse liquid source 831*d*, multiple pipes 832*a*, 832*b*, 832*c* and 832*d*, and multiple open-close valves 833*a*, 833*b*, 833*c* and 833*d*.

The SC-1 source 831*a* is a source to supply SC-1. The SC-1 source 831*a* is connected to the supply pipe 81 through the pipe 832*a* in which the open-close valve 833*a* is interposed. Accordingly, opening the open-close valve 833*a* discharges SC-1 from the back surface side discharge port 82 supplied from the SC-1 source 831*a*.

The DHF source 831*b* is a source to supply DHF. The DHF source 831*b* is connected to the supply pipe 81 through the pipe 832*b* in which the open-close valve 833*b* is interposed. Accordingly, opening the open-close valve 833*b* discharges DHF from the back surface side discharge port 82 supplied from the DHF source 831*b*.

The SC-2 source 831*c* is a source to supply SC-2. The SC-2 source 831*c* is connected to the supply pipe 81 through the pipe 832*c* in which the open-close valve 833*c* is interposed. Accordingly, opening the open-close valve 833*c* discharges SC-2 from the back surface side discharge port 82 supplied from the SC-2 source 831*c*.

The rinse liquid source 831*d* is a source to supply a rinse liquid. The rinse liquid source 831*d* mentioned herein supplies for example pure water (carbonated water) as a rinse liquid containing dissolved carbon dioxide ($CO_2$). The rinse liquid source 831*d* is connected to the supply pipe 81 through the pipe 832*d* in which the open-close valve 833*d* is interposed. Accordingly, opening the open-close valve 833*d* discharges a rinse liquid from the back surface side discharge port 82 supplied from the rinse liquid source 831*d*. A rinse liquid to be used can be pure water, warm water, ozone water, magnetic water, regenerated water (hydrogen water), various organic solvents, ionized water, IPA (isopropyl alcohol) and functional water, for example.

If a processing liquid (SC-1, DHF, SC-2, or rinse liquid) is supplied from the processing liquid supplier 83 to the supply pipe 81, the processing liquid is discharged from the back surface side discharge port 82 toward the center and its vicinity of the back surface 92 of the substrate 9 held on the spin base 21. The open-close valves 833*a*, 833*b*, 833*c* and 833*d* of the processing liquid supplier 83 are each electrically connected to the controller 130 and are opened and closed under control by the controller 130. Specifically, a mode of discharge of a processing liquid from the back surface side discharge port 82 (more specifically, type of processing liquid to be discharged, timing of starting discharge, timing of finishing the discharge, and discharge flow rate, for example) is controlled by the controller 130.

<4. Operation of Substrate Processing Apparatus 1>

The following describes the operation of the substrate processing apparatus 1. The substrate processing apparatus 1 performs a series of processes described below under control by the controller 130. The processes described below are merely examples of processes that can be performed by the substrate processing apparatus 1.

Figure 14:
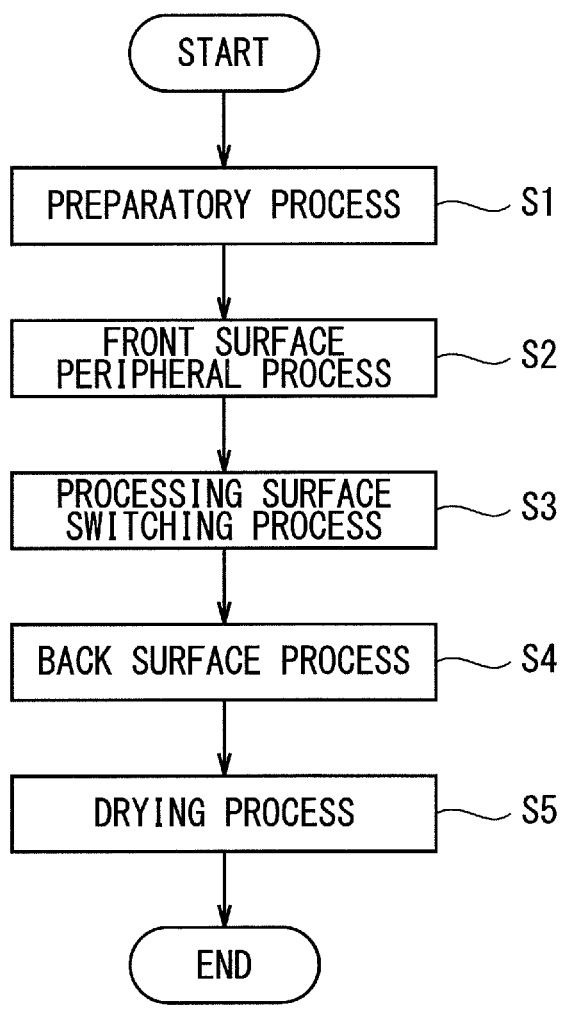
FIG. 14 shows an entire flow of operation performed in the substrate processing apparatus.

In the substrate processing apparatus 1, preparatory process (step S1), front surface peripheral process (step S2), processing surface switching process (step S3), back surface process (step S4), and drying process (step S5) are performed in the order named on one substrate 9, for example (FIG. 14). Each of the processes is described in detail below.

<4-1. Preparatory Process>

Figure 15:
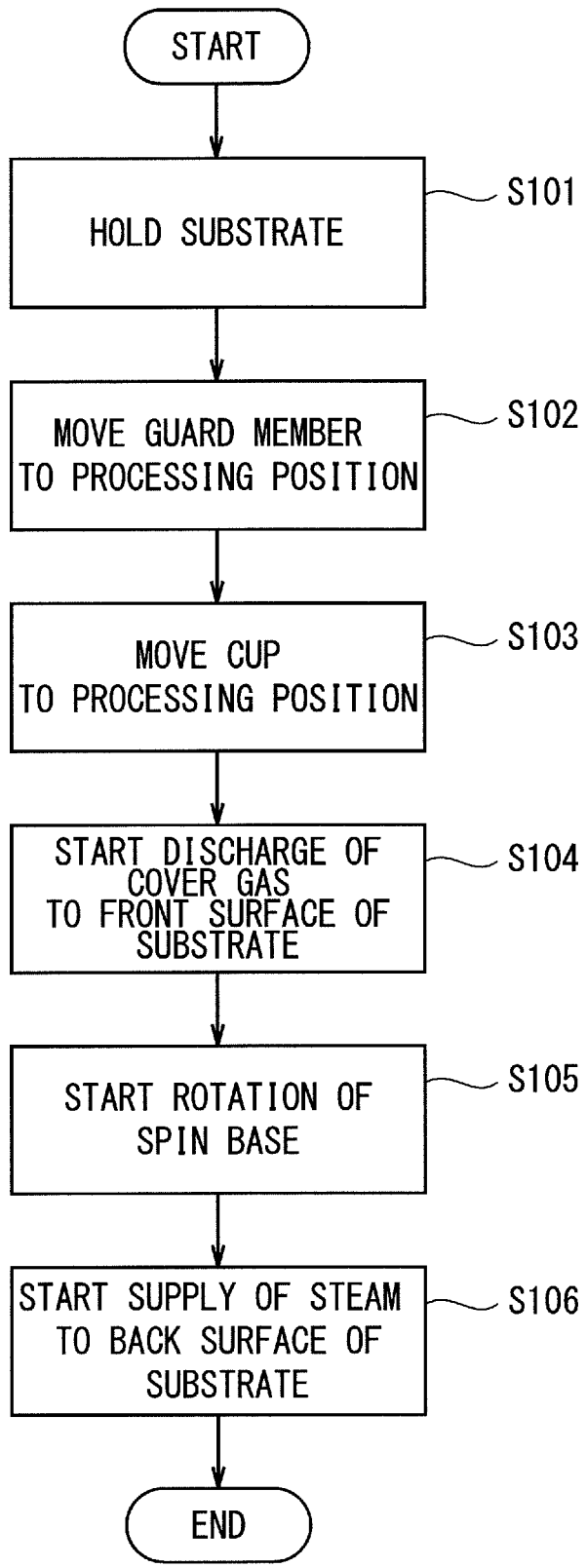
FIG. 15 shows a flow of preparatory process.
Figure 16:
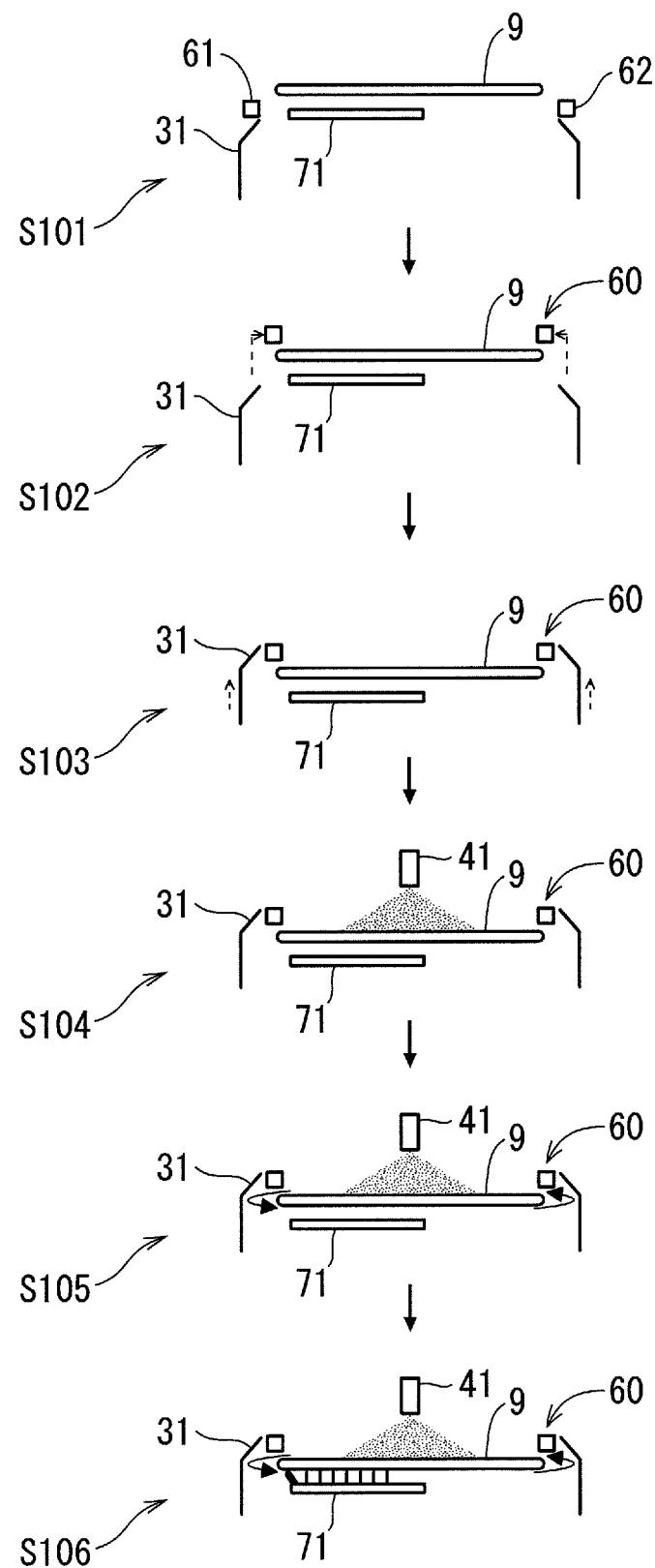
FIG. 16 explains the preparatory process.

The preparatory process (step S1) is described below by referring to FIGS. 15 and 16. FIG. 15 shows a flow of the preparatory process. FIG. 16 explains the preparatory process. In FIG. 16, some of the elements of the substrate processing apparatus 1 performing each step of the preparatory process are schematically shown.

While the semicircular members 61 and 62, the cup 31, the discharge head 51, and the cover gas nozzle 41 are placed in their respective retreat positions, the transport robot CR places the substrate 9 on the spin base 21 with the front surface 91 of the substrate 9 pointed upward. The substrate 9 placed on the spin base 21 is held by the group of the holding members 25 (step S101). This places the substrate 9 on the spin base 21 in a substantially horizontal posture.

After the substrate 9 is held on the spin base 21, the guard member 60 is moved to the processing position (step S102). More specifically, the up-and-down drive part 631 of the semicircular member drive unit 63 moves each of the semicircular members 61 and 62 in its retreat positions to a position slightly above the upper surface of the spin base 21. Then, the advance-and-retreat drive part 632 of the semicircular member drive unit 63 moves each of the semicircular members 61 and 62 in a horizontal plane in a direction where this semicircular member 61 or 62 gets closer to the other of the semicircular members 61 and 62, thereby making abutting contact between the semicircular members 61 and 62 at the respective end faces thereof in their circumferential directions. As a result, the ring-shaped guard member 60 is placed in the processing position. The guard member 60 in the processing position is kept standstill without being rotated after rotation of the spin base 21 is started.

When the guard member 60 is placed in the processing position, the cup 31 in the retreat position is then moved up to be placed in the processing position (step S103). This places the cup 31 such that the cup 31 surrounds the substrate 9 held on the spin base 21 and the guard member 60 together.

When the cup 31 is placed in the processing position, the cover gas nozzle 41 is then moved from the retreat position to the processing position. Then, discharge of cover gas is started from the cover gas nozzle 41 in the processing position toward the center and its vicinity of the front surface 91 of the substrate 9 (step S104). Supply of the cover gas to the center and its vicinity of the front surface 91 of the substrate 9 started in this step continues until process on this substrate 9 is finished. Continuously supplying the cover gas to the center and its vicinity of the front surface 91 of the substrate 9 prevents exposure of the device region 90 for example to an atmosphere of a processing liquid supplied to the front surface peripheral area 911 and the like while the substrate 9 is being processed. Specifically, the device region 90 continues to be protected from an atmosphere of a processing liquid supplied to the front surface peripheral area 911, for example.

Here, discharge of the cover gas from the cover gas nozzle 41 is started after the cup 31 is placed in the processing position. It is assumed that discharge of the cover gas from the cover gas nozzle 41 is started before the cup 31 is moved up to the processing position. In this case, a gas flow generated near the front surface peripheral area 911 of the substrate 9 is disturbed to roll up, so that particles or the like might adhere to the substrate 9. Such a situation can be prevented by the structure of starting discharge of the cover gas after the cup 31 is placed in the processing position.

Next, rotation of the spin base 21 is started. This starts rotation of the substrate 9 in a horizontal posture held on the spin base 21 (step S105). At this time, the frequency of rotation of the spin base 21 (specifically, the frequency of rotation of the substrate 9) is 600 rpm, for example. This frequency of rotation is determined appropriately such that a processing liquid supplied to the front surface peripheral area 911 will not go into the device region 90 or will not move toward the end face 93 (specifically, such that the processing liquid will be held stably in a region to be processed inside the front surface peripheral area 911) during the front surface peripheral process.

Next, steam is discharged from the steam nozzle 71 toward the back surface 92 of the rotated substrate 9 (pre-steaming) (step S106). After elapse of a certain time (such as five seconds) from start of discharge of the steam, discharge of the steam from the steam nozzle 71 is stopped. This pre-steaming heats the substrate 9. Most of the chemical liquids used for processing the substrate 9 react in an accelerated manner at a higher temperature. From this viewpoint, heating the substrate 9 in advance by this pre-steaming accelerates reaction between a chemical liquid and the substrate 9 during chemical liquid process. This shortens a time of the chemical liquid process and reduces the usage of a chemical liquid.

<4-2. Front Surface Peripheral Process>

Figure 17:
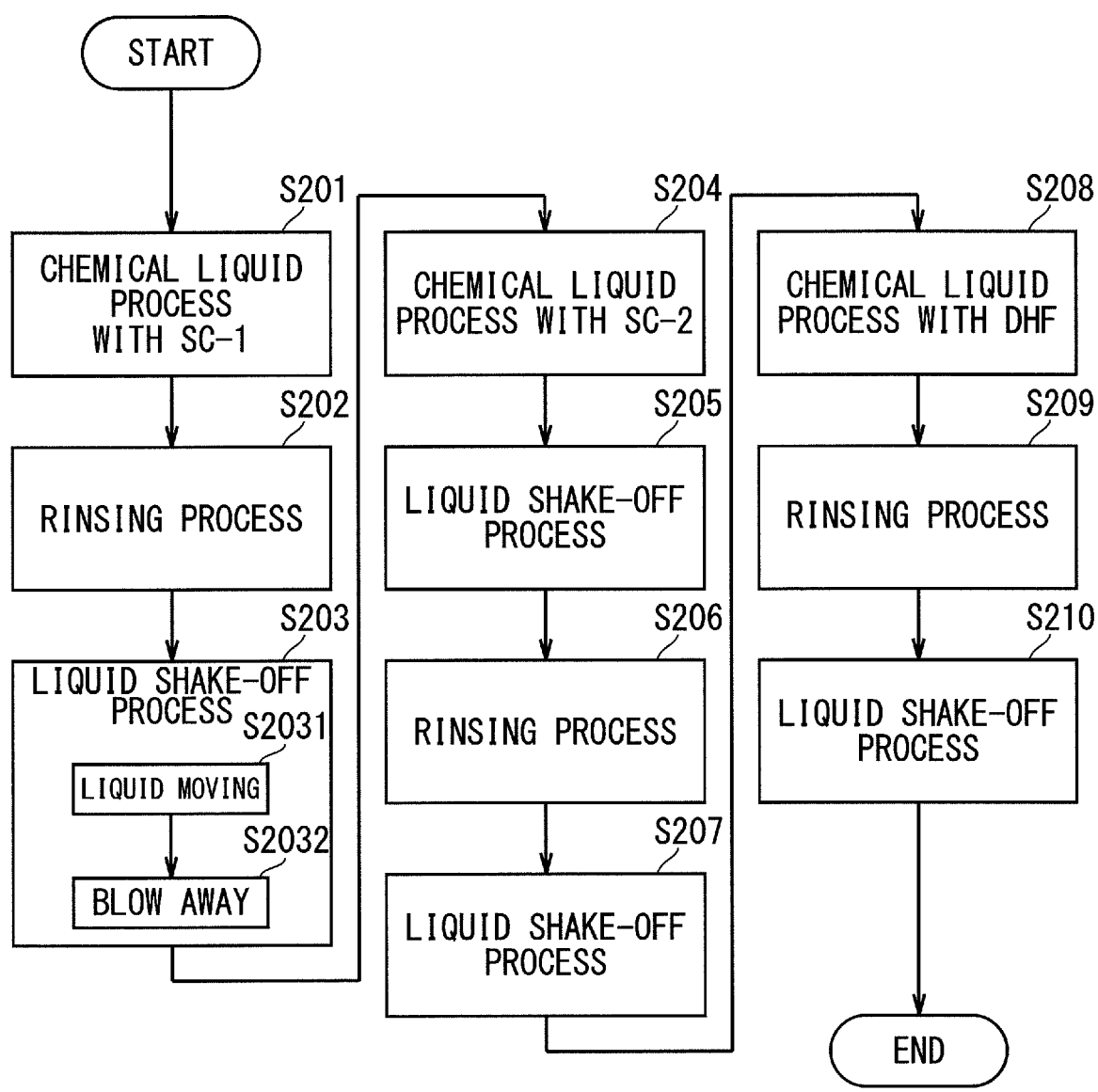
FIG. 17 shows a flow of front surface peripheral process.

When the preparatory process (step S1) is finished, the front surface peripheral process (step S2) is performed thereafter. The front surface peripheral process is described below by referring to FIGS. 17 and 18. FIG. 17 shows a flow of the front surface peripheral process. FIG. 18 explains the front surface peripheral process. In FIG. 18, some of the elements of the substrate processing apparatus 1 performing each step of the front surface peripheral process are schematically shown.

While the front surface peripheral process described below is being performed, the substrate 9 continues to be rotated at a given frequency (such as 600 rpm). As described above, supply of the cover gas from the cover gas nozzle 41 toward the center and its vicinity of the front surface 91 of the substrate 9 continues during the front surface peripheral process. This protects the device region 90 from an atmosphere of a processing liquid supplied to the front surface peripheral area 911, for example.

<Alkaline Process (SC-1)>
<i. Chemical Liquid Process>

First, the front surface peripheral area 911 of the substrate 9 is subjected to chemical liquid process with SC-1 (step S201). More specifically, the discharge head 51 is first moved from the retreat position to the processing position. Then, SC-1 is discharged from the second chemical liquid nozzle 50b of the discharge head 51 in the processing position toward the front surface peripheral area 911 of the rotated substrate 9. At this time, SC-1 is discharged at a rate of from 20 to 50 mL/min, for example. After elapse of a certain time (such as 20 seconds) from start of discharge of SC-1, discharge of SC-1 from the discharge head 51 is stopped.

This chemical liquid process removes a thin film formed on the front surface peripheral area 911 of the substrate 9 (etching process). During this chemical liquid process, steam is discharged from the steam nozzle 71 toward the back surface 92 of the substrate 9. During this process, the steam is discharged at a rate of from 500 to 2000 mL/min, for example. The temperature of the discharged steam is from 110° C. to 130° C., for example. For the reason that SC-1 reacts in an accelerated manner at a higher temperature, supplying the steam to the substrate 9 to heat the substrate 9 being subjected to the chemical liquid process with SC-1 accelerates reaction between the front surface peripheral area 911 of the substrate 9 and SC-1 (specifically, increases an etching rate), (what is called heat assist). This shortens a time of the chemical liquid process with SC-1 and reduces the usage of SC-1. In particular, intensively heating the back surface peripheral area 921 of the substrate 9 during this process can effectively accelerate reaction between the front surface peripheral area 911 and SC-1.

<ii. Rinsing Process>

Next, rinsing process is performed (step S202). More specifically, a rinse liquid is discharged from the rinse liquid nozzle 50c of the discharge head 51 in the processing position toward the front surface peripheral area 911 of the rotated substrate 9. After elapse of a certain time (such as five seconds) from start of discharge of the rinse liquid, discharge of the rinse liquid from the discharge head 51 is stopped. This rinsing process washes out the processing liquid (here, SC-1) adhering to the front surface peripheral area 911.

<iii. Liquid Shake-Off Process>

Next, liquid shake-off process is performed (step S203). The liquid shake-off process is performed to move a processing liquid remaining on the front surface peripheral area 911 (here, the rinse liquid remaining on the front surface peripheral area 911 for not having been shaken off from the substrate 9 in the rinsing process in step S202) toward the end face 93 of the substrate 9 and to shake off the remaining processing liquid from the end face 93 to the outside of the substrate 9. The processing liquid moved toward the end face 93 is held in a non-flat surface area including the end face 93 and its neighboring area. The processing liquid held in the non-flat surface area is unlikely to be separated, so that it is shaken off collectively to the outside of the substrate 9. Specifically, the processing liquid remaining on the front surface peripheral area 911 is moved toward the end face 93 of the substrate 9 and then shaken off to the outside of the substrate 9. This can remove much of the remaining processing liquid from the substrate 9 without causing substantially no residue of the liquid on the front surface peripheral area 911.

The following describes examples of the particulars of the liquid shake-off process. First, the substrate 9 is rotated for a given time (liquid moving step) (step S2031) while discharge of a fluid (processing liquid and gas) from the discharge head 51 toward the front surface peripheral area 911 is stopped. This moves the processing liquid remaining on the front surface peripheral area 911 in a direction toward the end face 93 of the substrate 9 in response to centrifugal force generated as a result of the rotation of the substrate 9, so that the processing liquid is held in the non-flat surface area including the end face 93 and its neighboring area. Next, gas is discharged from the gas nozzle 50d of the discharge head 51 in the processing position toward the front surface peripheral area 911 of the rotated substrate 9 (blow-away step) (step S2032). At this time, the gas is discharged at a rate of 14 L/min, for example. This shakes off the processing liquid held in the non-horizontal surface area collectively to the outside of the substrate 9 in response to the wind pressure of the gas and centrifugal force generated as a result of the rotation of the substrate 9. After elapse of a certain time (such as 15 seconds) from start of discharge of the gas from the discharge head 51, discharge of the gas from the discharge head 51 is stopped.

This liquid shake-off process shakes off much of the processing liquid remaining on the front surface peripheral area 911 (specifically, the rinse liquid remaining on the front surface peripheral area 911 for not having been shaken off from the substrate 9 in the rinsing process in step S202).

<First Acidic Process (SC-2)>
<i. Chemical Liquid Process>

Next, the front surface peripheral area 911 of the substrate 9 is subjected to chemical liquid process with SC-2 (step S204). More specifically, SC-2 is discharged from the first chemical liquid nozzle 50a of the discharge head 51 in the processing position toward the front surface peripheral area 911 of the rotated substrate 9. After elapse of a certain time (such as 20 seconds) from start of discharge of SC-2, discharge of SC-2 from the discharge head 51 is stopped.

This chemical liquid process removes a metallic composition (such as Mo or Co) and the like adhering to the front surface peripheral area 911 of the substrate 9 (cleaning process). This chemical liquid process is performed after the liquid shake-off process (step S203). Accordingly, SC-2 is discharged toward the front surface peripheral area 911 on which substantially no rinse liquid remains. It is assumed that this chemical liquid process is performed without the presence of the liquid shake-off process in step S203. In this case, SC-2 is discharged toward the front surface peripheral area 911 on which the rinse liquid remains. Hence, the discharged SC-2 might collide with the remaining rinse liquid to bounce into the device region 90. However, in this chemical liquid process, substantially no rinse liquid remains on the front surface peripheral area 911 as a result of the presence of the liquid shake-off process, making entry of a processing liquid into the device region 90 unlikely due to the aforementioned collision between processing liquids. It is assumed that the liquid shake-off process in step S203 is absent. In this case, the rinse liquid remaining on the front surface peripheral area 911 and the supplied SC-2 might mix with each other. Meanwhile, the presence of the liquid shake-off process makes occurrence of such a situation unlikely. This allows SC-2 of a desired concentration to act appropriately on the front surface peripheral area 911. This can also prevent contamination between the rinse liquid having been used for washing out SC-1 as an alkaline chemical liquid and SC-2 as an acidic chemical liquid.

<ii. Liquid Shake-Off Process>

Next, liquid shake-off process is performed (step S205). A specific flow of this liquid shake-off process is the same as that of step S203. Specifically, the substrate 9 is rotated for a given time (liquid moving step) while discharge of a fluid toward the front surface peripheral area 911 is stopped. Next, gas is discharged from the gas nozzle 50d of the discharge head 51 in the processing position toward the front surface peripheral area 911 of the rotated substrate 9 (blow-away step). After elapse of a certain time (such as 15 seconds) from start of discharge of the gas from the discharge head 51, discharge of the gas from the discharge head 51 is stopped.

This liquid shake-off process shakes off much of the processing liquid remaining on the front surface peripheral area 911 (specifically, SC-2 remaining on the front surface peripheral area 911 for not having been shaken off from the substrate 9 in the cleaning process in step S204). Impurities such as the metallic composition removed from the substrate 9 by the cleaning process are left in SC-2 remaining on the front surface peripheral area 911 for not having been shaken off from the substrate 9 in the cleaning process in step S204. Meanwhile, the liquid shake-off process performed after the cleaning process shakes off these impurities at an early stage from the substrate 9. This reduces the risk of re-adhesion of the impurities to the substrate 9 after the impurities are removed from the substrate 9 during the chemical liquid process with SC-2.

<iii. Rinsing Process>

Next, rinsing process is performed (step S206). A specific flow of this rinsing process is the same as that of step S202. Specifically, a rinse liquid is discharged from the rinse liquid nozzle 50c of the discharge head 51 in the processing position toward the front surface peripheral area 911 of the rotated substrate 9. After elapse of a certain time (such as five seconds) from start of discharge of the rinse liquid, discharge of the rinse liquid from the discharge head 51 is stopped.

This rinsing process washes out the processing liquid (here, SC-2) adhering to the front surface peripheral area 911. This rinsing process is performed after the liquid shake-off process (step S205). Accordingly, substantially no SC-2 remains on the front surface peripheral area 911. This shortens a time of the rinsing process, compared to the case where the liquid shake-off process is absent. In this rinsing process, the rinse liquid is discharged toward the front surface peripheral area 911 on which substantially no SC-2 remains, making entry of a processing liquid into the device region 90 unlikely due to collision between processing liquids.

<iv. Liquid Shake-Off Process>

Next, liquid shake-off process is performed (step S207). A specific flow of this liquid shake-off process is the same as that of step S203. Specifically, the substrate 9 is rotated for a given time (liquid moving step) while discharge of a fluid toward the front surface peripheral area 911 is stopped. Next, gas is discharged from the gas nozzle 50d of the discharge head 51 in the processing position toward the front surface peripheral area 911 of the rotated substrate 9 (blow-away step). After elapse of a certain time (such as 15 seconds) from start of discharge of the gas from the discharge head 51, discharge of the gas from the discharge head 51 is stopped.

This liquid shake-off process shakes off much of the processing liquid remaining on the front surface peripheral area 911 (specifically, the rinse liquid remaining on the front surface peripheral area 911 for not having been shaken off from the substrate 9 in the rinsing process in step S206).

<Second Acidic Process (DHF)>
<i. Chemical Liquid Process>

Next, the front surface peripheral area 911 of the substrate 9 is subjected to chemical liquid process with DHF (step S208). More specifically, DHF is discharged from the first chemical liquid nozzle 50a of the discharge head 51 in the processing position toward the front surface peripheral area 911 of the rotated substrate 9. At this time, DHF is discharged at a rate of from 20 to 50 mL/min, for example. After elapse of a certain time (such as 10 seconds) from start of discharge of DHF, discharge of DHF from the discharge head 51 is stopped.

This chemical liquid process removes a thin film formed on the front surface peripheral area 911 of the substrate 9 (etching process). This chemical liquid process is performed after the liquid shake-off process (step S207). Accordingly, DHF is discharged toward the front surface peripheral area 911 on which substantially no rinse liquid remains, making entry of a processing liquid into the device region 90 unlikely due to collision between processing liquids. Additionally, DHF and the rinse liquid will not mix with each other on the front surface peripheral area 911. This allows DHF of a desired concentration to act appropriately on the front surface peripheral area 911.

During this chemical liquid process, gas is discharged from the gas nozzle 50d of the discharge head 51 toward the front surface peripheral area 911. At this time, the gas is discharged at a rate of 14 L/min, for example. Specifically, in each position within the front surface peripheral area 911, old DHF (having been supplied from the first chemical liquid nozzle 50a before one rotation of the substrate 9 and not having been shaken off during this rotation) is removed with the gas discharged from the gas nozzle 50d. Then, new DHF is supplied to this position from the first chemical liquid nozzle 50a. As described above, this structure can suppress entry of a processing liquid into the device region 90 due to collision between an old processing liquid not having been shaken off during one rotation of the substrate 9 and a newly supplied processing liquid. This structure further allows the substrate 9 to be always acted on by fresh DHF, thereby enhancing processing efficiency. This structure also prevents a situation where DHF temporarily remains in large amount in each position within the front surface peripheral area 911. This can stabilize an etching width, so that the etching width can be controlled with a higher degree of accuracy. Supplying DHF makes the front surface peripheral area 911 water repellent, so that an old processing liquid held on the front surface peripheral area 911 may become thick partially. If a new processing liquid is supplied in this condition, the processing liquid may be repelled to bounce easily. In response, an old processing liquid is blown away toward an outer side of the substrate 9 with the gas discharged from the gas nozzle 50*d*. This sufficiently suppresses entry of droplets of this old processing liquid or the like into the device region 90.

<ii. Rinsing Process>

Next, rinsing process is performed (step S209). A specific flow of this rinsing process is the same as that of step S202. Specifically, a rinse liquid is discharged from the rinse liquid nozzle 50*c* of the discharge head 51 in the processing position toward the front surface peripheral area 911 of the rotated substrate 9. After elapse of a certain time (such as five seconds) from start of discharge of the rinse liquid, discharge of the rinse liquid from the discharge head 51 is stopped.

This rinsing process washes out the processing liquid (here, DHF) adhering to the front surface peripheral area 911. During this rinsing process, gas is discharged from the gas nozzle 50*d* of the discharge head 51 toward the front surface peripheral area 911 of the substrate 9. At this time, the gas is discharged at a rate of 14 L/min, for example. Specifically, in each position within the front surface peripheral area 911, an old rinse liquid (having been supplied from the rinse liquid nozzle 50*c* before one rotation of the substrate 9 and not having been shaken off during this rotation) is removed with the gas discharged from the gas nozzle 50*d*. Then, a new rinse liquid is supplied to this position from the rinse liquid nozzle 50*c*. As described above, this structure can suppress entry of a processing liquid into the device region 90 due to collision between an old processing liquid not having been shaken off during one rotation of the substrate 9 and a newly supplied processing liquid. This structure removes an old rinse liquid containing DHF readily from the front surface peripheral area 911 and allows the substrate 9 to be acted on by a new rinse liquid not containing DHF, thereby enhancing efficiency of the rinsing process. In this structure, as described above, droplets of a processing liquid or the like repelled by the front surface peripheral area 911 are blown off toward an outer side of the substrate 9 with a flow of the gas discharged from the gas nozzle 50*d*, so that entry of these droplets or the like into the device region 90 is suppressed sufficiently.

<iii. Liquid Shake-Off Process>

Next, liquid shake-off process is performed (step S210). A specific flow of this liquid shake-off process is the same as that of step S203. Specifically, the substrate 9 is rotated for a given time (liquid moving step) while discharge of a fluid toward the front surface peripheral area 911 is stopped. Next, gas is discharged from the gas nozzle 50*d* of the discharge head 51 in the processing position toward the front surface peripheral area 911 of the rotated substrate 9 (blow-away step). After elapse of a certain time (such as five seconds) from start of discharge of the gas from the discharge head 51, discharge of the gas from the discharge head 51 is stopped.

This liquid shake-off process shakes off much of the processing liquid remaining on the front surface peripheral area 911 (specifically, the rinse liquid remaining on the front surface peripheral area 911 for not having been shaken off from the substrate 9 in the rinsing process in step S209).

<4-3. Processing Surface Switching Process>

When the front surface peripheral process (step S2) is finished, the processing surface switching process (step S3) is performed thereafter. In the processing surface switching process, in preparation for the back surface process (step S4), the rotation speed of the spin base 21 (specifically, the rotation speed of the substrate 9) is reduced (lowered) (see FIGS. 19 and 20). Specifically, the rotation speed of the spin base 21 is changed from the speed applied during the front surface peripheral process to a rotation speed lower than this speed (low rotation speed). More specifically, the frequency of rotation of the spin base 21 is changed from 600 rpm applied during the front surface peripheral process to a sufficiently lower frequency of rotation (such as 20 rpm). As described above, during the processing surface switching process, supply of the cover gas continues from the cover gas nozzle 41 toward the center and its vicinity of the front surface 91 of the substrate 9.

<4-4. Back Surface Process>

When the processing surface switching process (step S3) is finished, the back surface process (step S4) is performed thereafter. The back surface process is described below by referring to FIGS. 19 and 20. FIG. 19 shows a flow of the back surface process. FIG. 20 explains the back surface process. In FIG. 20, some of the elements of the substrate processing apparatus 1 performing each step of the back surface process are schematically shown.

As described above, supply of the cover gas continues from the cover gas nozzle 41 toward the center and its vicinity of the front surface 91 of the substrate 9 during the back surface process. This protects the device region 90 from an atmosphere of a processing liquid supplied to the back surface 92, for example.

Before a processing liquid is supplied to the back surface 92, the rotation speed of the spin base 21 is reduced to 20 rpm applied as a low frequency of rotation. The "low rotation speed" mentioned herein is a speed that makes a processing liquid supplied to the back surface 92 of the substrate 9 spread throughout the back surface 92 and prevents the processing liquid from reaching the front surface 91 of the substrate 9 while the substrate 9 is rotated at this rotation speed. This "low rotation speed" more specifically corresponds to a frequency of rotation of 20 rpm or less, for example.

First, the back surface 92 of the substrate 9 is subjected to chemical liquid process with SC-1 (step S401). More specifically, SC-1 is discharged from the back surface side discharge port 82 toward the center and its vicinity of the back surface 92 of the substrate 9 rotated at the low speed. At this time, SC-1 is discharged at a rate of from 500 to 2000 mL/min, for example. Centrifugal force generated as a result of rotation of the substrate 9 makes SC-1 supplied to the center and its vicinity of the back surface 92 spread throughout the back surface 92, so that the chemical liquid process with SC-1 proceeds on the back surface 92 of the substrate 9. This chemical liquid process with SC-1 removes a thin film formed on the back surface 92 of the substrate 9 (etching process). After elapse of a certain time (such as 20 seconds) from start of discharge of SC-1, discharge of SC-1 from the back surface side discharge port 82 is stopped.

Next, rinsing process is performed (step S402). More specifically, while the substrate 9 continues to be rotated at the low speed, a rinse liquid is discharged from the back surface side discharge port 82 toward the center and its vicinity of the back surface 92 of the substrate 9. Centrifugal force generated as a result of rotation of the substrate 9 makes the rinse liquid supplied to the center and its vicinity of the back surface 92 spread throughout the back surface 92, thereby washing out the processing liquid (here, SC-1) adhering to the back surface 92. After elapse of a certain time (such as 20 seconds) from start of discharge of the rinse liquid, discharge of the rinse liquid from the back surface side discharge port 82 is stopped.

Next, the back surface 92 of the substrate 9 is subjected to chemical liquid process with SC-2 (step S403). More specifically, while the substrate 9 continues to be rotated at the low speed, SC-2 is discharged from the back surface side discharge port 82 toward the center and its vicinity of the back surface 92 of the substrate 9. Centrifugal force generated as a result of rotation of the substrate 9 makes SC-2 supplied to the center and its vicinity of the back surface 92 spread throughout the back surface 92, so that the chemical liquid process with SC-2 proceeds on the back surface 92. This chemical liquid process with SC-2 removes a metallic composition (such as Mo or Co) and the like adhering to the back surface 92 of the substrate 9 (cleaning process). After elapse of a certain time (such as 20 seconds) from start of discharge of SC-2, discharge of SC-2 from the back surface side discharge port 82 is stopped.

Next, rinsing process is performed (step S404). A specific flow of this rinsing process is the same as that of step S402. Specifically, while the substrate 9 continues to be rotated at the low speed, a rinse liquid is discharged from the back surface side discharge port 82 toward the center and its vicinity of the back surface 92 of the substrate 9. Centrifugal force generated as a result of rotation of the substrate 9 makes the rinse liquid supplied to the center and its vicinity of the back surface 92 spread throughout the back surface 92, thereby washing out the processing liquid (here, SC-2) adhering to the back surface 92. After elapse of a certain time (such as 20 seconds) from start of discharge of the rinse liquid, discharge of the rinse liquid from the back surface side discharge port 82 is stopped.

Next, the back surface 92 of the substrate 9 is subjected to chemical liquid process with DHF (step S405). More specifically, while the substrate 9 continues to be rotated at the low speed, DHF is discharged from the back surface side discharge port 82 toward the center and its vicinity of the back surface 92 of the substrate 9. At this time, DHF is discharged at a rate of from 500 to 2000 mL/min, for example. Centrifugal force generated as a result of rotation of the substrate 9 makes DHF supplied to the center and its vicinity of the back surface 92 spread throughout the back surface 92, so that the chemical liquid process with DHF proceeds on the back surface 92. This chemical liquid process with DHF removes a thin film formed on the back surface 92 of the substrate 9 (etching process). After elapse of a certain time (such as 10 seconds) from start of discharge of DHF, discharge of DHF from the back surface side discharge port 82 is stopped.

Next, rinsing process is performed (step S406). A specific flow of this rinsing process is the same as that of step S402. Specifically, while the substrate 9 continues to be rotated at the low speed, a rinse liquid is discharged from the back surface side discharge port 82 toward the center and its vicinity of the back surface 92 of the substrate 9. Centrifugal force generated as a result of rotation of the substrate 9 makes the rinse liquid supplied to the center and its vicinity of the back surface 92 spread throughout the back surface 92, thereby washing out the processing liquid (here, DHF) adhering to the back surface 92. After elapse of a certain time (such as 22.5 seconds) from start of discharge of the rinse liquid, discharge of the rinse liquid from the back surface side discharge port 82 is stopped. Then, the back surface process is completed.

<4-5. Drying Process>

When the back surface process (step S4) is finished, the drying process (step S5) is performed thereafter. In the drying process, while discharge of a processing liquid toward the substrate 9 is stopped, the rotation speed of the spin base 21 (specifically, the rotation speed of the substrate 9) is increased from the low rotation speed applied during the back surface process to a relatively high rotation speed for drying (see FIGS. 19 and 20). This shakes off the rinse liquid gradually adhering to the back surface 92 of the substrate 9 to eventually dry the substrate 9. As described above, supply of the cover gas from the cover gas nozzle 41 toward the center and its vicinity of the front surface 91 of the substrate 9 continues during the drying process. This protects the device region 90 from an atmosphere of a processing liquid, for example.

After elapse of a certain time from start of rotation of the substrate 9 at the speed for drying, rotation of the spin base 21 is stopped. Then, discharge of the gas from the cover gas nozzle 41 is stopped and the cover gas nozzle 41 is moved to the retreat position. Further, the discharge head 51, the cup 31, and the semicircular members 61 and 62 are moved to their respective retreat positions. Then, the group of the holding members 25 releases the substrate 9 and the transport robot CR takes the substrate 9 out of the substrate processing apparatus 1. Then, the series of processes on the substrate 9 is completed.

<5. Effects>

In the aforementioned preferred embodiment, the gas nozzle 50*d* is placed upstream of the rotative direction AR9 of the substrate 9 relative to the processing liquid nozzles 50*a*, 50*b* and 50*c*. In this structure, an old processing liquid having been supplied from the processing liquid nozzle 50*a*, 50*b* or 50*c* before one rotation of the substrate 9 and not having been shaken off during this rotation is removed with gas discharged from the gas nozzle 50*d*. Then, new processing liquids can be supplied from the processing liquid nozzles 50*a*, 50*b* and 50*c* to each position within the front surface peripheral area 911. This makes the occurrence of a situation unlikely where a newly supplied processing liquid collides with an old processing liquid on the front surface peripheral area 911 to bounce. This suppresses entry of a processing liquid having been used for processing the front surface peripheral area 911 into the device region 90.

In the aforementioned preferred embodiment, in the front surface peripheral area 911 of the substrate 9, gas is supplied to a position on an inner side (on the part of the center of the substrate 9) relative to a position where a processing liquid is discharged. In this structure, the processing liquid supplied to the front surface peripheral area 911 can be removed with gas in a direction from the center of the substrate 9 toward the end face 93. This can suppress entry of the processing liquid on the front surface peripheral area 911 into the device region 90.

In the aforementioned preferred embodiment, the chemical liquid nozzles 50*a* and 50*b* from which chemical liquids are discharged and the rinse liquid nozzle 50*c* from which a rinse liquid is discharged are supported integrally. This structure simplifies the structure of the apparatus and can adjust the positions of the nozzles 50*a*, 50*b* and 50*c* relative to each other easily, compared to the case where the nozzles 50*a*, 50*b* and 50*c* are supported separately.

In the aforementioned preferred embodiment, in the front surface peripheral area 911 of the substrate 9, a rinse liquid is discharged to a position on an inner side (on the part of the center of the substrate 9) relative to a position where a chemical liquid is discharged. In this structure, the chemical liquid supplied to the front surface peripheral area 911 can be washed away with the rinse liquid in a direction from the center of the substrate 9 toward the end face 93. This can wash out the chemical liquid satisfactorily while suppressing entry of the chemical liquid into the device region 90 sufficiently. In the aforementioned preferred embodiment, the rinse liquid nozzle 50c from which a rinse liquid is discharged is placed between the first chemical liquid nozzle 50a from which an acidic chemical liquid is discharged and the second chemical liquid nozzle 50b from which an alkaline chemical liquid is discharged. This structure can suppress the occurrence of a situation where an atmosphere generated during discharge of a chemical liquid from one of the chemical liquid nozzles reacts with a chemical liquid remaining inside of the other chemical liquid nozzle, for example.

In the aforementioned preferred embodiment, the target discharge position Qa of the first chemical liquid nozzle 50a and the target discharge position Qb of the second chemical liquid nozzle 50b are spaced by the same distance from the end face 93 of the substrate 9. Thus, in the front surface peripheral area 911 of the substrate 9, an alkaline chemical liquid can be discharged to a position where an acidic chemical liquid is discharged. This structure allows both of these chemical liquids to act on the same region accurately.

In the aforementioned preferred embodiment, the flow path formed inside the nozzle body 501 includes the tilted flow path section 5042 extending obliquely downward such that the tilted flow path section 5042 gets farther in a lower position in a direction from the center of the substrate 9 toward the end face 93 to communicate with a discharge port at a lower end of the tilted flow path section 5042. This structure allows a fluid discharged from the nozzle 50 toward the front surface peripheral area 911 of the substrate 9 to flow in the front surface peripheral area 911 of the substrate 9 toward an outer side of the substrate 9.

In the aforementioned preferred embodiment, processing liquids are discharged from the processing liquid nozzles 50a, 50b and 50c toward the front surface peripheral area 911 of a rotated substrate 9 while gas is discharged toward the front surface peripheral area 911 from the gas nozzle 50d placed upstream of the rotative direction AR9 of the substrate 9 relative to the processing liquid nozzles 50a, 50b and 50c (steps S208 and 209). In this structure, an old processing liquid having been supplied from the processing liquid nozzle 50a, 50b or 50c before one rotation of the substrate 9 and not having been shaken off during this rotation is removed with gas discharged from the gas nozzle 50d. Then, new processing liquids can be supplied from the processing liquid nozzles 50a, 50b and 50c to each position within the front surface peripheral area 911. This makes the occurrence of a situation unlikely where a newly supplied processing liquid collides with an old processing liquid on the front surface peripheral area 911 to bounce. This suppresses entry of a processing liquid having been used for processing the front surface peripheral area 911 into the device region 90.

In the aforementioned preferred embodiment, a processing liquid remaining on the front surface peripheral area 911 is moved toward the end face 93 of the substrate 9 and then shaken off to the outside of the substrate 9 (liquid shake-off process). In this structure, a processing liquid (second processing liquid) supplied to the front surface peripheral area 911 after the liquid shake-off process is discharged toward the front surface peripheral area 911 on which substantially no processing liquid (first processing liquid) remains having been supplied to the front surface peripheral area 911 before the liquid shake-off process. This makes the occurrence of a situation unlikely where a discharged processing liquid collides with a processing liquid remaining on the front surface peripheral area 911 to bounce. This suppresses entry of a processing liquid into the device region 90.

In the aforementioned preferred embodiment, the liquid shake-off process includes a step of rotating the substrate 9 and a step of discharging gas toward the front surface peripheral area 911 of the substrate 9 that are performed while discharge of a fluid to the front surface peripheral area 911 is stopped. This structure can shake off the first processing liquid remaining on the front surface peripheral area 911 satisfactorily in a short time.

In the aforementioned preferred embodiment, cover gas is discharged toward the center and its vicinity of the front surface 91 of the substrate 9. This protects the device region 90 from an atmosphere of a processing liquid and the like supplied to the front surface peripheral area 911, for example.

In the aforementioned preferred embodiment, while discharge of a fluid from the discharge head 51 is stopped, the substrate 9 is rotated for a given time before discharge of the first processing liquid is stopped and after discharge of the second processing liquid is started. Then, gas is discharged toward the front surface peripheral area 911 of the substrate 9. In this structure, the second processing liquid is discharged toward the front surface peripheral area 911 on which substantially no first processing liquid remains. This makes the occurrence of a situation unlikely where a discharged processing liquid collides with a processing liquid remaining on the front surface peripheral area 911 to bounce. This suppresses entry of a processing liquid into the device region 90.

<6. Modifications of Liquid Shake-Off Process>

<6-1. First Modification of Liquid Shake-Off Process>

In the aforementioned preferred embodiment, the rotation speed of the spin base 21 (specifically, the rotation speed of the substrate 9) can be increased so as to coincide with start of the liquid shake-off process (steps S203, S205, S207 and S210) (specifically, to coincide with start of the liquid moving step). More specifically, the rotation speed of the spin base 21 can be changed from a rotation speed to a second rotation speed higher than the first rotation speed so as to coincide with start of the liquid shake-off process. In this case, the rotation speed of the spin base 21 is changed from the second rotation speed to the first rotation speed simultaneously with finish of the liquid shake-off process.

In the first modification, the rotation speed of the substrate 9 applied during the liquid shake-off process is higher than that of the substrate 9 applied during processes performed before and after this liquid shake-off process (processes of discharging processing liquids toward the front surface peripheral area 911).

In the first modification, the substrate 9 is rotated at a relatively high speed during the liquid shake-off process. Thus, the first processing liquid (which is a rinse liquid regarding steps S203, S207 and S210, and SC-2 regarding step S205) remaining on the front surface peripheral area 911 is moved readily toward the end face 93 of the substrate 9 and is shaken off satisfactorily from the substrate 9. Hence, in this structure, the first processing liquid remaining on the front surface peripheral area 911 can be shaken off within a particularly short time.

The rotation speed of the spin base 21 can be changed from the first rotation speed to the second rotation speed higher than the first rotation speed so as to coincide with start of the liquid shake-off process. Then, the rotation speed of the spin base 21 can be changed from the second rotation speed to the default first rotation speed simultaneously with finish of the liquid moving step in the liquid shake-off process (specifically, simultaneously with start of the blow-away step). In this case, the rotation speed of the substrate 9 applied during the liquid moving step is higher than that of the substrate 9 applied during processes performed before and after this liquid moving step, so that the first processing liquid remaining on the front surface peripheral area 911 is moved readily toward the end face 93 of the substrate 9. This structure can also shake off the first processing liquid remaining on the front surface peripheral area 911 within a short time.

<6-2. Second Modification of Liquid Shake-Off Process>

In the aforementioned preferred embodiment or the first modification, the amount of discharge of cover gas from the cover gas nozzle 41 can be increased so as to coincide with start of the liquid shake-off process (steps S203, S205, S207 and S210) (specifically, to coincide with start of the liquid moving step). More specifically, the amount of discharge of the cover gas can be changed from a first amount to a second amount larger than the first amount so as to coincide with start of the liquid shake-off process. In this case, the amount of discharge of the cover gas is changed from the second amount to the default first amount simultaneously with finish of the liquid shake-off process.

In the second modification, the amount of discharge of the cover gas applied during the liquid shake-off process is larger than that applied during processes performed before and after this liquid shake-off process (processes of discharging processing liquids toward the front surface peripheral area 911).

In the second modification, the cover gas of a relatively large amount is discharged toward the center and its vicinity of the front surface 91 of the substrate 9 during the liquid shake-off process. Thus, the device region 90 can be protected sufficiently for example from an atmosphere of a processing liquid during the liquid shake-off process. Further, the wind pressure of the cover gas moves a processing liquid satisfactorily toward the end face 93 of the substrate 9.

The amount of discharge of the cover gas can be changed from the first amount to the second amount larger than the first amount so as to coincide with start of the liquid shake-off process. Then, the amount of discharge of the cover gas can be changed from the second amount to the default first amount simultaneously with finish of the liquid moving step in the liquid shake-off process. In this case, the amount of discharge of the cover gas applied during the liquid moving step is larger than that applied during processes performed before and after this liquid moving step. Thus, the device region 90 is protected sufficiently from an atmosphere of a processing liquid during the liquid moving step. Further, the wind pressure of the cover gas moves a processing liquid satisfactorily toward the end face 93 of the substrate 9.

<7. Modification of Discharge Head for Peripheral Area>

Figure 21:
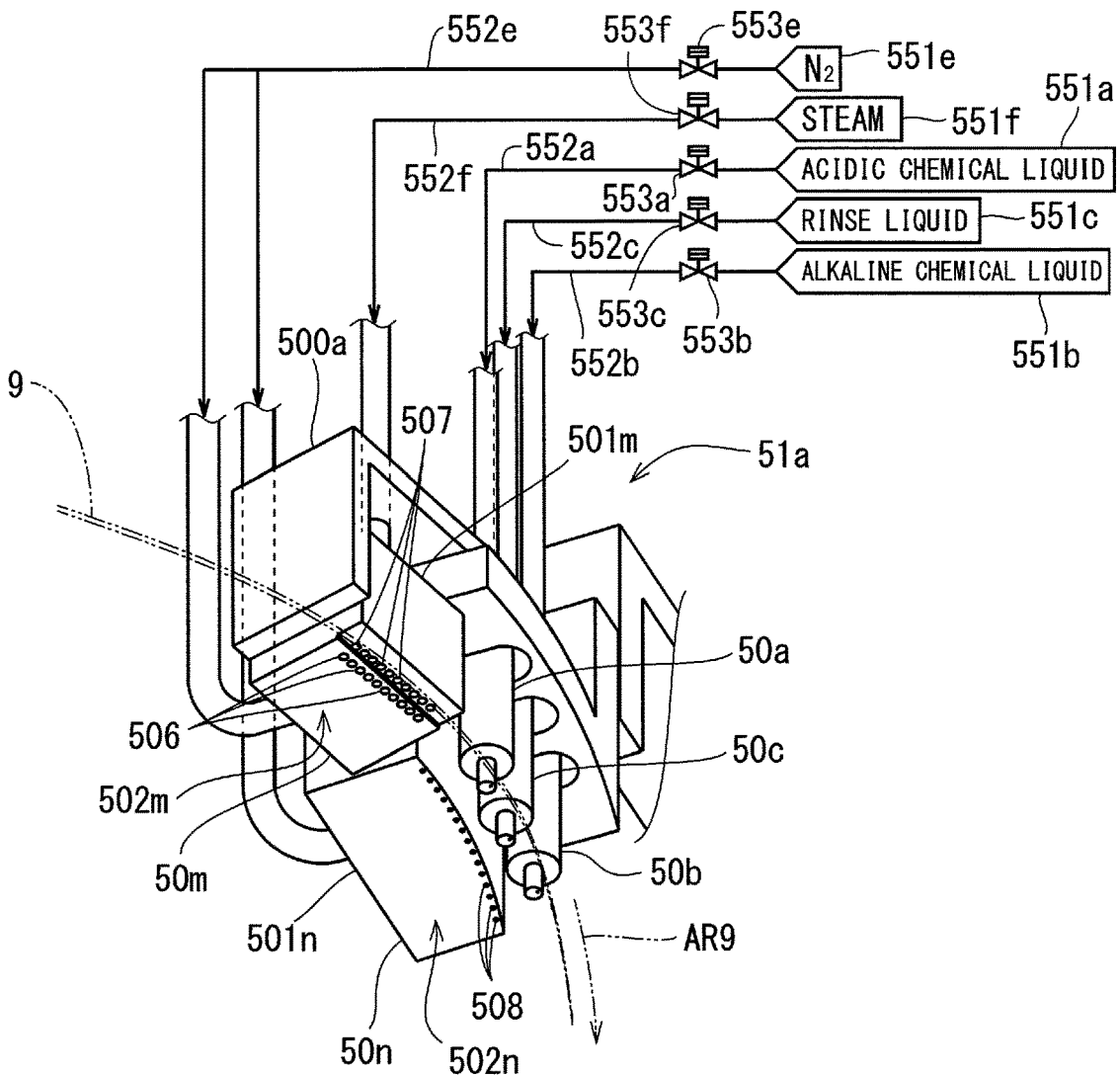
FIG. 21 shows a discharge head for peripheral area according to a modification as viewed from below.

A discharge head 51a for peripheral area according to a different preferred embodiment is described below by referring to FIG. 21. FIG. 21 shows the discharge head 51a as viewed from below. In the following, structures same as those of the aforementioned preferred embodiment are identified by the same signs and will not be described repeatedly.

<i. Overall Structure>

The discharge head 51a includes multiple (here, five) nozzles 50a, 50b, 50c, 50m and 50n, and a support part 500a that supports these nozzles integrally. The nozzles 50a, 50b, 50c, 50m and 50n in a group of the discharge head 51a include three processing liquid nozzles 50a, 50b and 50c same as those of the aforementioned preferred embodiment (more specifically, the first chemical liquid nozzle 50a from which an acidic chemical liquid is discharged, the second chemical liquid nozzle 50b from which an alkaline chemical liquid is discharged, and the rinse liquid nozzle 50c from which a rinse liquid is discharged). The nozzles 50a, 50b, 50c, 50m and 50n in a group of the discharge head 51a further include the nozzle (box nozzle) 50m from which gas (here, nitrogen gas) and steam (particularly preferably, superheated steam) are discharged toward the front surface peripheral area 911, and the nozzle (inner gas nozzle) 50n from which gas (here, nitrogen gas) is discharged toward the front surface peripheral area 911.

<ii. Box Nozzle 50m>

The following describes the box nozzle 50m. The box nozzle 50m includes a nozzle body 501m having an outer shape of a rectangular parallelepiped. The nozzle body 501m is supported by the support part 500a such that a lower surface (discharge surface) 502m of the nozzle body 501m is placed in a horizontal posture. Accordingly, while the discharge head 51a is placed in a processing position, the discharge surface 502m is placed in a posture parallel to the front surface 91 of the substrate 9 held on the spin base 21 and is close to the front surface peripheral area 911 in a noncontact manner.

Multiple gas discharge ports 506 are formed in the discharge surface 502m that are arranged along an arcuate virtual line (first virtual line) extending along the front surface peripheral area 911. Multiple steam discharge ports 507 are further formed in the discharge surface 502m that are arranged along an arcuate virtual line (second virtual line) extending along the front surface peripheral area 911. The first virtual line along which the gas discharge ports 506 are arranged is on an inner side of the substrate 9 (on the part of the center of the substrate 9) relative to the second virtual line along which the steam discharge ports 507 are arranged. Specifically, the gas discharge ports 506 are arranged on an inner side of the substrate 9 relative to the steam discharge ports 507.

A gas flow path is formed inside the nozzle body 501m. The gas flow path has a lower end communicating with the gas discharge ports 506. The gas flow path is connected to one of branched end portions of a branch pipe 552e. An end portion of an unbranched part of the branch pipe 552e is connected to a source (gas source) for gas (such as nitrogen gas) 551e. An open-close valve 553e is interposed in the branch pipe 552e. Accordingly, opening the open-close valve 553e discharges gas from the gas discharge ports 506 that is supplied from the branch pipe 552e through the gas flow path inside the nozzle body 501m. Like the aforementioned flow path formed inside the nozzle body 501 (FIG. 7), it is preferable that this gas flow path have a tilted flow path section extending obliquely downward such that the tilted flow path section gets farther in a lower position from an inner side of the substrate 9 (on the part of the center of the substrate 9) toward an outer side of the substrate 9 (on the part of the end face 93) to communicate with the gas discharge ports 506 at a lower end of the tilted flow path section.

A steam flow path is further formed inside the nozzle body 501m. The steam flow path has a lower end communicating with the steam discharge ports 507. The steam flow path is connected to one end of a pipe 552f. The other end of the pipe 552f is connected to a source for steam (steam source) 551f. An open-close valve 553f is interposed in the pipe 552f. Accordingly, opening the open-close valve 553f discharges steam from the gas discharge ports 507 that is supplied from the pipe 552f through the steam flow path inside the nozzle body 501m. It is preferable that the steam to be discharged from the steam discharge ports 507 be superheated steam (superheated water vapor) heated (superheated) to a sufficiently high temperature (such as one in a range of from 100° C. to 130° C., for example). As described above, this can be achieved for example by forming the steam source 551*f* by using a source to supply steam (water vapor) generated by heating pure water and the like, a pipe connected to the source, and a heater interposed in a path of the pipe (all of these parts are not shown in the drawings). Like the aforementioned flow path formed inside the nozzle body 501, it is preferable that this steam flow path have a tilted flow path section extending obliquely downward such that the tilted flow path section gets farther in a lower position from an inner side of the substrate 9 (on the part of the center of the substrate 9) toward an outer side of the substrate 9 (on the part of the end face 93) to communicate with the steam discharge ports 507 at a lower end of the tilted flow path section.

<iii. Inner Gas Nozzle 50*n*>

The inner gas nozzle 50*n* is described next. The inner gas nozzle 50*n* includes a nozzle body 501*n* having an outer shape curved in an arcuate pattern along the front surface peripheral area 911 as viewed from above. The nozzle body 501*n* is supported by the support part 500*a* such that a lower surface (discharge surface) 502*n* of the nozzle body 501*n* is placed in a horizontal posture. Accordingly, while the discharge head 51*a* is placed in the processing position, the discharge surface 502*n* is placed in a posture parallel to the front surface 91 of the substrate 9 held on the spin base 21 and is close to the front surface peripheral area 911 in a noncontact manner.

Multiple inner gas discharge ports 508 are formed in the discharge surface 502*n* that are arranged along an arcuate virtual line extending along the front surface peripheral area 911.

A flow path is formed inside the nozzle body 501*n*. The flow path has a lower end communicating with the inner gas discharge ports 508. The flow path is connected to the other of the branched end portions of the branch pipe 552*e*. Accordingly, opening the open-close valve 553*e* discharges gas from the inner gas discharge ports 508 that is supplied from the branch pipe 552*e* through the flow path inside the nozzle body 501*n*. Like the aforementioned flow path formed inside the nozzle body 501, it is preferable that this flow path have a tilted flow path section extending obliquely downward such that the tilted flow path section gets farther in a lower position from an inner side of the substrate 9 (on the part of the center of the substrate 9) toward an outer side of the substrate 9 (on the part of the end face 93) to communicate with the inner gas discharge ports 508 at a lower end of the tilted flow path section.

<iv. Arrangement of Each Nozzle>

The support part 500*a* that integrally supports the three processing liquid nozzles 50*a*, 50*b* and 50*c*, the box nozzle 50*m*, and the inner gas nozzle 50*n*, is fixed to the arm 52. The support part 500*a* is a member curving in an arcuate pattern along the front surface peripheral area 911 as viewed from above. The three processing liquid nozzles 50*a*, 50*b* and 50*c*, and the box nozzle 50*m* are aligned in a direction where the support part 500*a* curved in an arcuate pattern extends. Accordingly, while the discharge head 51*a* is placed in the processing position, the three processing liquid nozzles 50*a*, 50*b* and 50*c*, and the box nozzle 50*m*, are arranged along the front surface peripheral area 911 of the substrate 9. In this condition, the box nozzle 50*m*, the first chemical liquid nozzle 50*a*, the rinse liquid nozzle 50*c*, and the second chemical liquid nozzle 50*b* are arranged in the rotative direction AR9 of the substrate 9 in the order named as viewed from an upstream side of the rotative direction AR9. The inner gas nozzle 50*n* is arranged on an inner side of the substrate 9 (on the part of the center of the substrate 9) relative to the three processing liquid nozzles 50*a*, 50*b* and 50*c*.

Specifically, in the discharge head 51*a*, the box nozzle 50*m* is placed upstream of the rotative direction AR9 of the substrate 9 relative to the processing liquid nozzles 50*a*, 50*b* and 50*c*. Thus, in the substrate 9 to be rotated, each position within the front surface peripheral area 911 of the substrate 9 first passes through a place below the box nozzle 50*m* and then passes through places below the processing liquid nozzles 50*a*, 50*b* and 50*c*. In this structure, before being supplied with a new processing liquid from the processing liquid nozzle 50*a*, 50*b* or 50*c*, each position within the front surface peripheral area 911 of the rotated substrate 9 can be supplied with gas, steam, or both gas and steam from the box nozzle 50*m*.

In this structure, an old processing liquid adhering to each position within the front surface peripheral area 911 is removed with gas discharged from the box nozzle 50*m*. Then, new processing liquids can be supplied from the processing liquid nozzles 50*a*, 50*b* and 50*c* to this position. As described above, this can suppress entry of a processing liquid into the device region 90 due to collision between an old processing liquid not having been shaken off and a newly supplied processing liquid. Further, this structure allows the substrate 9 to be always acted on by a fresh processing liquid, thereby enhancing processing efficiency. This structure also prevents a situation where a processing liquid temporarily remains in large amount in each position within the front surface peripheral area 911. This can stabilize the dimension of a region to be acted on by a processing liquid.

In this structure, a new chemical liquid can be supplied from the chemical liquid nozzle 50*a* or 50*b* to each position within the front surface peripheral area 911 immediately after this position is heated with steam. Thus, reaction between the front surface peripheral area 911 and the chemical liquid can be accelerated (what is called heat assist). This can shorten a time of chemical liquid process and reduces the usage of the chemical liquid.

Under control by the controller 130, timing of discharge of steam from the discharge head 51*a* is determined according to a recipe, for example. As an example, while the front surface peripheral area 911 is subjected to chemical liquid process with SC-1 (step S201), steam may be discharged from the box nozzle 50*m* of the discharge head 51*a* toward the front surface peripheral area 911 of the substrate 9. It is preferable that during this process, the steam be discharged at a rate for example of 2000 mL/min. It is also preferable that gas be discharged further from the box nozzle 50*m* while the steam is discharged from the box nozzle 50*m*. In this structure, even if part of the steam supplied to the substrate 9 condenses into droplets, these droplets are removed with the gas discharged from the box nozzle 50*m*. This can prevent attachment of the droplets to the device region 90.

<v. Target Discharge Position>

Figure 22:
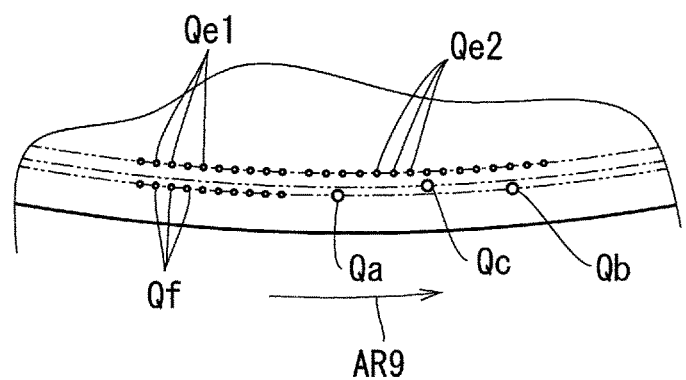
FIG. 22 schematically shows examples of target discharge positions of nozzles in a group of the discharge head for peripheral area according to the modification.
Figure 23:
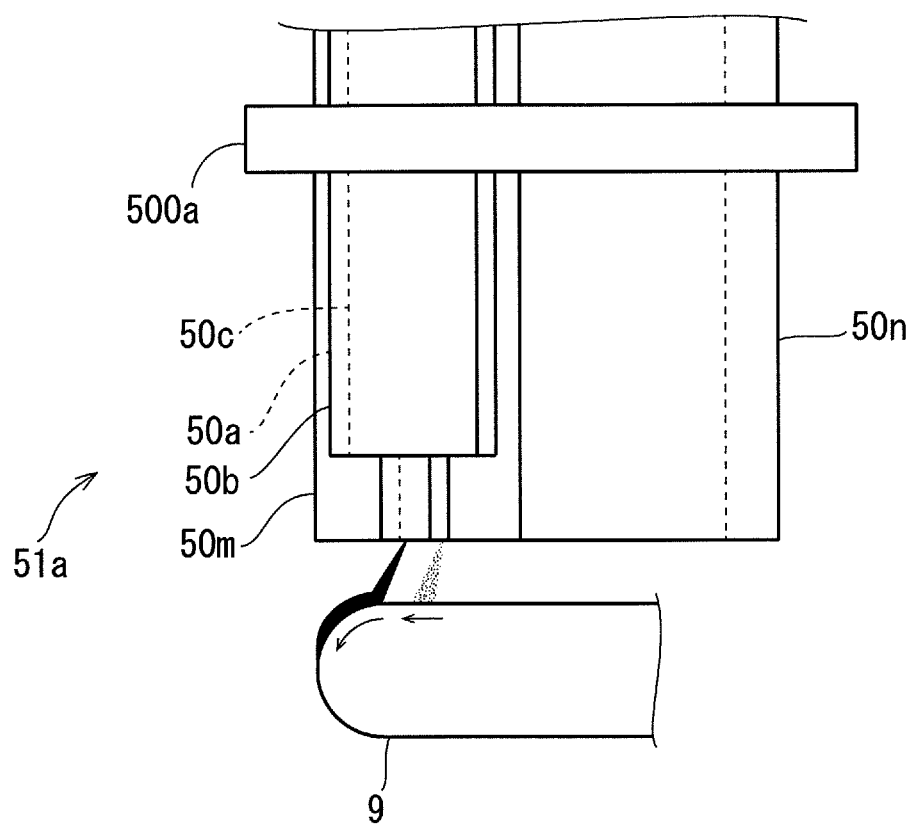
FIG. 23 shows the discharge head for peripheral area according to the modification as viewed from a downstream side of a rotative direction of a substrate.

The following describes respective target discharge positions of the nozzles 50*a*, 50*b*, 50*c*, 50*m* and 50*n* in a group of the discharge head 51*a* by referring to FIGS. 22 to 23. FIG. 22 schematically shows examples of target discharge positions of the nozzles 50*a*, 50*b*, 50*c*, 50*m* and 50*n*. FIG. 23 shows the discharge head 51*a* as viewed from a downstream side of the rotative direction AR9 of the substrate 9. FIG. 23 shows a condition where steam and gas are discharged from the discharge head 51*a*.

Target discharge positions Qa, Qb, Qc, Qe1, Qe2 and Qf of the nozzles 50a, 50b, 50c, 50m and 50n in a group of the discharge head 51a are shifted from each other in the radial direction of the substrate 9. Specifically, the target discharge position Qe1 of the box nozzle 50m regarding gas (target discharge position of gas to be discharged from the gas discharge ports 506), and the target discharge position Qe2 of the inner gas nozzle 50n, are on inner sides of the radial direction of the substrate 9 (on the part of the center) relative to the respective target discharge positions Qa, Qb and Qc of the processing liquid nozzles 50a, 50b and 50c. The target discharge position Qe2 of the inner gas nozzle 50n and the target discharge position Qe1 of the box nozzle 50m regarding gas are the same in the radial direction. Specifically, the target discharge position Qe2 of the inner gas nozzle 50n and the target discharge position Qe1 of the box nozzle 50m regarding gas are spaced by the same distance from the end face 93 of the substrate 9. Further, the target discharge position Qf of the box nozzle 50m regarding steam (target discharge position of steam to be discharged from the steam discharge ports 507), and the respective target discharge positions Qa and Qb of the chemical liquid nozzles 50a and 50b, are the same in the radial direction. Specifically, the target discharge position Qf, and the respective target discharge positions Qa and Qb of the chemical liquid nozzles 50a and 50b, are spaced by the same distance from the end face 93 of the substrate 9.

The respective target discharge positions Qa, Qb and Qc of the processing liquid nozzles 50a, 50b and 50c are the same as those of the aforementioned preferred embodiment. Specifically, the target discharge position Qc of the rinse liquid nozzle 50c is on an inner side of the radial direction of the substrate 9 relative to the respective target discharge positions Qa and Qb of the chemical liquid nozzles 50a and 50b. The target discharge position Qa of the first chemical liquid nozzle 50a and the target discharge position Qb of the second chemical liquid nozzle 50b are the same in the radial direction.

In the discharge head 51a, the target discharge position Qe1 of the box nozzle 50m regarding gas is on an inner side of the radial direction of the substrate 9 relative to the respective target discharge positions Qa, Qb and Qc of the processing liquid nozzles 50a, 50b and 50c. Accordingly, in the front surface peripheral area 911 of the substrate 9, gas is supplied to a position on an inner side relative to a position where a processing liquid is discharged. In this structure, a processing liquid supplied to the front surface peripheral area 911 can be blown away from an inner side toward an outer side of the substrate 9 with gas as described above, thereby removing the processing liquid on the front surface peripheral area 911.

In the discharge head 51a, the target discharge position Qe2 of the inner gas nozzle 50n is on an inner side of the radial direction of the substrate 9 relative to the respective target discharge positions Qa, Qb and Qc of the processing liquid nozzles 50a, 50b and 50c. This can suppress entry of a processing liquid on the front surface peripheral area 911 into the device region 90. This can also stabilize the dimension of a region to be acted on by a processing liquid (such as an etching width), so that this dimension can be controlled with a higher degree of accuracy.

In the discharge head 51a, the target discharge position Qf of the box nozzle 50m regarding steam, and the respective target discharge positions Qa and Qb of the chemical liquid nozzles 50a and 50b, are spaced by the same distance from the end face 93 of the substrate 9. Accordingly, in the front surface peripheral area 911 of the substrate 9, steam and a processing liquid can be discharged to the same position. This can effectively accelerate reaction between each position within the front surface peripheral area 911 and a chemical liquid supplied to this position.

<vi. Effects>

The discharge head 51a of this modification includes the box nozzle 50m from which steam is discharged. In this structure, the front surface peripheral area 911 can be heated by discharging steam from the box nozzle 50m toward the front surface peripheral area 911.

In this modification, the box nozzle 50m is placed upstream of the rotative direction AR9 of the substrate 9 relative to the processing liquid nozzles 50a, 50b and 50c. In this structure, each position within the front surface peripheral area 911 can be supplied with processing liquids from the processing liquid nozzles 50a, 50b and 50c after being heated with steam discharged from the box nozzle 50m. This can accelerate reaction between a processing liquid supplied to the front surface peripheral area 911 and the substrate 9.

In this modification, the target discharge position Qf to which steam is to be discharged from the box nozzle 50m is the same in the radial direction of the substrate 9 as the respective target discharge positions Qa and Qb of the chemical liquid nozzles 50a and 50b. Accordingly, a position in the front surface peripheral area 911 where a chemical liquid is to be discharged can be heated effectively with steam immediately before this position is supplied with a processing liquid. This structure can effectively accelerate reaction between a chemical liquid supplied to the front surface peripheral area 911 and the substrate 9.

<8. Other Modifications>

In the aforementioned preferred embodiment, steam is not supplied (heat assist is not given) to the back surface 92 of the substrate 9 during the chemical liquid process with SC-2 (step S204) and the chemical liquid process with DHF (step S208). Specifically, in the aforementioned preferred embodiment, the chemical liquid process with SC-2 is intended to advance not etching process but cleaning process, so heat assist is not given in this chemical liquid process. Regarding DHF, etching width DHF proceeds at a relatively high rate without heat assist, so that heat assist is not given either in the chemical liquid process with DHF. Meanwhile, depending on a process target, for example, steam may be supplied to the back surface 92 of the substrate 9 during the chemical liquid process with SC-2 or the chemical liquid process with DHF.

In the aforementioned preferred embodiment, gas is not supplied from the gas nozzle 50d to the front surface peripheral area 911 during each of the chemical liquid process with SC-1 (step S201), its subsequent rinsing process (step S202), the chemical liquid process with SC-2 (step S204), and its subsequent ringing process (step S206). This is for the reason as follows. Supplying SC-1 or SC-2 makes the front surface peripheral area 911 hydrophillic, so that a film of a processing liquid supplied to this front surface peripheral area 911 can be held relatively stably on this peripheral area only by centrifugal force generated as a result of rotation of the substrate 9. Supplying gas to the front surface peripheral area 911 in this condition in turn disadvantageously causes bounce of liquid. Meanwhile, depending on a process target, for example, gas can be supplied to the front surface peripheral area 911 during each of the aforementioned processes.

In the aforementioned preferred embodiment, the liquid shake-off process is not performed after the chemical liquid process with SC-1. This is for the reason as follows. The substrate 9 is etched by the chemical liquid process with SC-1 in the aforementioned preferred embodiment. The rinsing process is performed after the etching without intervention of the liquid shake-off process to wash out a chemical liquid readily having been used for the etching, so that an etching width and an etching depth can be controlled favorably. Supplying SC-1 makes the front surface peripheral area 911 hydrophillic. Thus, SC-1 remaining on the front surface peripheral area 911 at the time when the chemical liquid process SC-1 is finished spreads thinly on the front surface peripheral area 911. Supplying a rinse liquid as a next processing liquid to the front surface peripheral area 911 in this condition makes bounce of liquid relatively unlikely. Specifically, omitting the liquid shake-off process after the chemical liquid process with SC-1 is not likely to cause a serious problem. Meanwhile, depending on a process target, for example, the liquid shake-off process may be performed after the chemical liquid process with SC-1. As an example, if the chemical liquid process with SC-1 realizes not etching but cleaning of the substrate 9 (such as cleaning of removing of an organic substance or the like adhering to the front surface peripheral area 911 of the substrate 9), it is rather preferable that the liquid shake-off process be performed after the chemical liquid process with SC-1.

In the aforementioned preferred embodiment, the liquid shake-off process is not performed after the chemical liquid process with DHF. This is for the reason as follows. The substrate 9 is etched by the chemical liquid process with DHF in the aforementioned preferred embodiment. As described above, the rinsing process is performed after the etching without intervention of the liquid shake-off process to wash out a chemical liquid readily having been used for the etching, so that an etching width and an etching depth can be controlled favorably. Supplying DHF makes the front surface peripheral area 911 water repellent, so that a processing liquid is hard to stay on the front surface peripheral area 911. Additionally, in the aforementioned preferred embodiment, gas is supplied from the gas nozzle 50d to the front surface peripheral area 911 during the chemical liquid process with DHF. Thus, much of unnecessary DHF supplied to the front surface peripheral area 911 is removed from the end face 93 of the substrate 9. Thus, when the chemical liquid process with DHF is finished, substantially no DHF remains on the front surface peripheral area 911 of the substrate 9 (without requiring the liquid shake-off process). Accordingly, there is scarce need to perform the liquid shake-off process particularly after the chemical liquid process with DHF. Meanwhile, depending on a process target, for example, the liquid shake-off process may be performed after the chemical liquid process with DHF.

In the aforementioned preferred embodiment, the chemical liquid processes with three types of chemical liquids (SC-1, SC-2 and DHF) are performed in order in each of the front surface peripheral process (step S2) and the back surface process (step S4) while process such as rinsing process is performed between these chemical liquid processes. Meanwhile, chemical liquid processes do not always use these three types of chemical liquids. As an example, chemical liquid process on the front surface peripheral area 911 or the back surface 92 may be performed using one or more chemical liquids selected from aqueous solutions of SC-1, SC-2, DHF, BDHF (buffered hydrofluoric acid), HF (hydrofluoric acid), hydrochloric acid, sulfuric acid, nitric acid, phosphoric acid, acetic acid, oxalic acid and ammonia, and mixed solutions thereof, for example.

The fluid supplier 55 of the aforementioned preferred embodiment can be formed by combining a hydrofluoric acid source to supply hydrofluoric acid (49% of hydrofluoric acid, for example), a hydrochloric acid source to supply hydrochloric acid, a hydrogen peroxide source to supply hydrogen peroxide, an ammonium hydroxide source to supply ammonium hydroxide, a pure water source to supply pure water, a carbon dioxide gas source to supply carbon dioxide, a nitrogen gas source to supply nitrogen gas, pipes, open-close valves, and a mixing valve, for example. By way of example, in this structure, hydrofluoric acid from the hydrofluoric acid source and pure water from the pure water source are mixed in the mixing valve in a prescribed ratio to generate DHF. Then, the resultant DHF is supplied to the discharge head 51 (more specifically, first chemical liquid nozzle 50a). Further, hydrochloric acid from the hydrochloric acid source and hydrogen peroxide from the hydrogen peroxide source are mixed in the mixing valve in a prescribed ratio to generate SC-2. Then, the resultant SC-2 is supplied to the discharge head 51 (more specifically, first chemical liquid nozzle 50a). Further, ammonium hydroxide from the ammonium hydroxide source and hydrogen peroxide from the hydrogen peroxide source are mixed in the mixing valve in a prescribed ratio to generate SC-1. Then, the resultant SC-1 is supplied to the discharge head 51 (more specifically, second chemical liquid nozzle 50b). Further, carbon dioxide is dissolved in pure water from the pure water source to generate a rinse liquid. Then, the resultant rinse liquid is supplied to the discharge head 51 (more specifically, rinse liquid nozzle 50c).

In the aforementioned preferred embodiment, the heat processing unit 7 heats the substrate 9 with steam. The heat processing unit 7 may use a different heat source (such as a heating wire heater or a lamp heater) to heat the substrate 9. Meanwhile, heating the substrate 9 with steam is particularly preferable as it can heat the substrate 9 locally in a short time (and eventually, achieve a favorable throughput) compared to heating the substrate 9 with a heating wire heater or a lamp heater.

In the aforementioned preferred embodiment, the liquid shake-off process includes the liquid moving step (step S2031) and the blow-away step (step S2032) that are performed in order. Meanwhile, the liquid moving step (step S2031) and the blow-away step (step S2032) can be performed in parallel.

Timing of the liquid shake-off process is not limited to that described as an example in the aforementioned preferred embodiment. As an example, the liquid shake-off process to be performed after the chemical liquid process with SC-2 may be omitted, or at least one of the liquid shake-off processes to be performed after corresponding rinsing processes may be omitted. Additionally, as described above, the liquid shake-off process may be performed after the chemical liquid process with SC-1 or after the chemical liquid process with DHF.

In the discharge head 51 of the aforementioned preferred embodiment, the first and second chemical liquid nozzles 50a and 50b are placed upstream and downstream respectively of the rotative direction AR9 of the substrate 9 relative to the rinse liquid nozzle 50c. Alternatively, the second and first chemical liquid nozzles 50b and 50a may be placed upstream and downstream respectively of the rotative direction AR9 of the substrate 9 relative to the rinse liquid nozzle 50c.

In the aforementioned preferred embodiment, while the discharge head 51 is placed in the processing position, at least part of the discharge head 51 is housed in the cut 605 formed in the inner circumferential wall 601 of the guard member 60. Meanwhile, while the discharge head 51 is placed in the processing position, at least part of the discharge head 51 (as a specific example, at least part of the nozzle 50 of the discharge head 51) may be housed in a through hole penetrating through the guard member 60 from the upper surface 604 toward the lower surface 602, for example. Specifically, the nozzle 50 of the discharge head 51 in the processing position may be placed on a side opposite the cup 31 with respect to part of the guard member 60.

In the aforementioned preferred embodiment, the front surface peripheral area 911 and the back surface 92 of the substrate 9 are processed by the substrate processing apparatus 1. Meanwhile, only the front surface peripheral area 911 or the back surface 92 may be processed by the substrate processing apparatus 1. In the substrate processing apparatus 1, at least one of the front surface peripheral area 911 and the back surface 92 may be subjected to process other than etching process and cleaning process (such as film deposition process).

In the aforementioned preferred embodiment, the back surface 92 of the substrate 9 is processed after the front surface peripheral area 911 of the substrate 9 is processed in the substrate processing apparatus 1. Meanwhile, the front surface peripheral area 911 and the back surface 92 can be processed in parallel.

In the aforementioned preferred embodiment, the substrate 9 is described as a semiconductor wafer. The substrate 9 may also be a glass substrate for a liquid crystal display, a glass substrate for a plasma display, a substrate for an optical disk, a substrate for a magnetic disk, a substrate for a magnetooptical disk, a glass substrate for a photomask, or a substrate for a solar cell, for example.

While the invention has been shown and described in detail, the foregoing description is in all aspects illustrative and not restrictive. It is therefore understood that numerous modifications and variations can be devised without departing from the scope of the invention.

What is claimed is:

1. A substrate processing apparatus comprising:
a substrate holder to hold a substrate in a horizontal posture, said substrate holder rotating said substrate about a vertical rotary axis passing through the center of a plane of said substrate; and
a discharge head fora peripheral area from which a fluid is discharged toward a surface peripheral area of said substrate held on said substrate holder,
said discharge head for peripheral area including:
multiple nozzles; and
a supporter that supports said nozzles integrally,
said nozzles including:
a processing liquid nozzle from which a processing liquid is discharged toward said surface peripheral area; and
a gas nozzle from which gas is discharged toward said surface peripheral area, said gas nozzle being placed upstream of a rotative direction of said substrate relative to said processing liquid nozzle, wherein
each of said nozzles includes:
a nozzle body supported by said supporter such that a lower surface of said nozzle body extends horizontally;
an open discharge port formed in said lower surface of said nozzle body; and
a flow path formed inside said nozzle body, said flow path communicating with said discharge port at a lower end of said flow path, and
said flow path includes a tilted flow path section that extends obliquely downward such that said tilted flow path section reaches farther in a lower position in a direction from the center of said substrate toward an end face of said substrate to communicate with said discharge port at a lower end of said tilted flow path section, wherein
said lower surface extends parallel to a front surface of said surface peripheral area in a state where said processing liquid nozzle is placed in a processing position.

2. The substrate processing apparatus according to claim 1, wherein a target discharge position of said gas nozzle is closer to the center of said substrate than a target discharge position of said processing liquid nozzle, said target discharge position being a position on said substrate about each of said nozzles where a fluid discharged from corresponding one of said nozzles is to reach.

3. The substrate processing apparatus according to claim 1, wherein
said processing liquid nozzle of said discharge head for peripheral area includes multiple processing liquid nozzles, and
said processing liquid nozzles include:
a chemical liquid nozzle from which a chemical liquid is discharged; and
a rinse liquid nozzle from which a rinse liquid is discharged.

4. The substrate processing apparatus according to claim 3, wherein a target discharge position of said rinse liquid nozzle is closer to the center of said substrate than a target discharge position of said chemical liquid nozzle, said target discharge position being a position on said substrate about each of said nozzles where a fluid discharged from corresponding one of said nozzles is to reach.

5. The substrate processing apparatus according to claim 3, wherein
said chemical liquid nozzle of said discharge head for peripheral area includes multiple chemical liquid nozzles,
said chemical liquid nozzles include:
a first chemical liquid nozzle from which an acidic chemical liquid is discharged; and
a second chemical liquid nozzle from which an alkaline chemical liquid is discharged, and
said rinse liquid nozzle is placed between said first and second chemical liquid nozzles.

6. The substrate processing apparatus according to claim 5, wherein a target discharge position of said first chemical liquid nozzle and a target discharge position of said second chemical liquid nozzle are spaced by the same distance from an end face of said substrate, said target discharge position being a position on said substrate about each of said nozzles where a fluid discharged from corresponding one of said nozzles is to reach.

7. The substrate processing apparatus according to claim 1, wherein said nozzles include a steam nozzle from which steam is discharged toward said surface peripheral area.

8. The substrate processing apparatus according to claim 7, wherein said steam nozzle is placed upstream of said rotative direction of said substrate relative to said processing liquid nozzle.

9. The substrate processing apparatus according to claim 7, wherein
said processing liquid nozzle includes a chemical liquid nozzle from which a chemical liquid is discharged, and
a target discharge position of said steam nozzle and a target discharge position of said chemical liquid nozzle are spaced by the same distance from an end face of said substrate, said target discharge position being a position on said substrate about each of said nozzles where a fluid discharged from corresponding one of said nozzles is to reach.

10. The substrate processing apparatus according to claim 1, comprising a controller that controls said substrate holder and said discharge head for peripheral area,
wherein while making said substrate holder rotate said substrate, said controller causes discharge of a processing liquid from said processing liquid nozzle toward said surface peripheral area of said rotated substrate and causes discharge of gas from said gas nozzle toward said surface peripheral area.

11. The substrate processing apparatus according to claim 10, wherein said processing liquid discharged from said processing liquid nozzle is diluted hydrofluoric acid.

12. The substrate processing apparatus according to claim 10, wherein said processing liquid discharged from said processing liquid nozzle is a rinse liquid.

* * * * *